US010923187B2

(12) United States Patent
Terada

(10) Patent No.: US 10,923,187 B2
(45) Date of Patent: Feb. 16, 2021

(54) STORAGE DEVICE AND CONTROL METHOD FOR CONTROLLING OPERATIONS OF THE STORAGE DEVICE

(71) Applicant: SONY SEMICONDUCTOR SOLUTIONS CORPORATION, Kanagawa (JP)

(72) Inventor: Haruhiko Terada, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/466,388

(22) PCT Filed: Nov. 9, 2017

(86) PCT No.: PCT/JP2017/040401
§ 371 (c)(1),
(2) Date: Jun. 4, 2019

(87) PCT Pub. No.: WO2018/123287
PCT Pub. Date: Jul. 5, 2018

(65) Prior Publication Data
US 2020/0082881 A1 Mar. 12, 2020

(30) Foreign Application Priority Data

Dec. 26, 2016 (JP) .............................. JP2016-251416

(51) Int. Cl.
*G11C 13/00* (2006.01)
*G11C 5/06* (2006.01)
(Continued)

(52) U.S. Cl.
CPC .......... *G11C 13/0026* (2013.01); *G11C 5/02* (2013.01); *G11C 5/06* (2013.01); *G11C 8/10* (2013.01);
(Continued)

(58) Field of Classification Search
CPC ... G11C 5/02; G11C 13/0002; G11C 13/0069; G11C 2013/0073; G11C 2013/009; G11C 2213/10; G11C 2213/70; G11C 2213/71
See application file for complete search history.

(56) References Cited

U.S. PATENT DOCUMENTS 7,459,716 B2 * 12/2008 Toda ..................... G11C 5/02
257/2
10,002,646 B2 * 6/2018 Siau ................... G11C 13/0061
(Continued)

FOREIGN PATENT DOCUMENTS

JP 2006-323924 A 11/2006
JP 2011-181134 A 9/2011
(Continued)

OTHER PUBLICATIONS

International Search Report and Written Opinion of PCT Application No. PCT/JP2017/040401, dated Dec. 12, 2017, 09 pages of ISRWO.

Primary Examiner — Vanthu T Nguyen
(74) Attorney, Agent, or Firm — Chip Law Group

(57) ABSTRACT

Provided is a storage device that includes a plurality of first wiring lines including a plurality of first and second selection lines, a plurality of second wiring lines including a plurality of third and fourth selection lines, a first selection line driver that applies a first voltage and a second voltage to one or more selection lines of the plurality of first and second selection lines respectively, the first voltage and the second voltage being one of a first and a second selection voltage, and the first and the second voltage are different, and a second selection line driver that applies a third voltage and a fourth voltage to one or more selection lines of the plurality of third and fourth selection lines respectively, the third voltage and the fourth voltage being one of the first and (Continued)

the second selection voltage, and the third and the fourth voltage being different.

20 Claims, 55 Drawing Sheets

(51) Int. Cl.
    *G11C 5/02*     (2006.01)
    *G11C 8/10*     (2006.01)
(52) U.S. Cl.
    CPC ........ *G11C 13/0002* (2013.01); *G11C 13/003* (2013.01); *G11C 13/004* (2013.01); *G11C 13/0028* (2013.01); *G11C 13/0069* (2013.01); *G11C 2013/009* (2013.01); *G11C 2013/0073* (2013.01); *G11C 2213/10* (2013.01); *G11C 2213/70* (2013.01); *G11C 2213/71* (2013.01); *G11C 2213/76* (2013.01)

(56) References Cited

U.S. PATENT DOCUMENTS

| | | |
|---|---|---|
| 2011/0214025 A1 | 9/2011 | Seko |
| 2015/0109868 A1 | 4/2015 | Sonehara |

FOREIGN PATENT DOCUMENTS

| | | |
|---|---|---|
| JP | 2015-082336 A | 4/2015 |
| WO | 2013/011669 A1 | 1/2013 |
| WO | 2013/011669 A1 | 2/2015 |

* cited by examiner

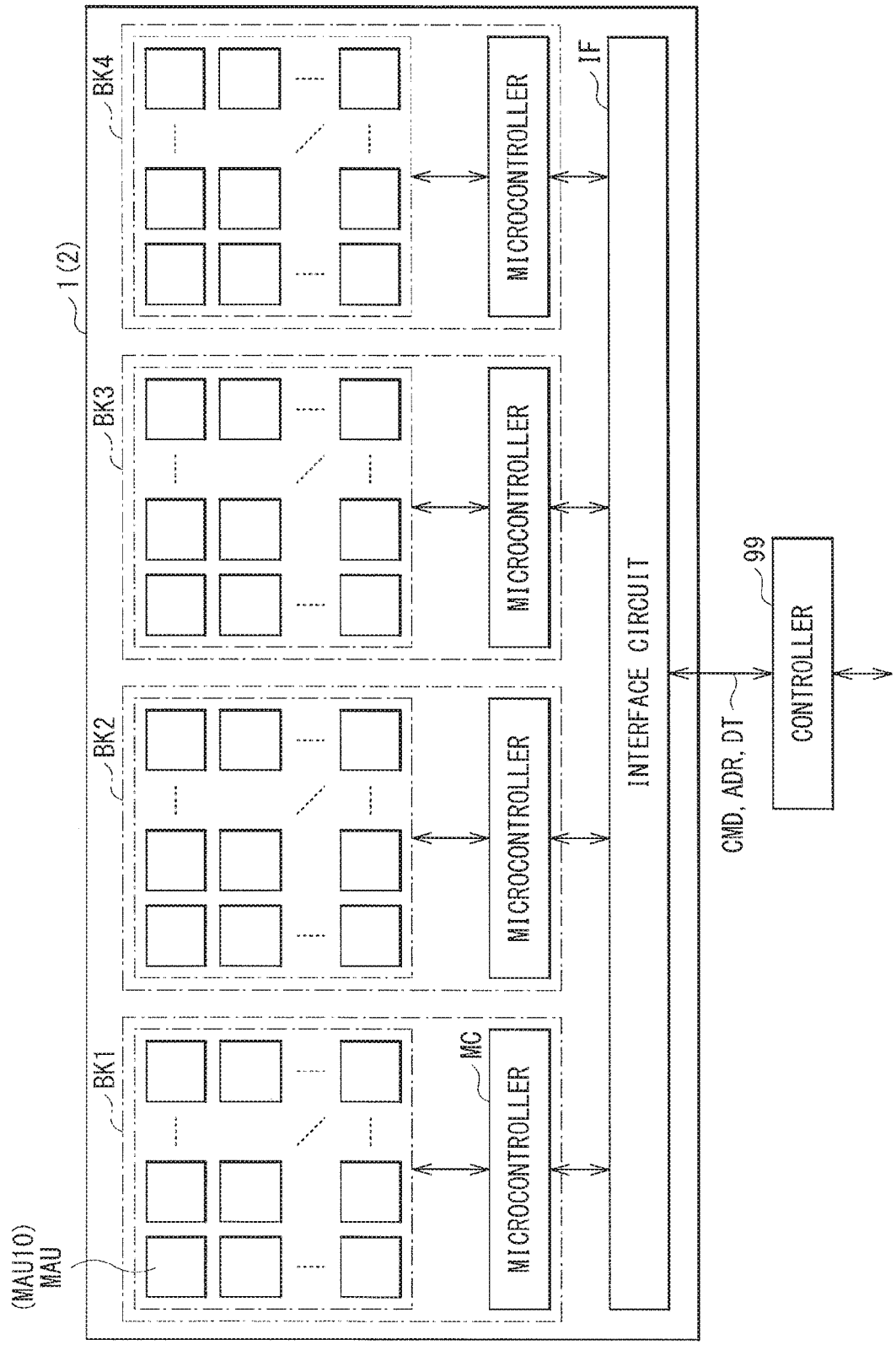

[FIG. 2]
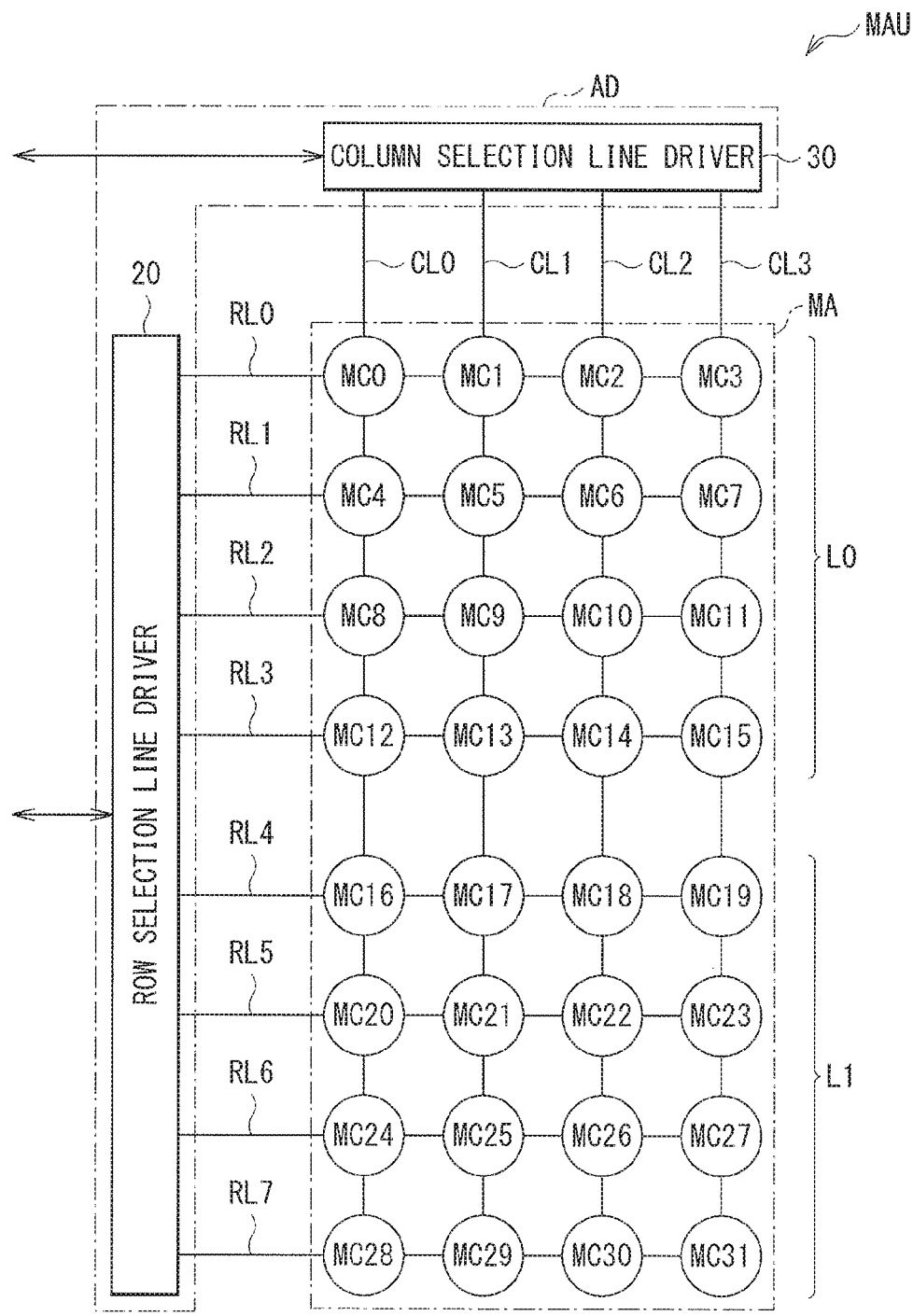

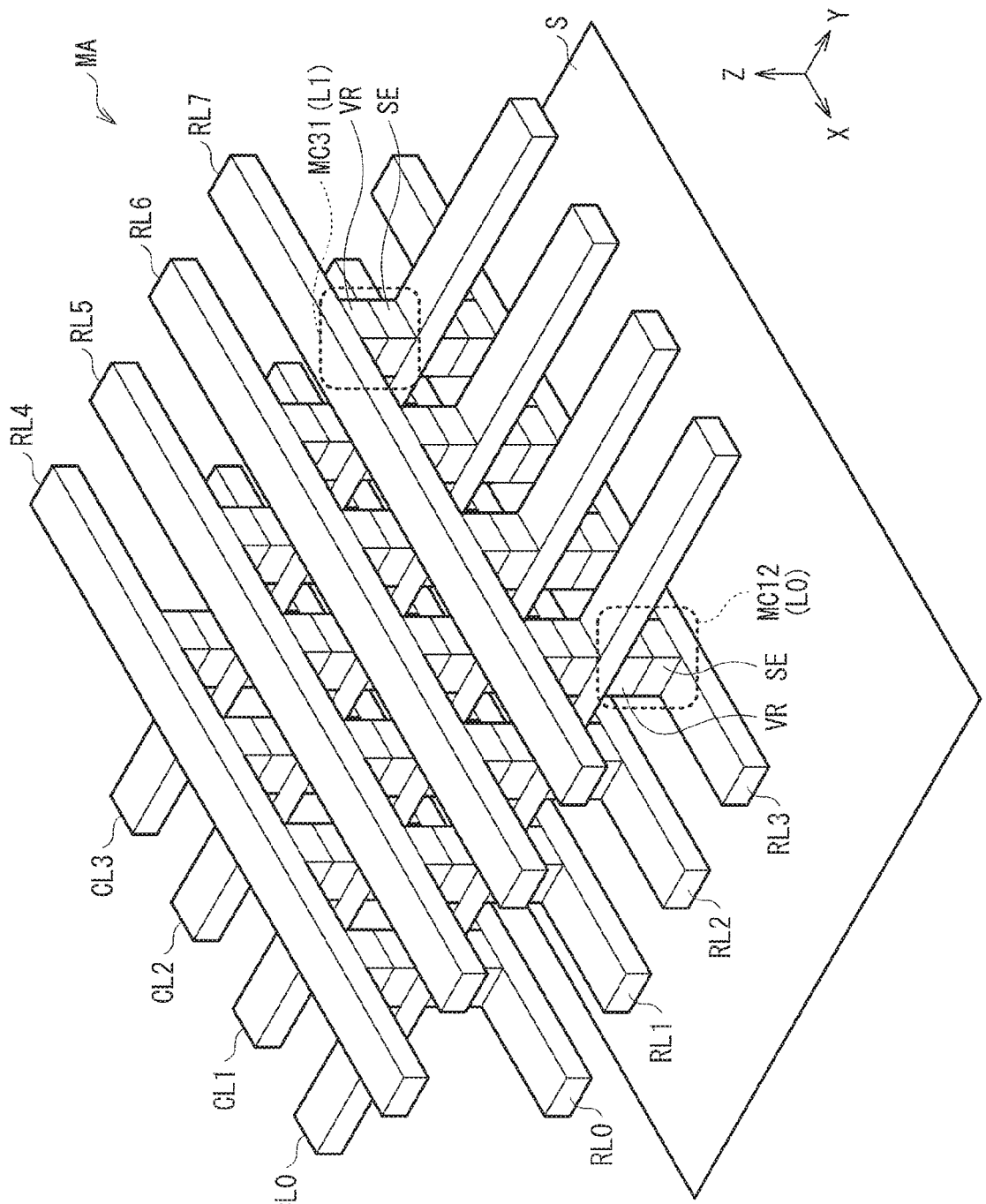
[FIG. 3]

[ FIG. 4 ]
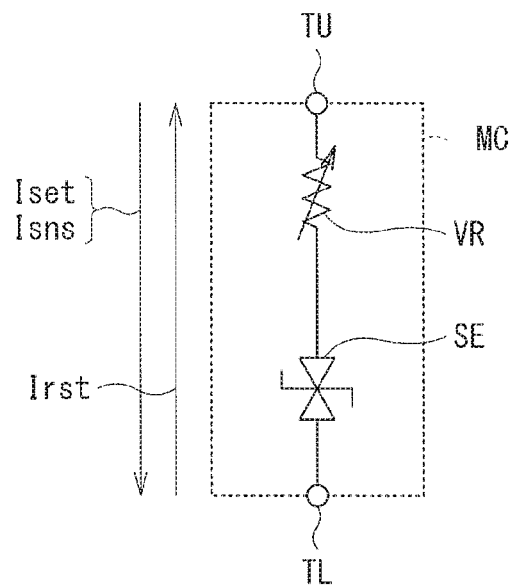
[ FIG. 5 ]
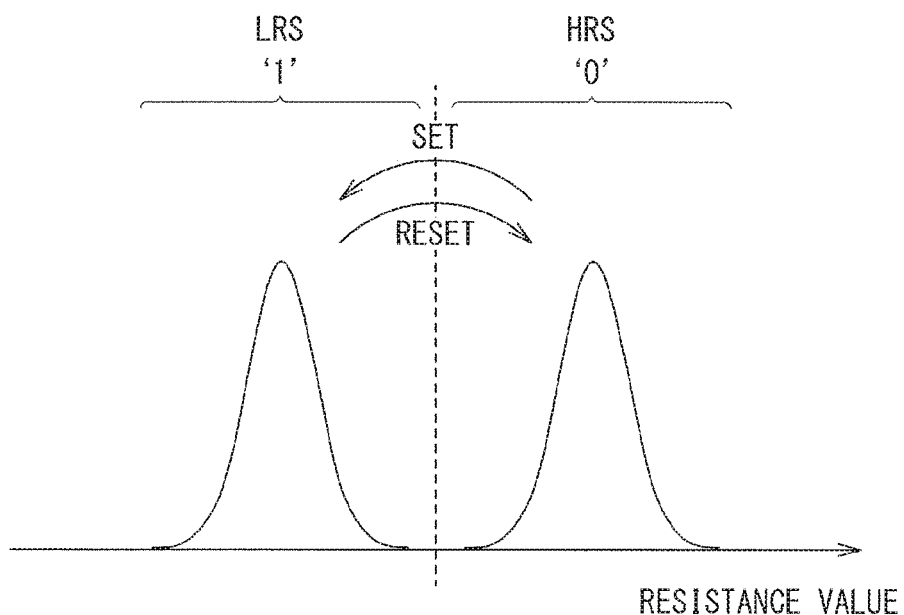

[FIG. 6]
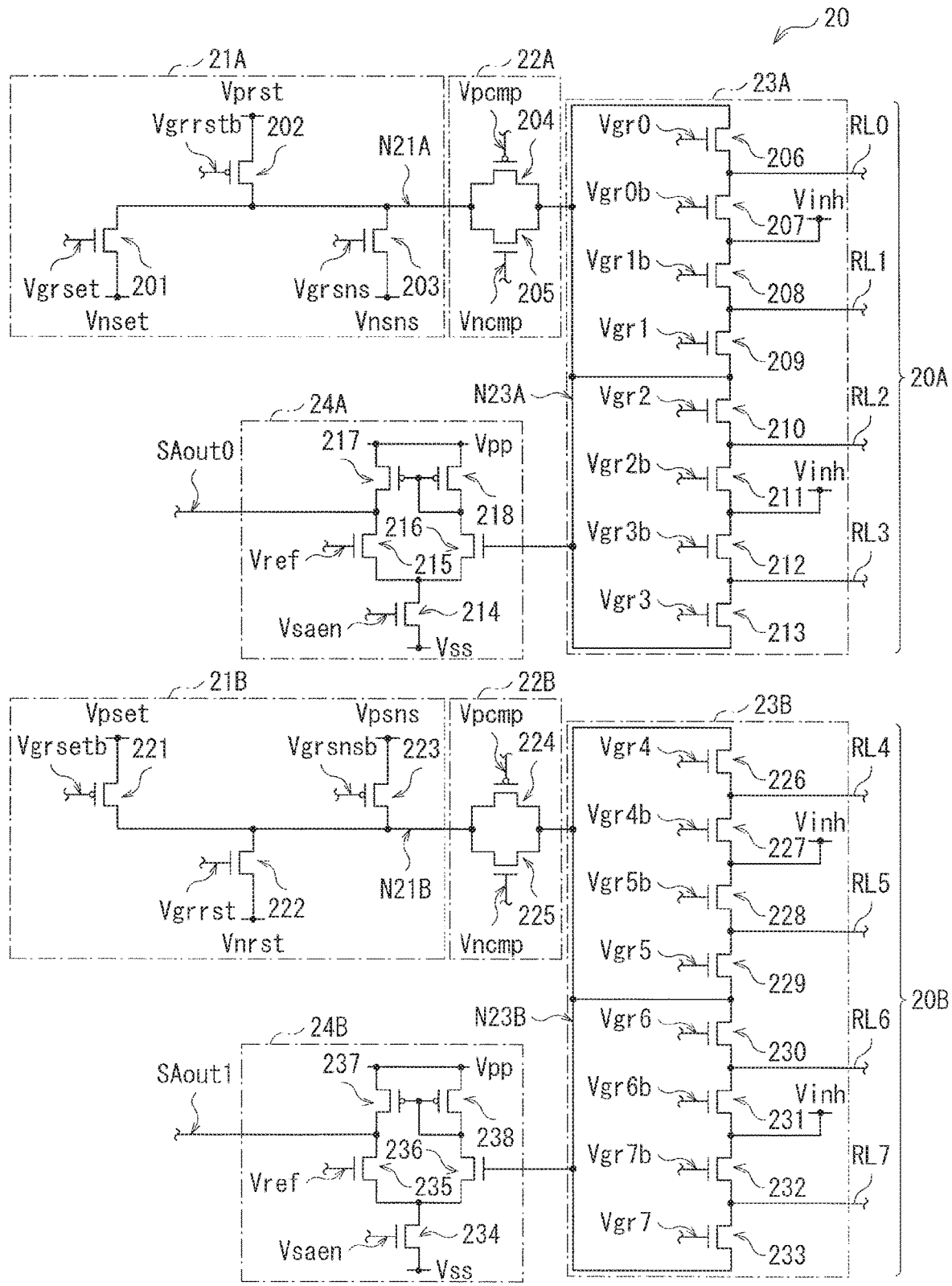

[FIG. 7]
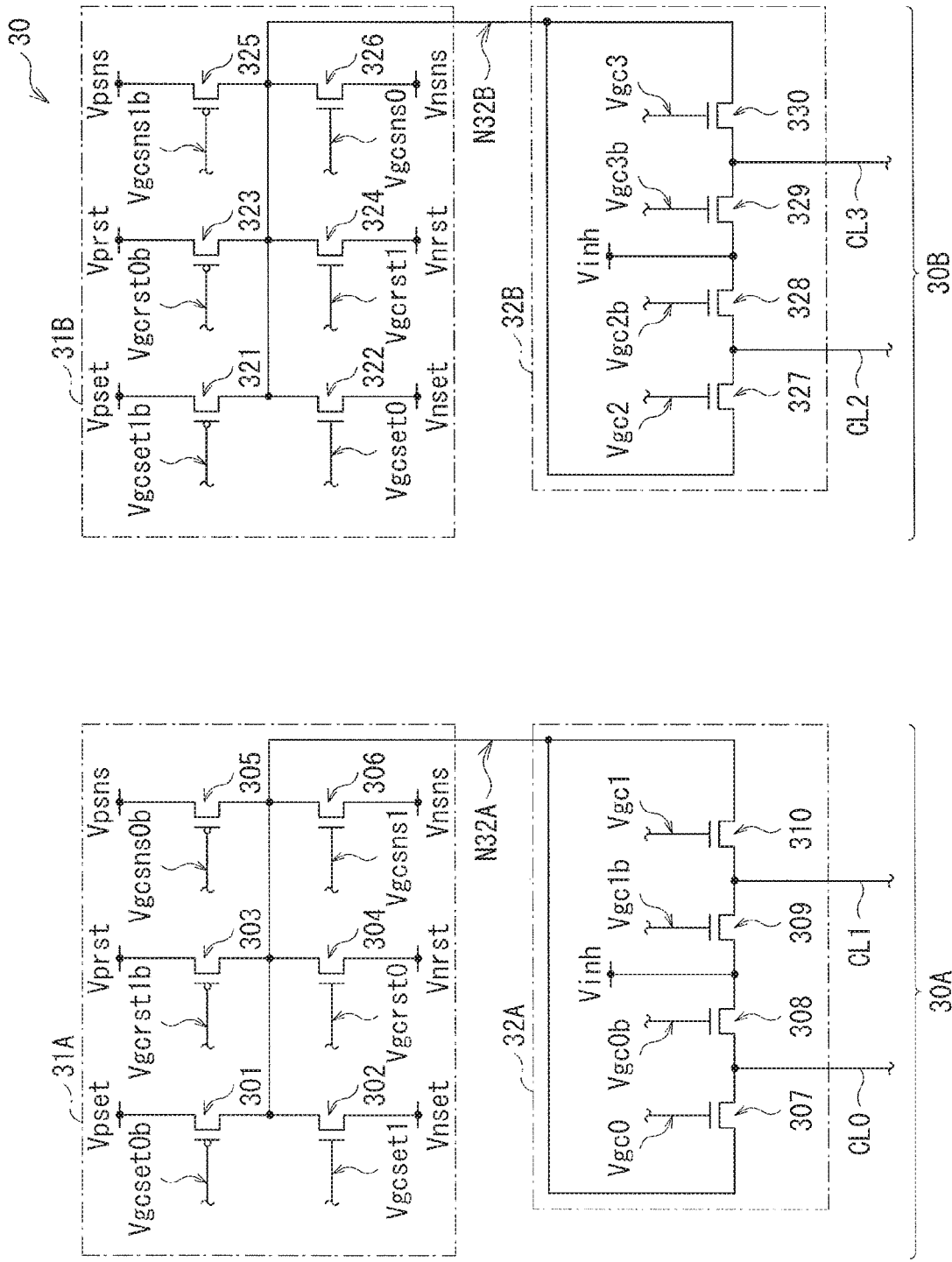

[FIG. 8]
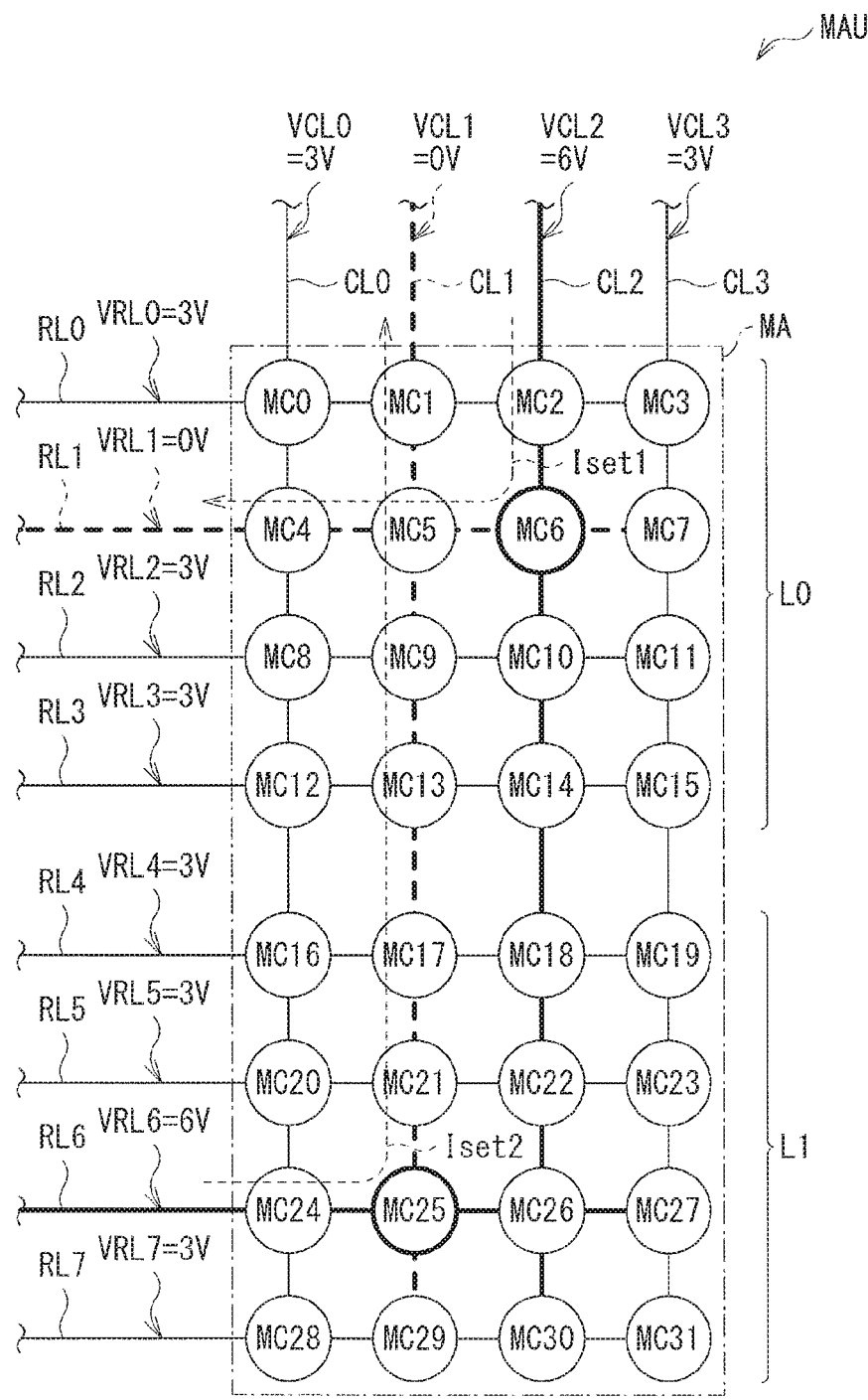

[FIG. 9A]
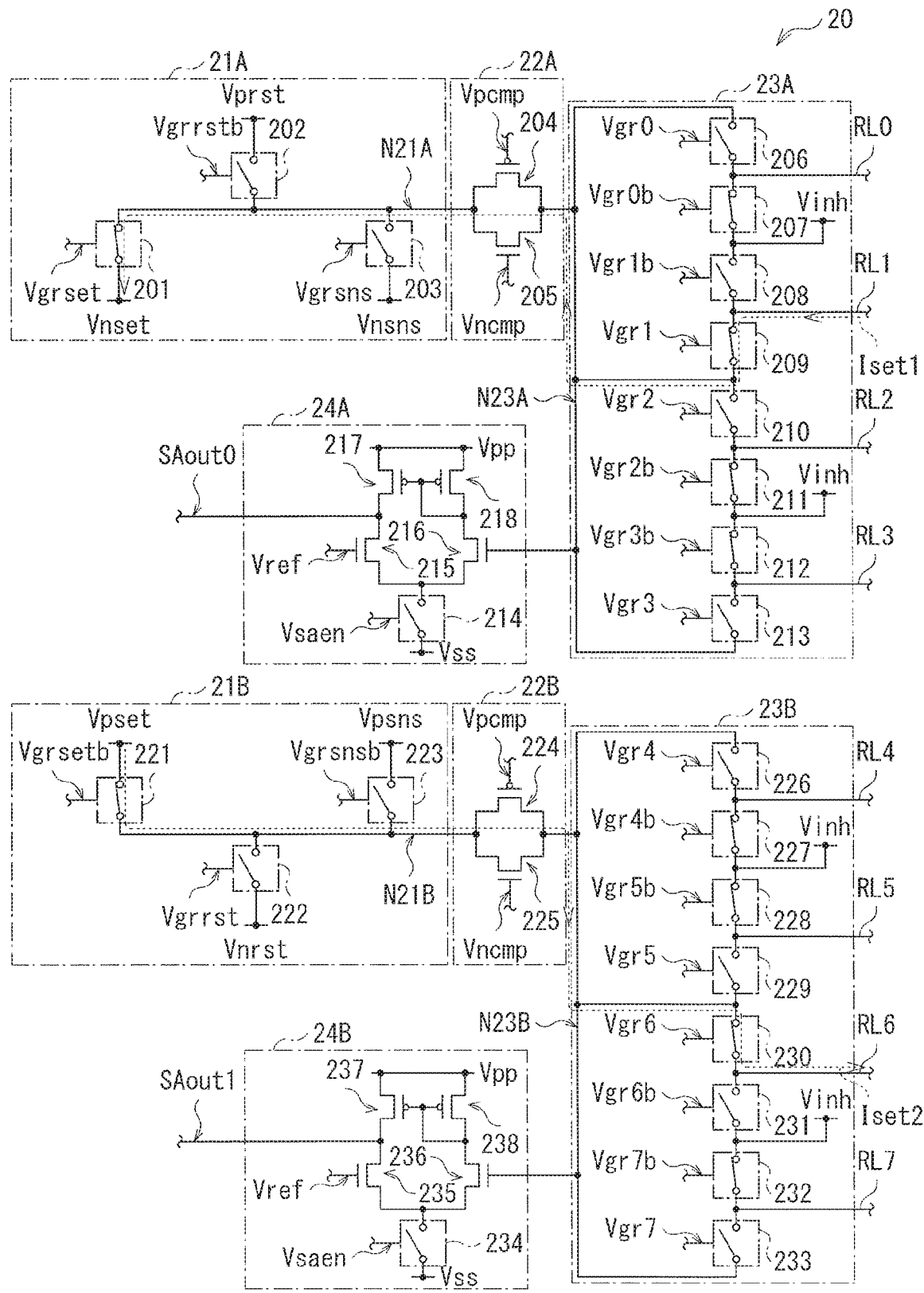

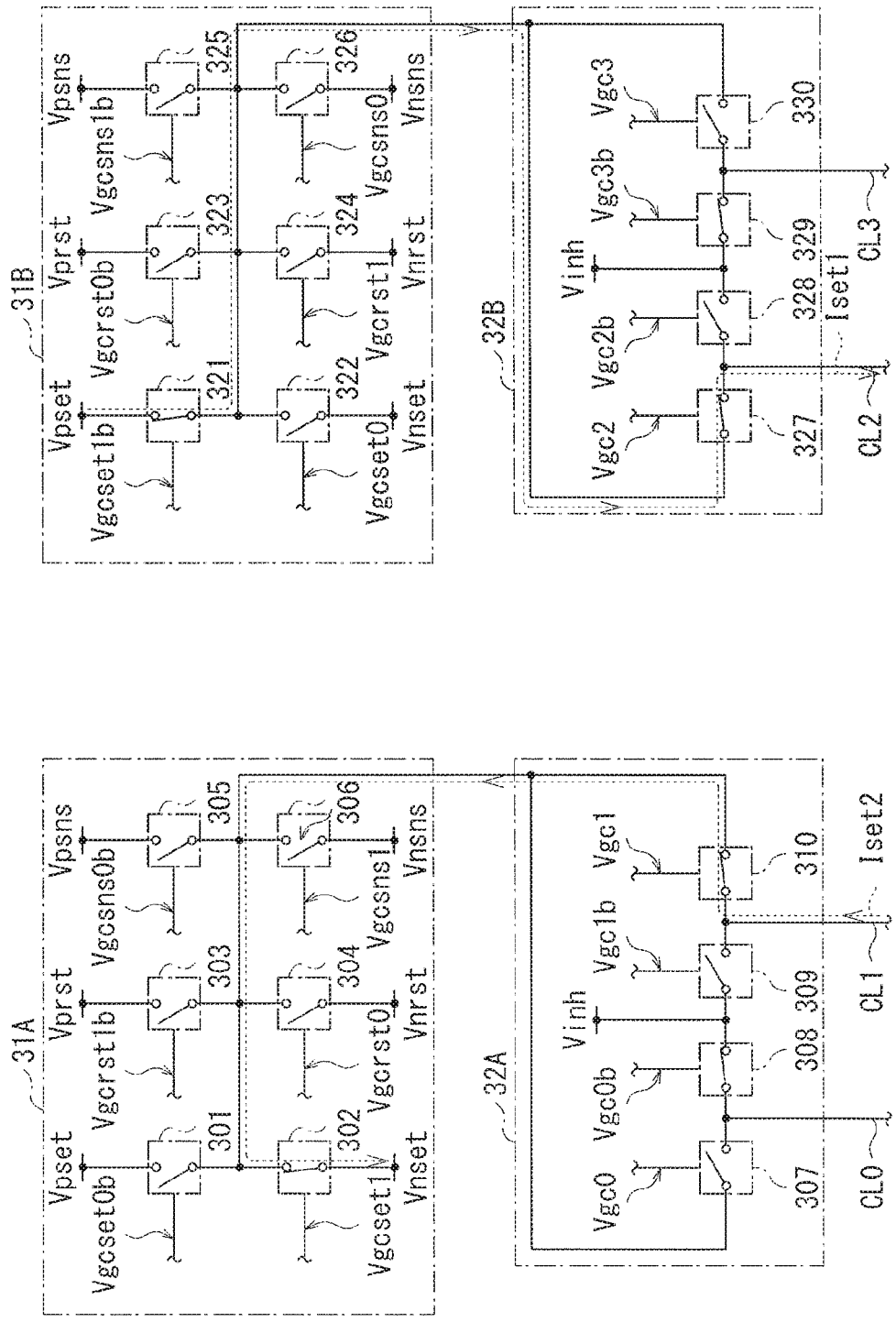

[FIG. 10]
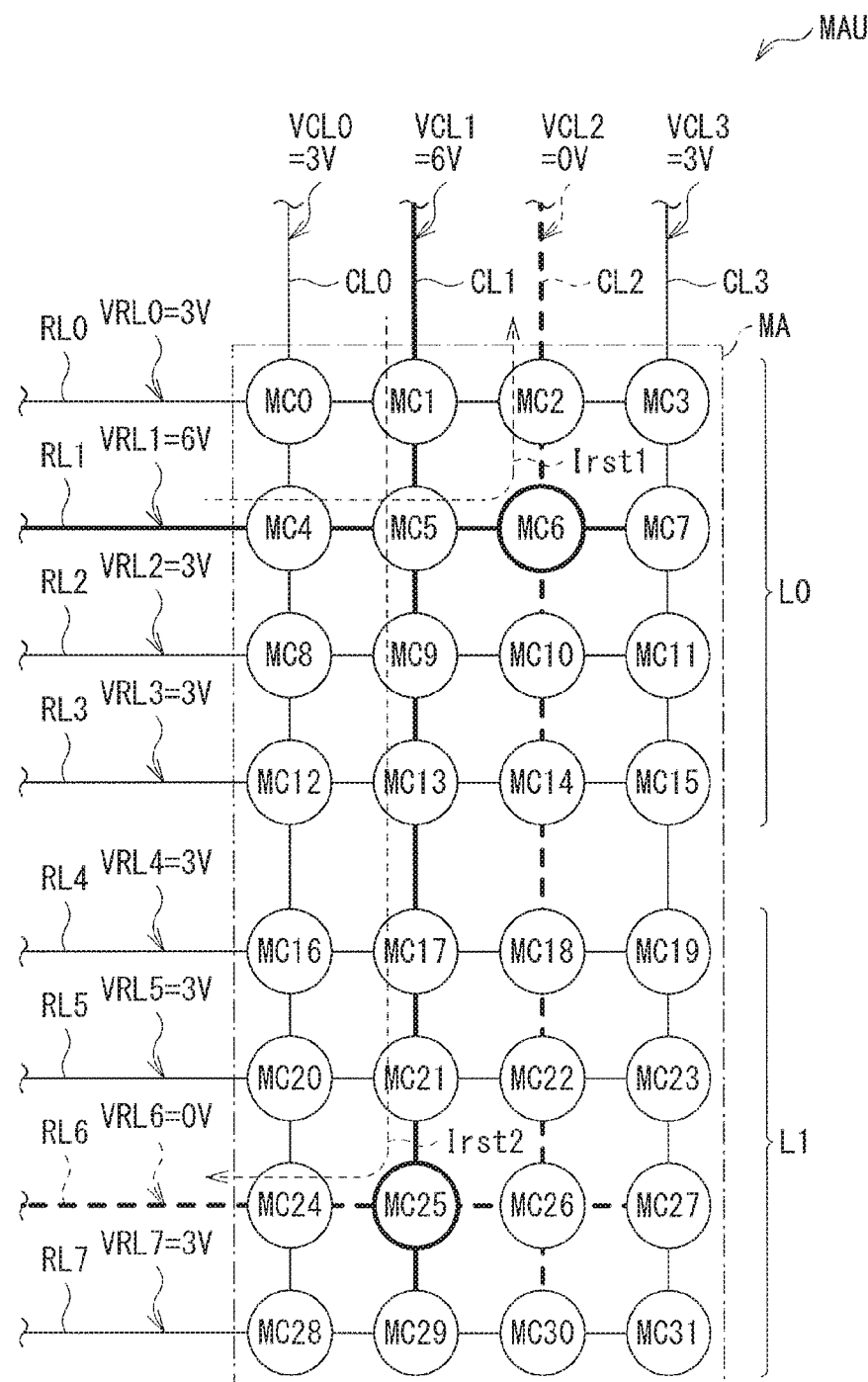

[FIG. 11A]
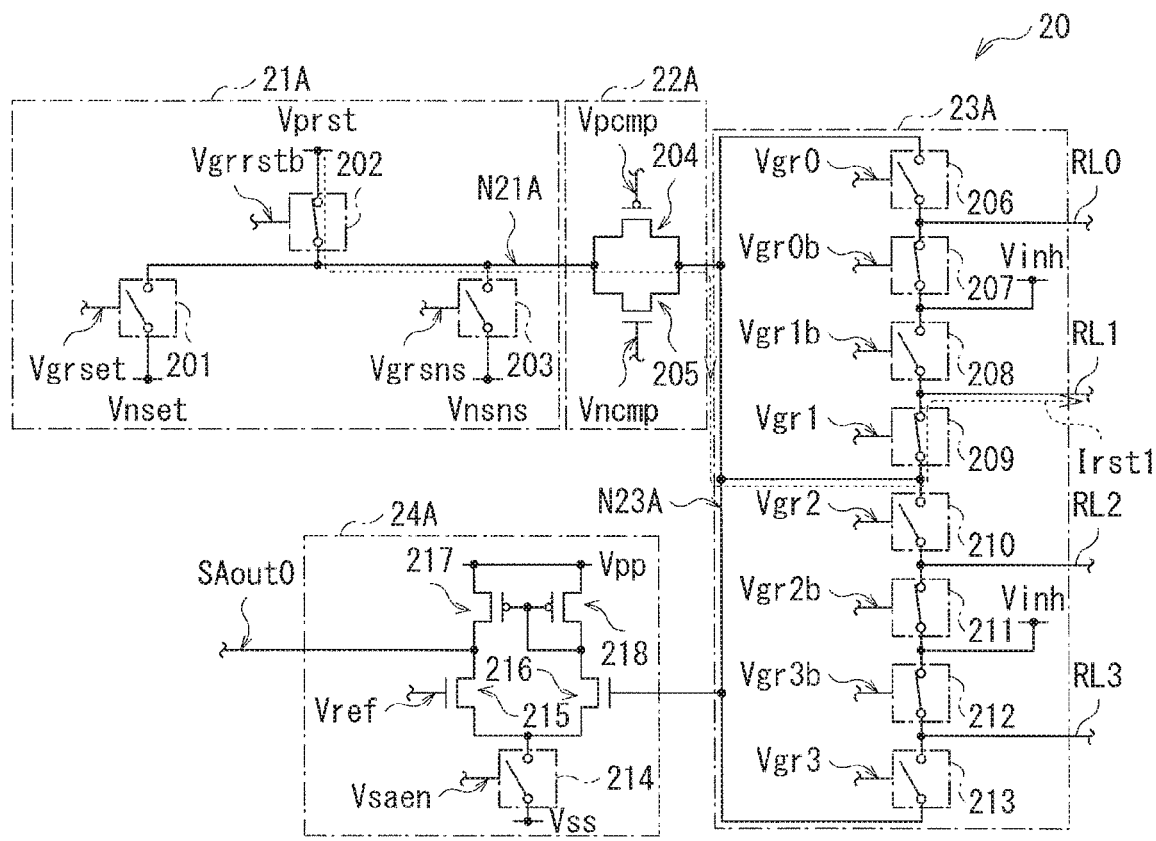
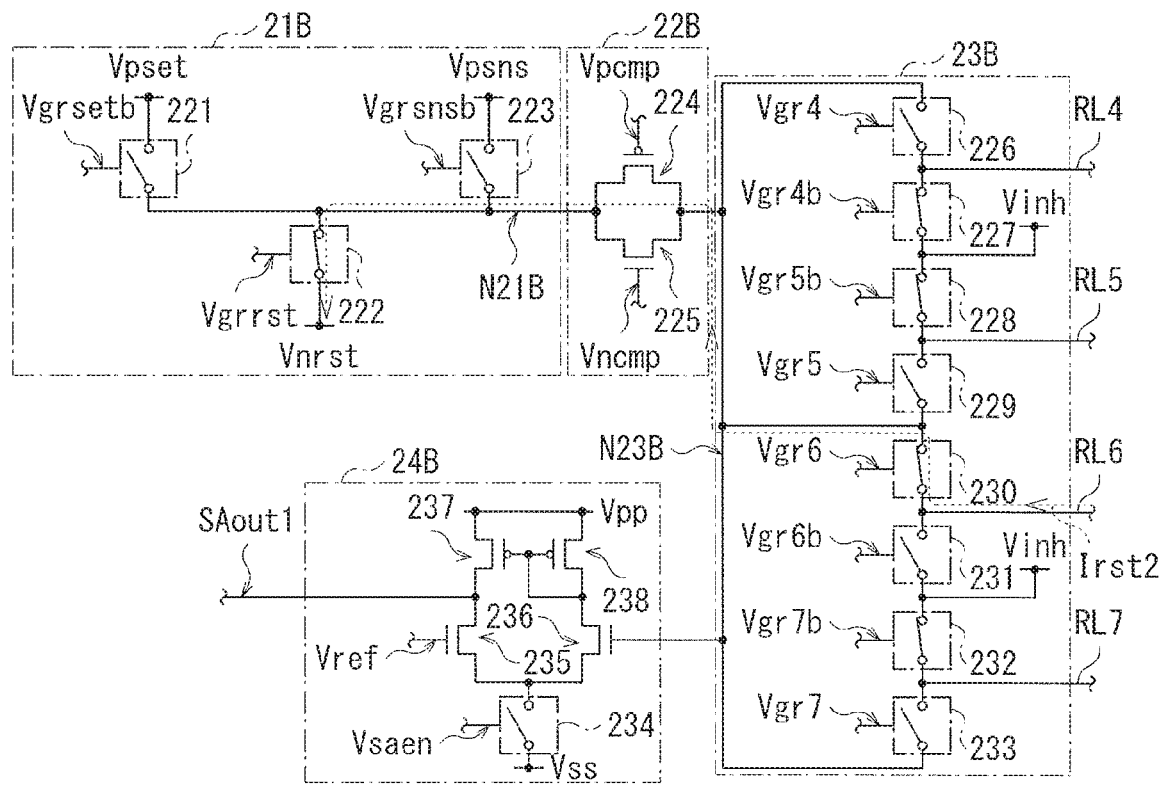

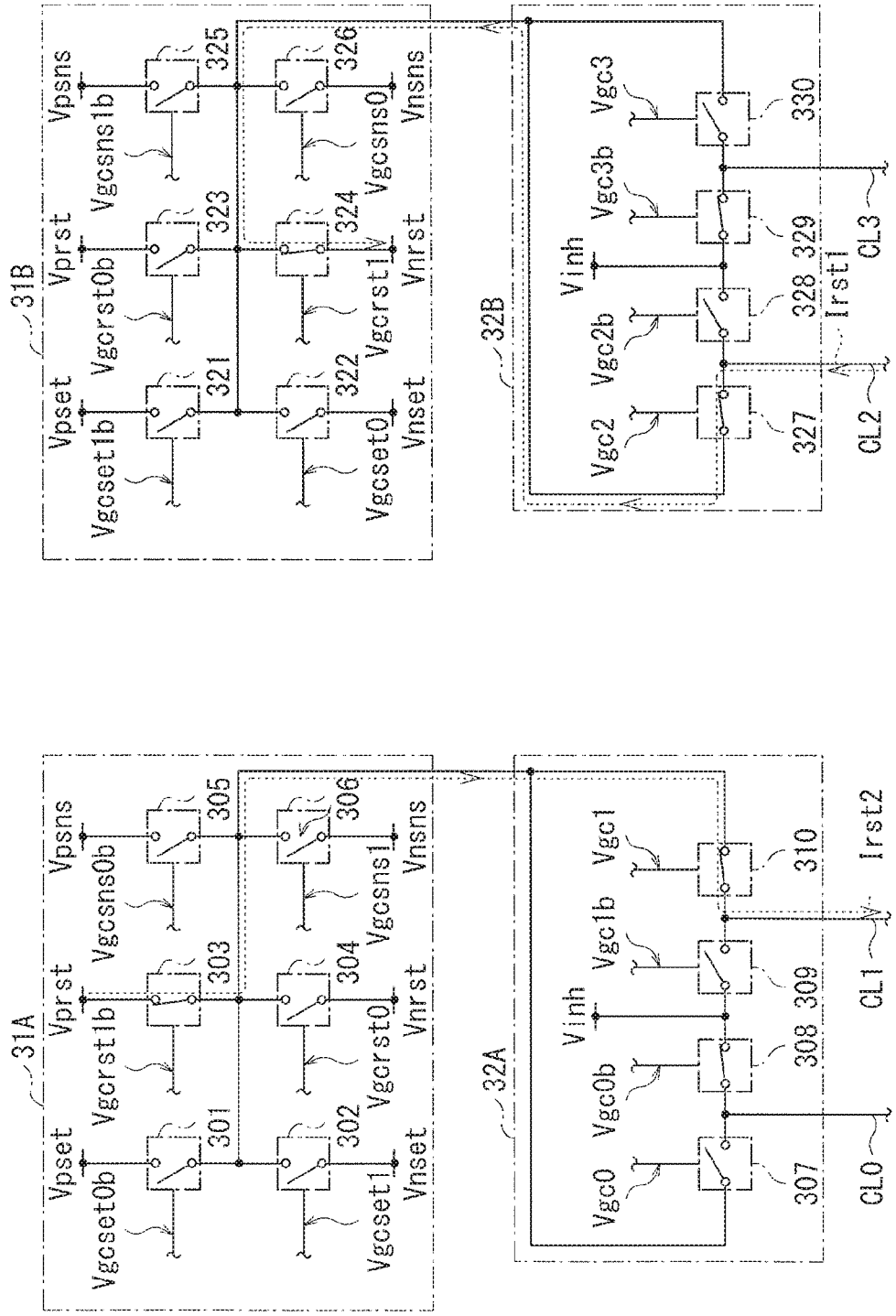
[ FIG. 11B ]

[FIG. 12]
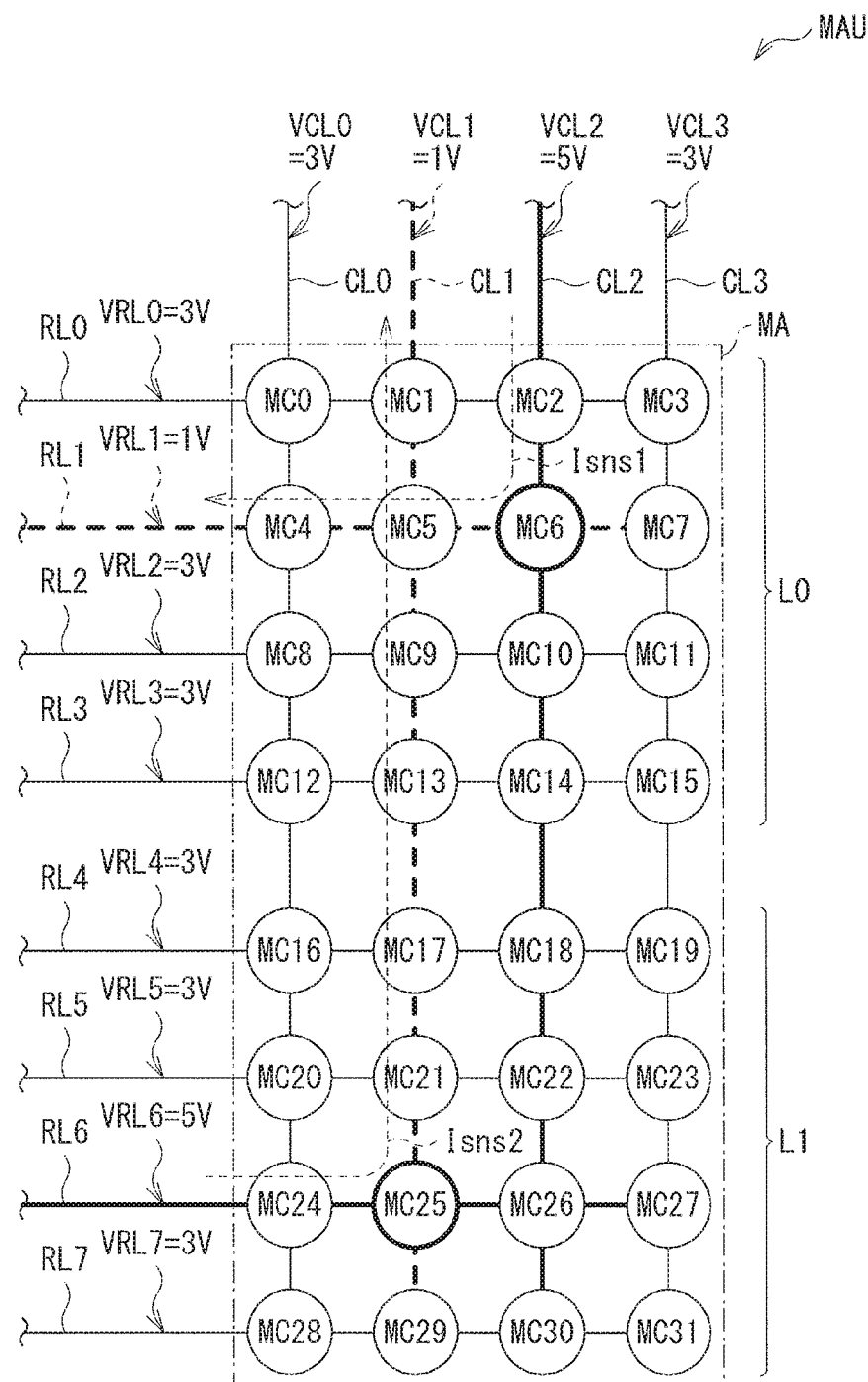

[FIG. 13A]
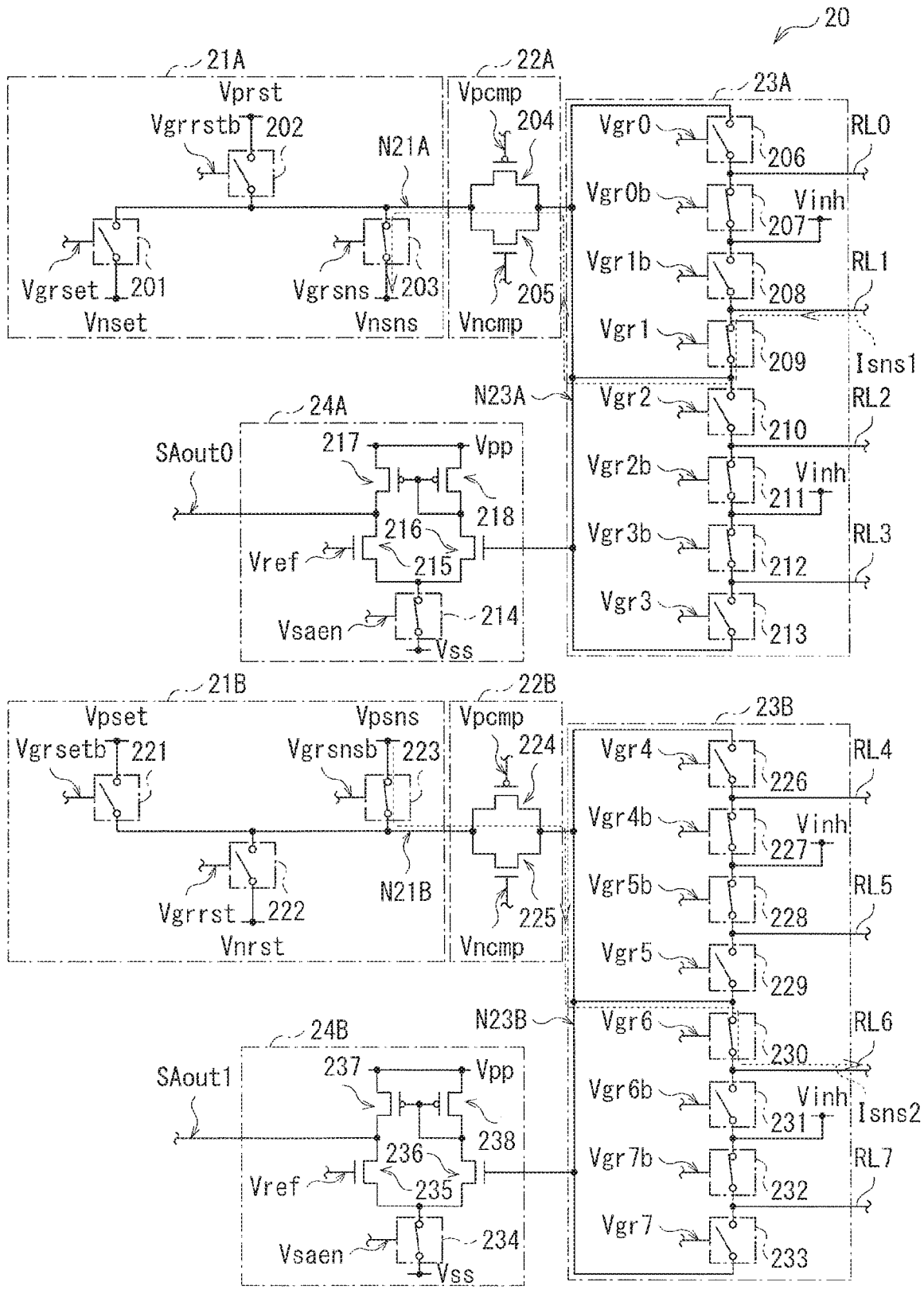

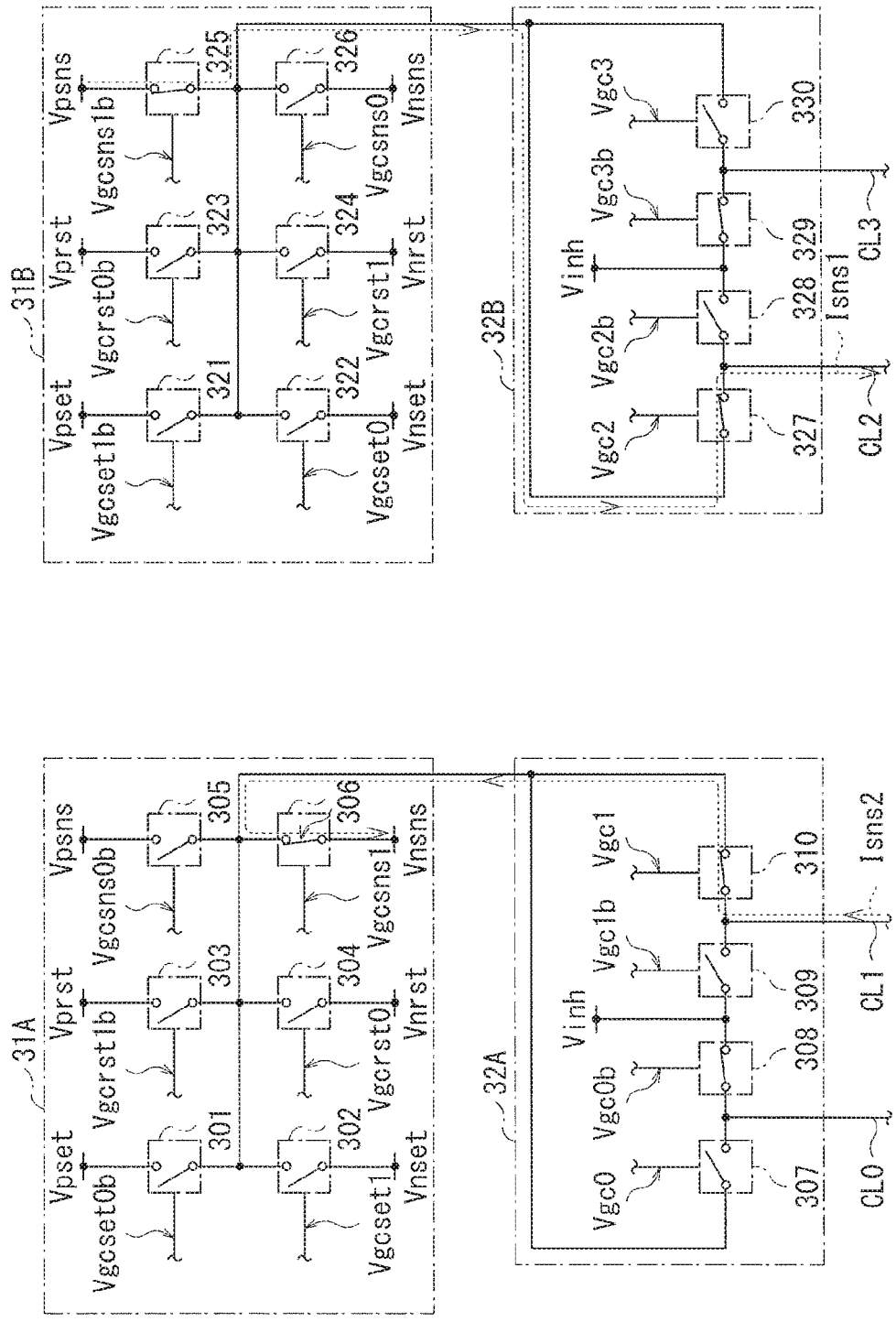
[FIG. 13B]

[FIG. 14]
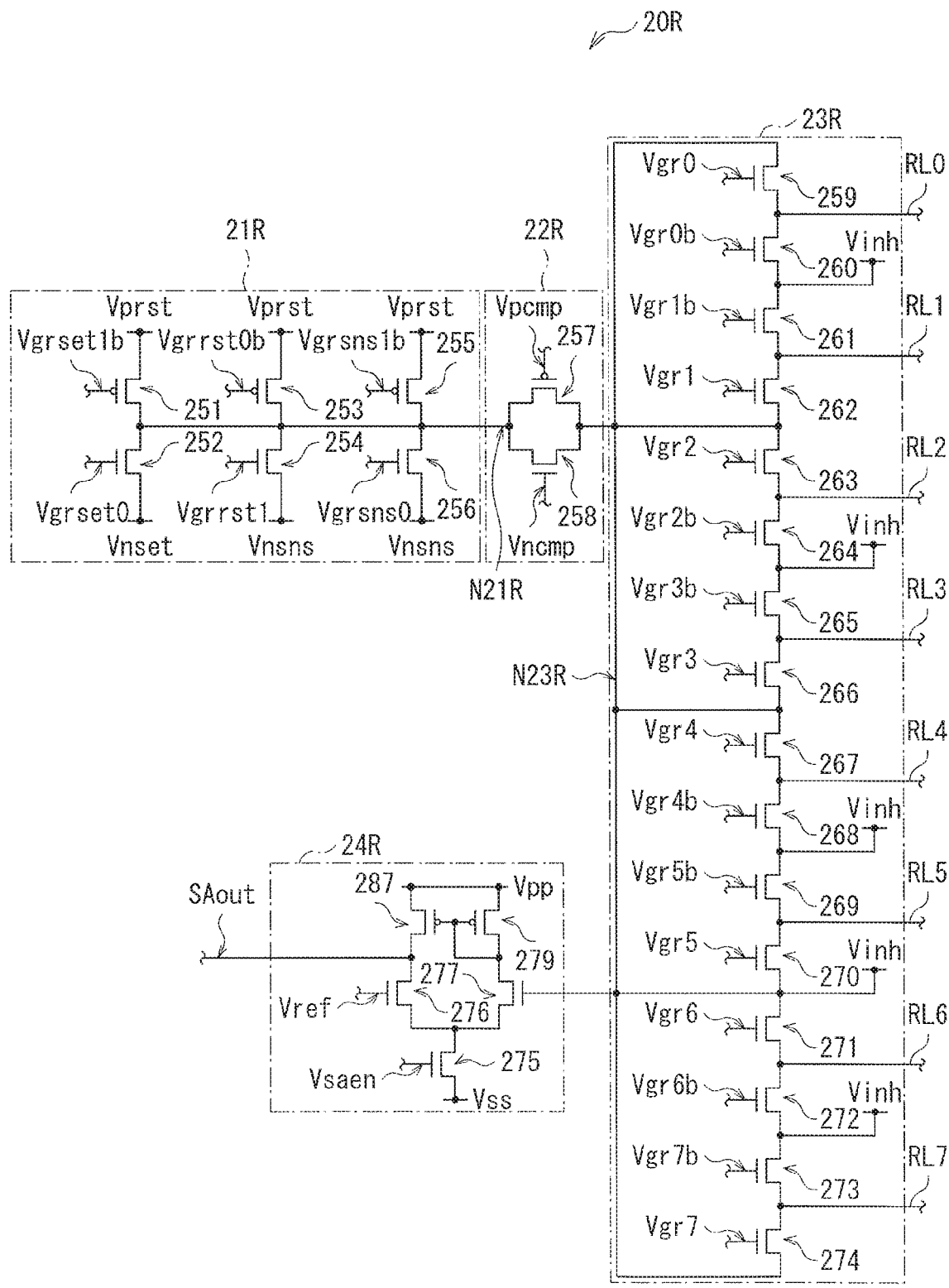

[FIG. 15]
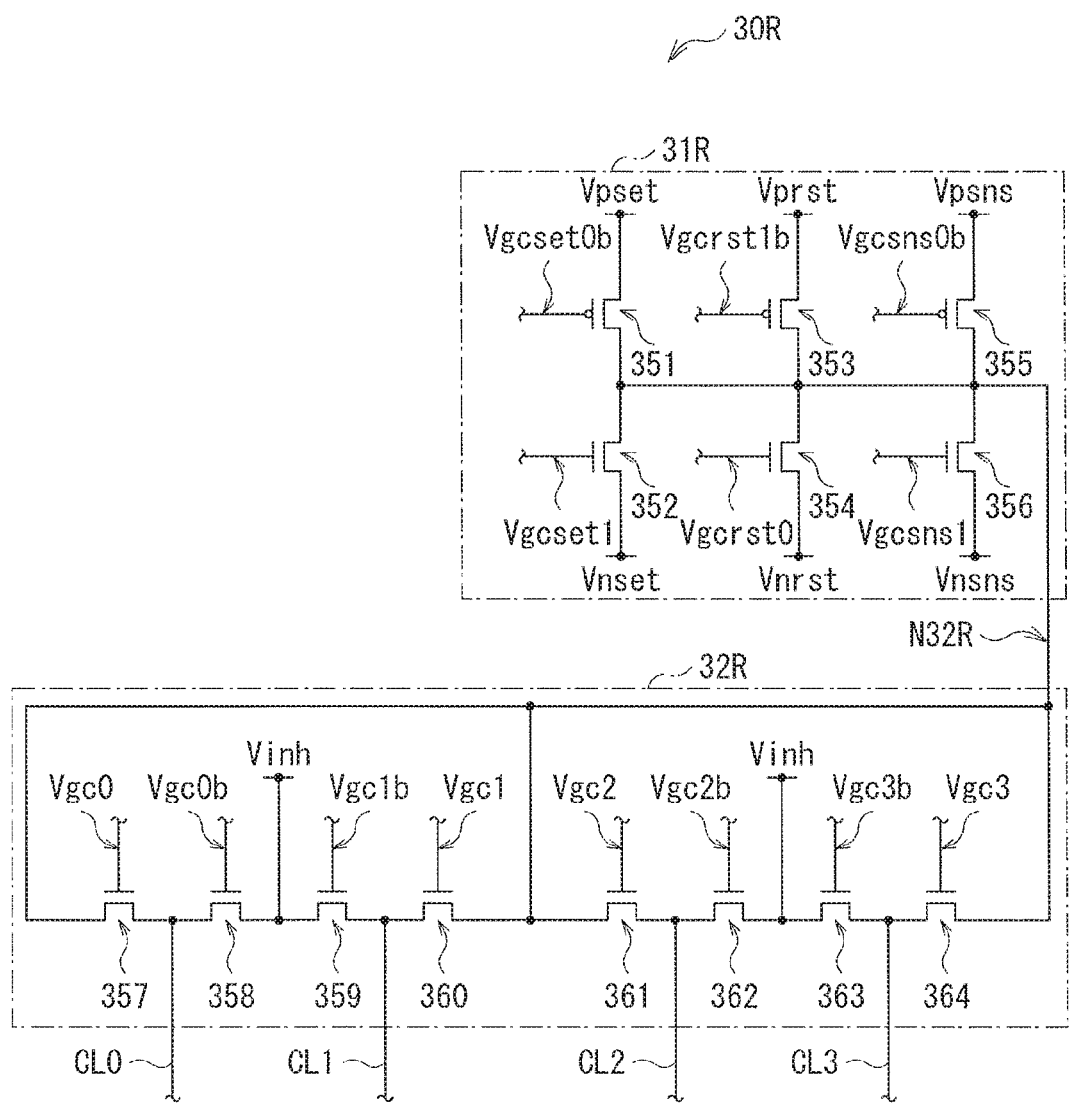

[ FIG. 16 ]
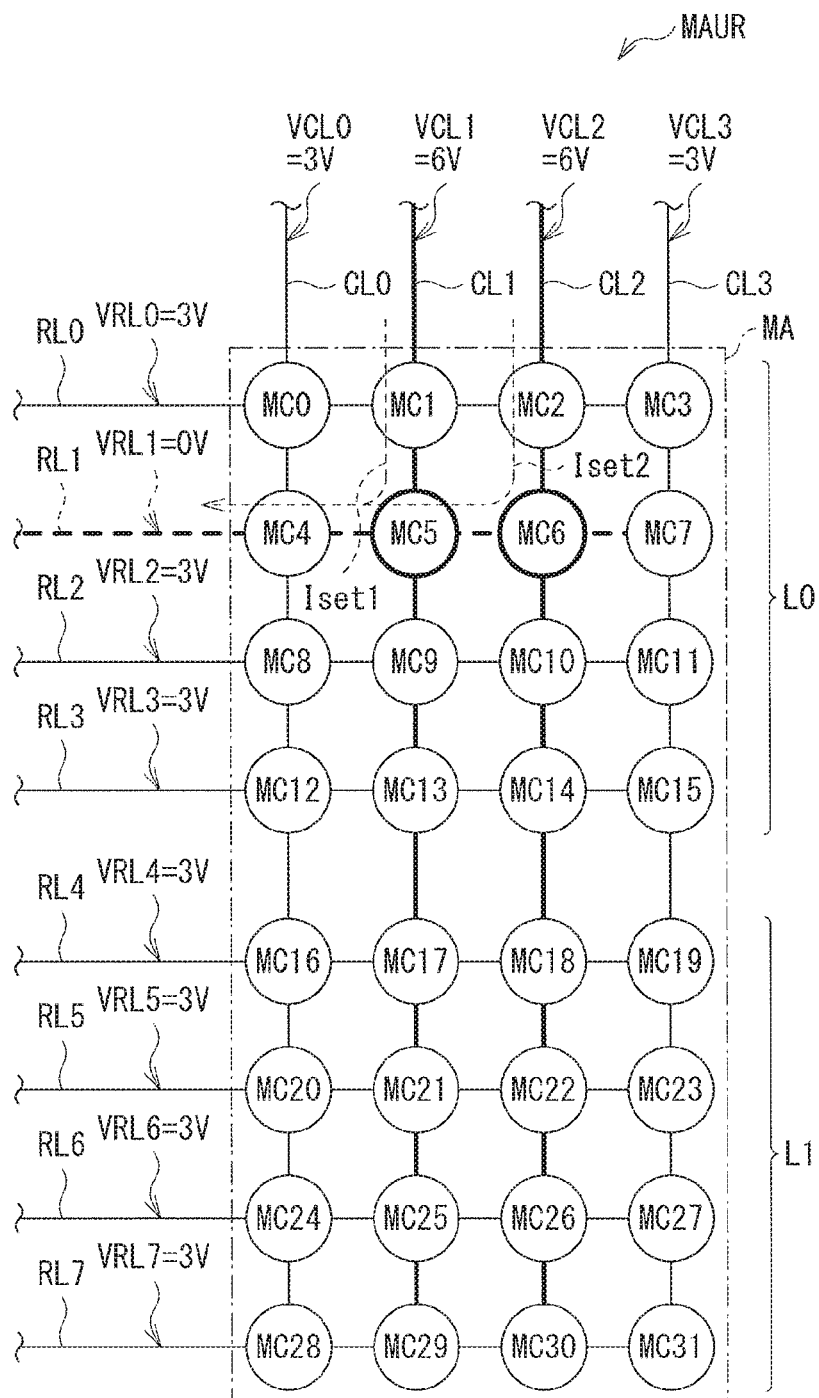

[FIG. 17]
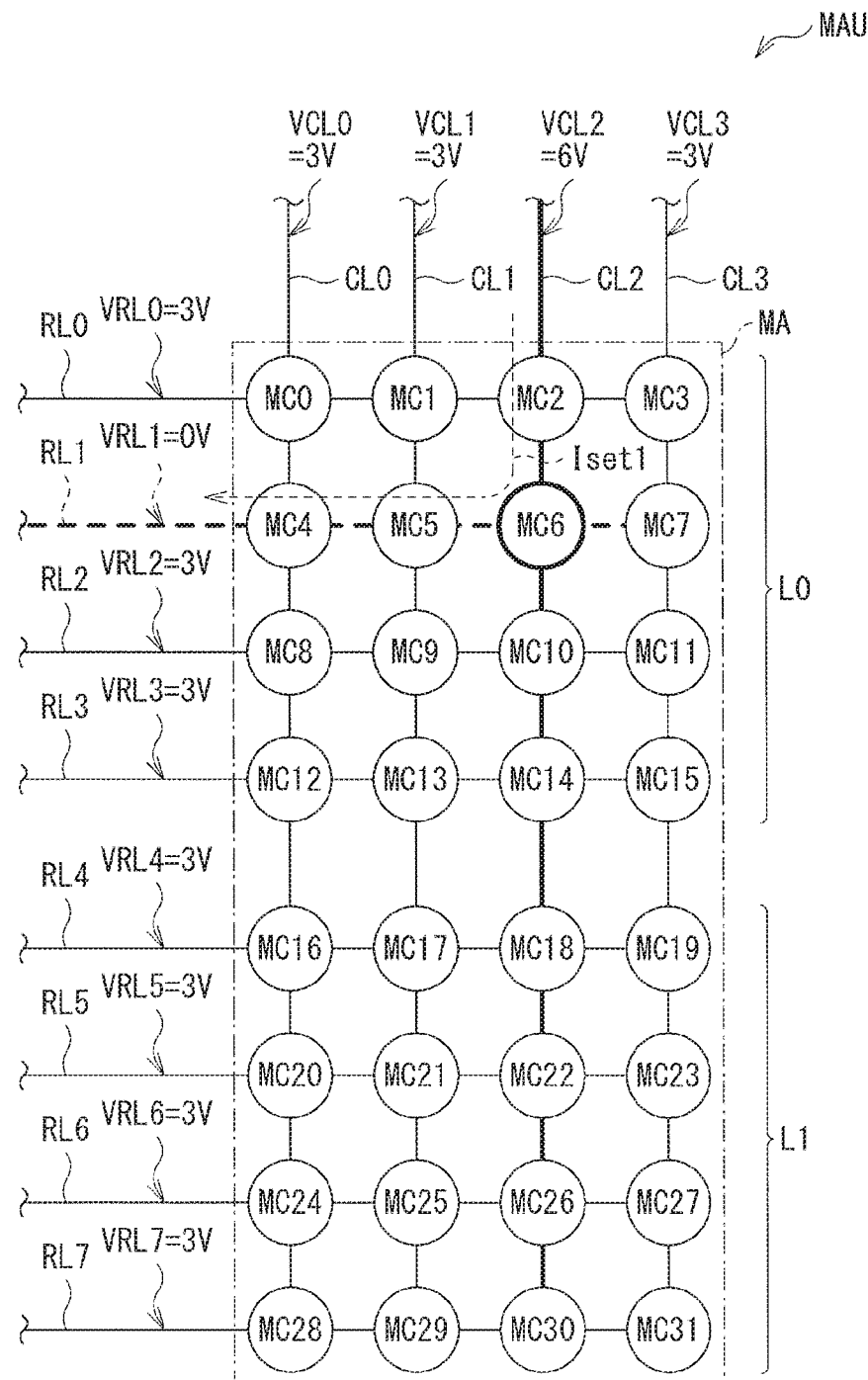

[FIG. 18A]
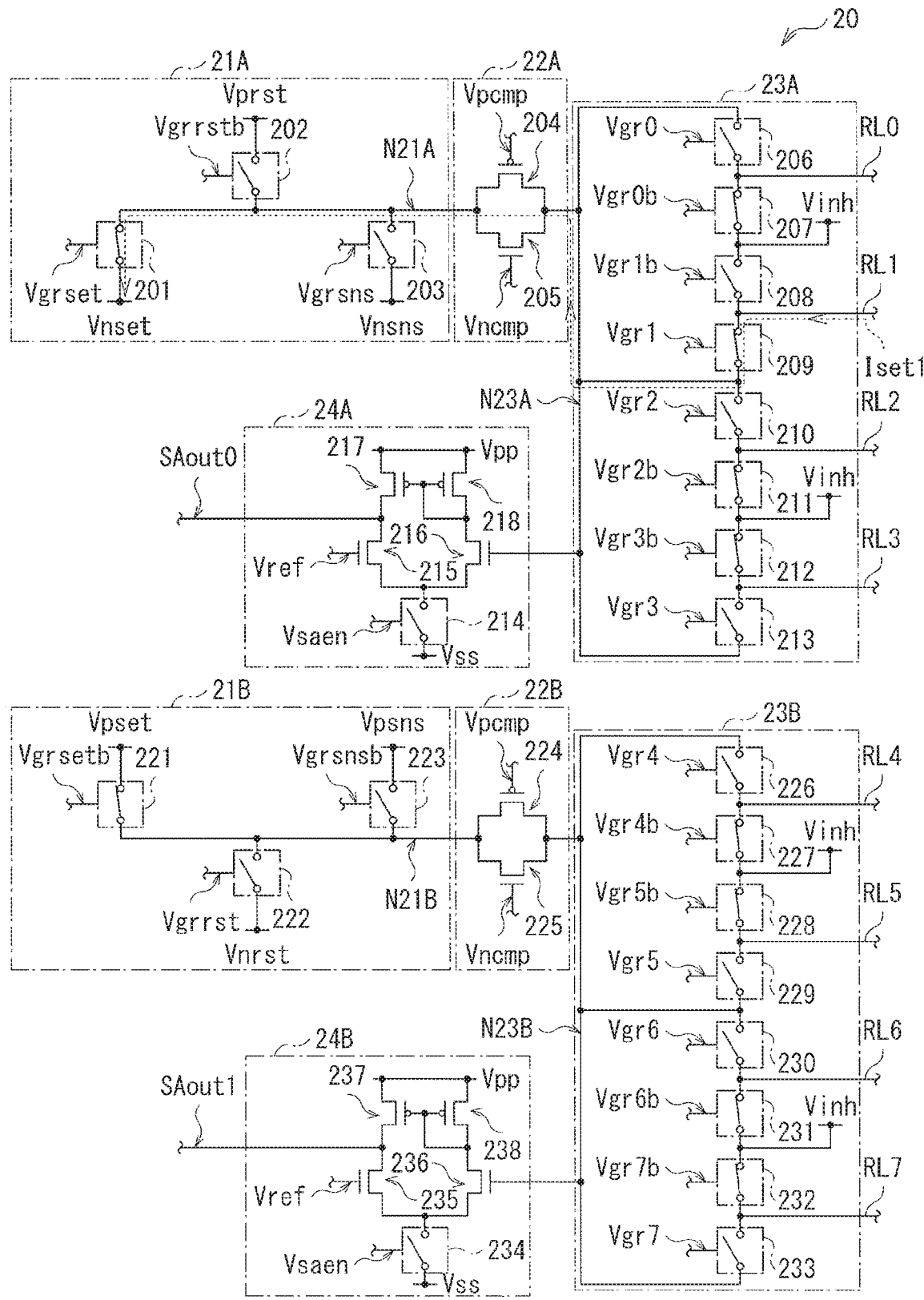

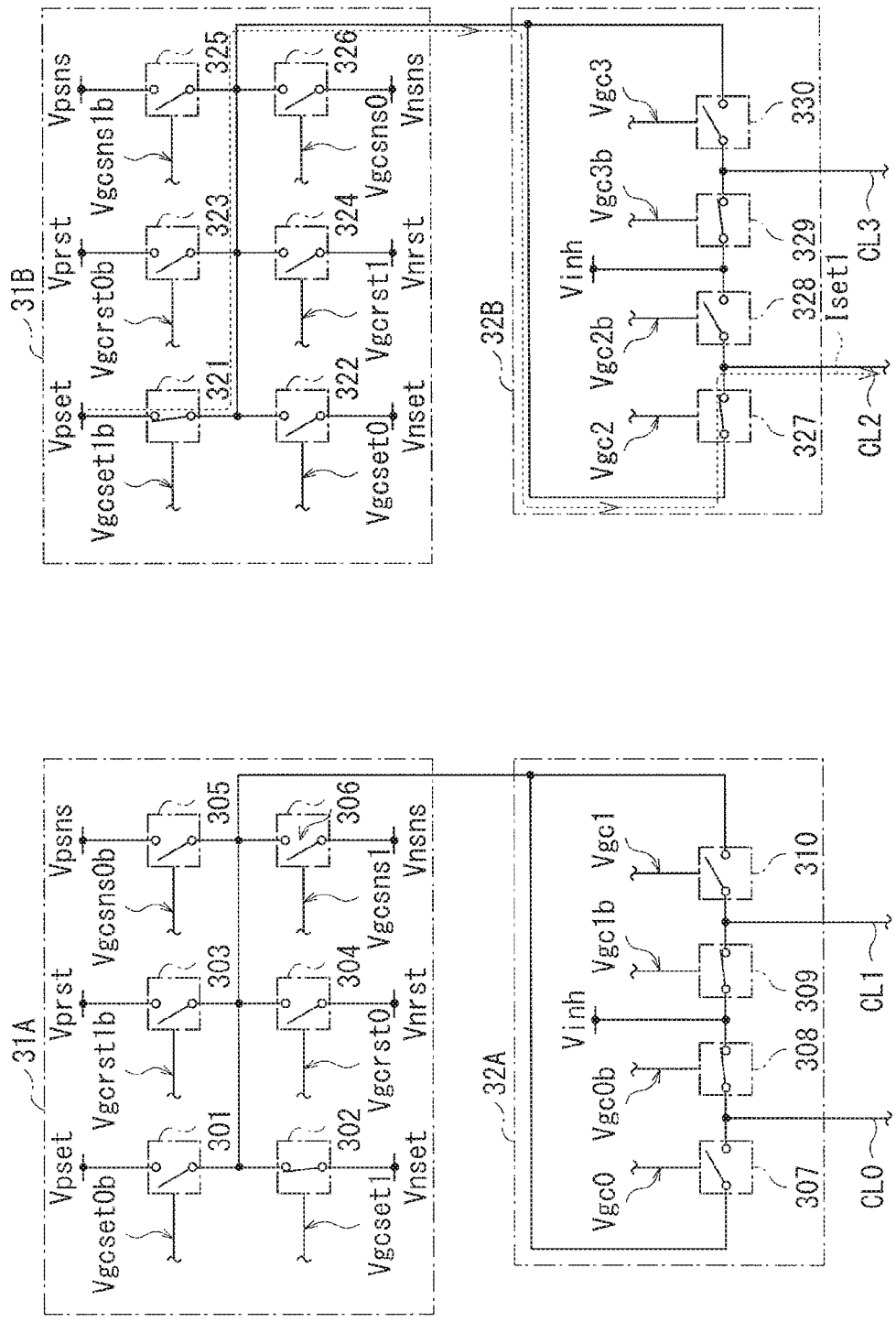
[FIG. 18B]

[FIG. 19]
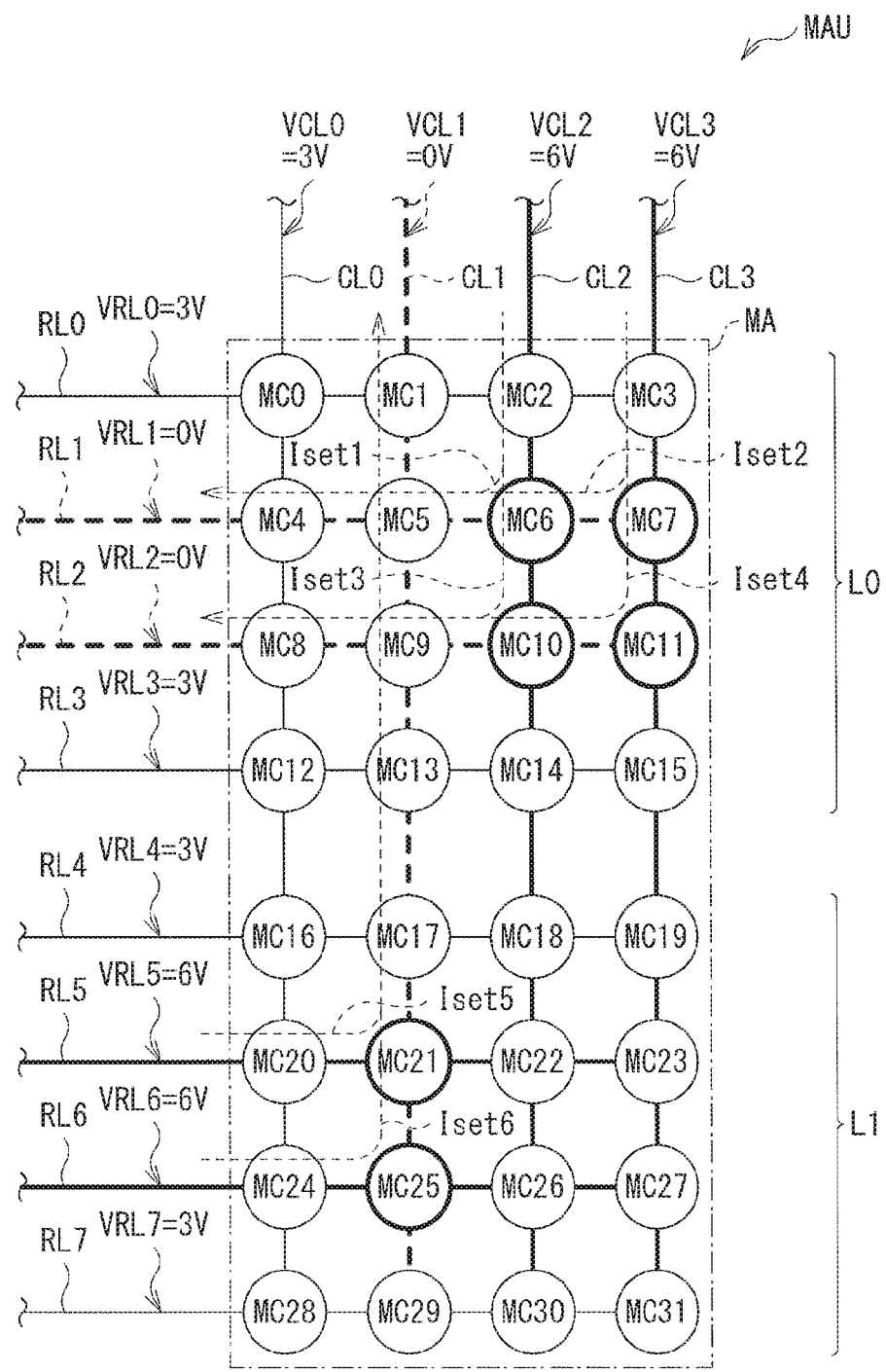

[FIG. 20A]
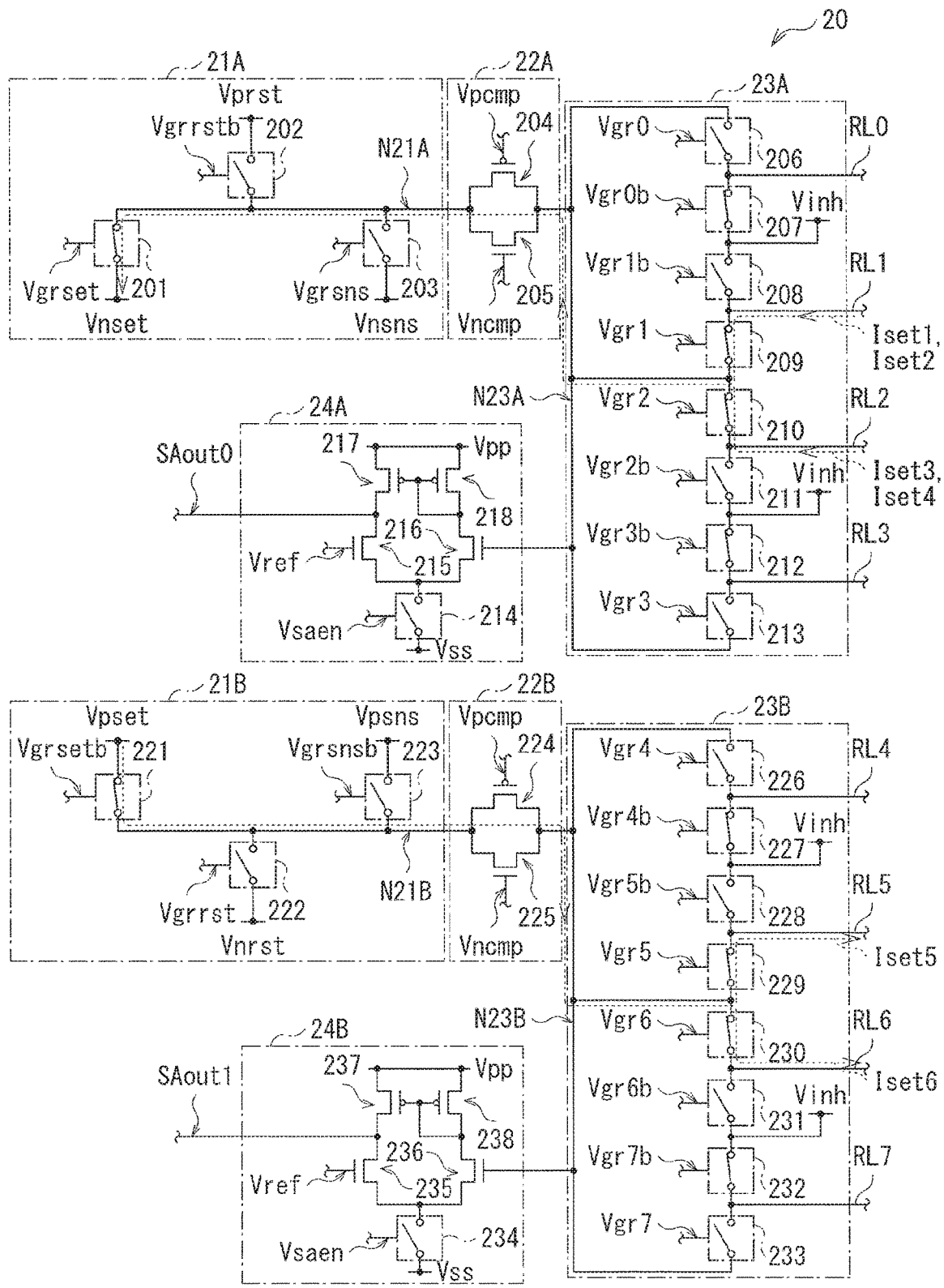

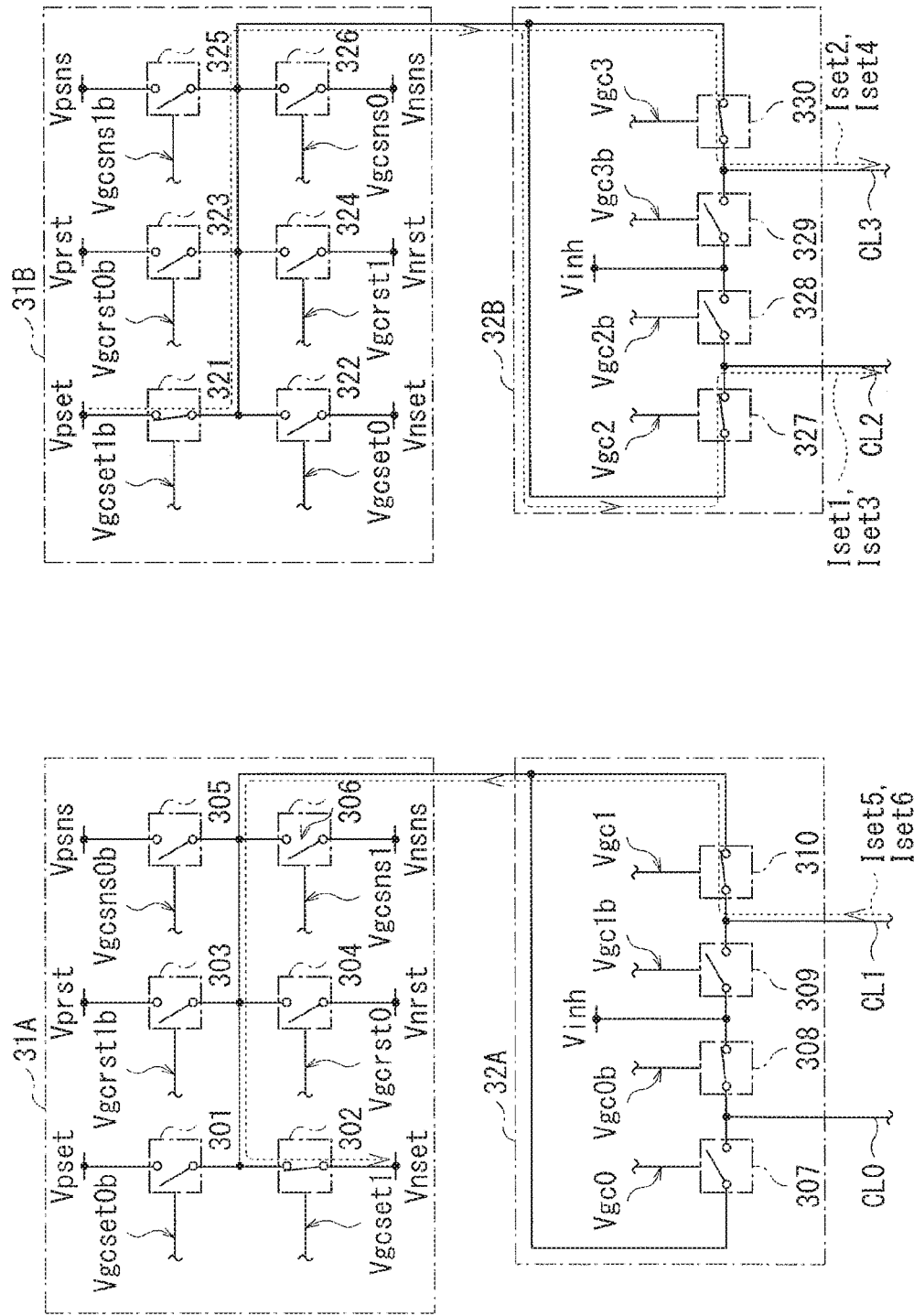
[FIG. 20B]

[ FIG. 21 ]
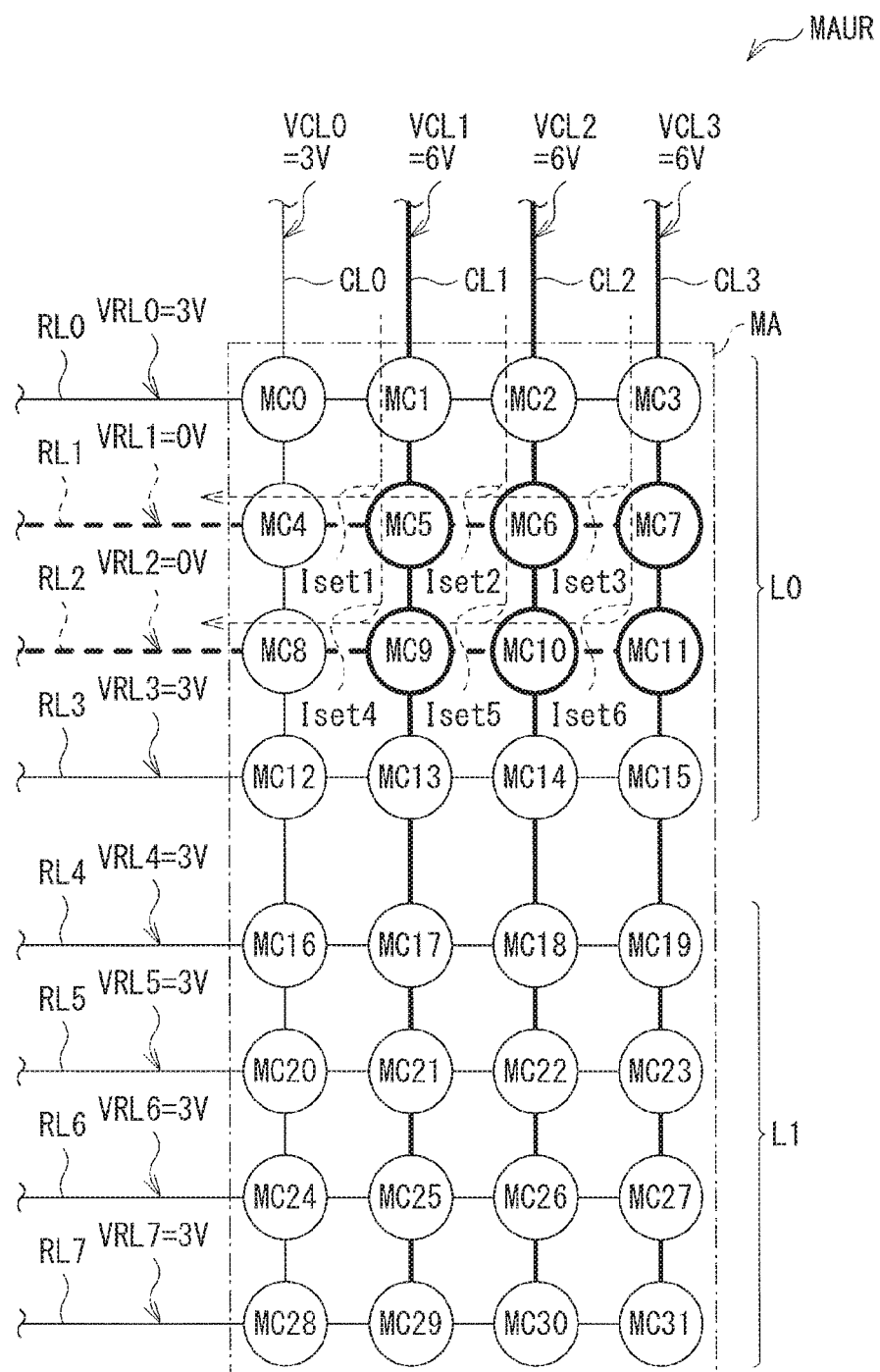

[FIG. 22]
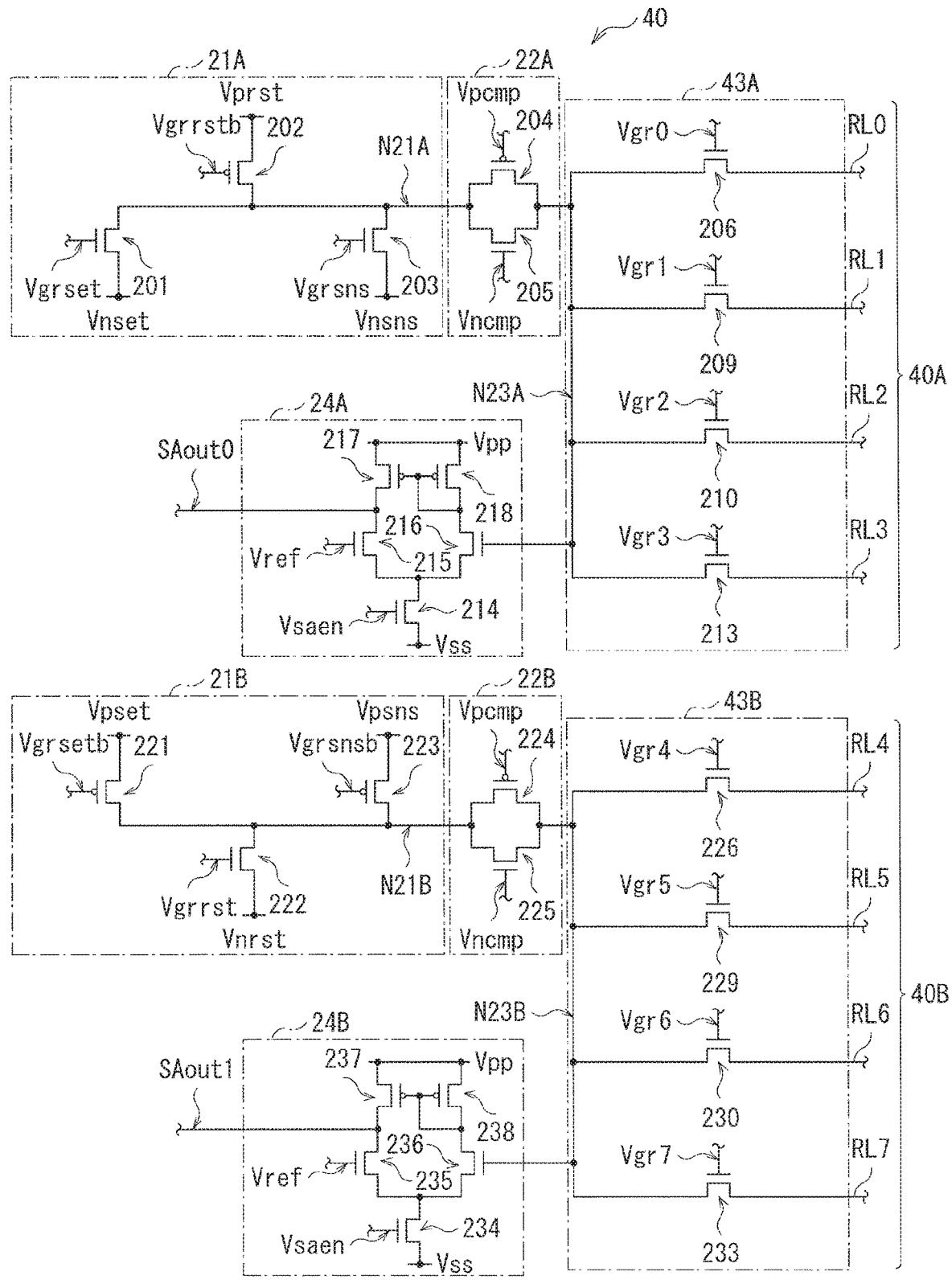

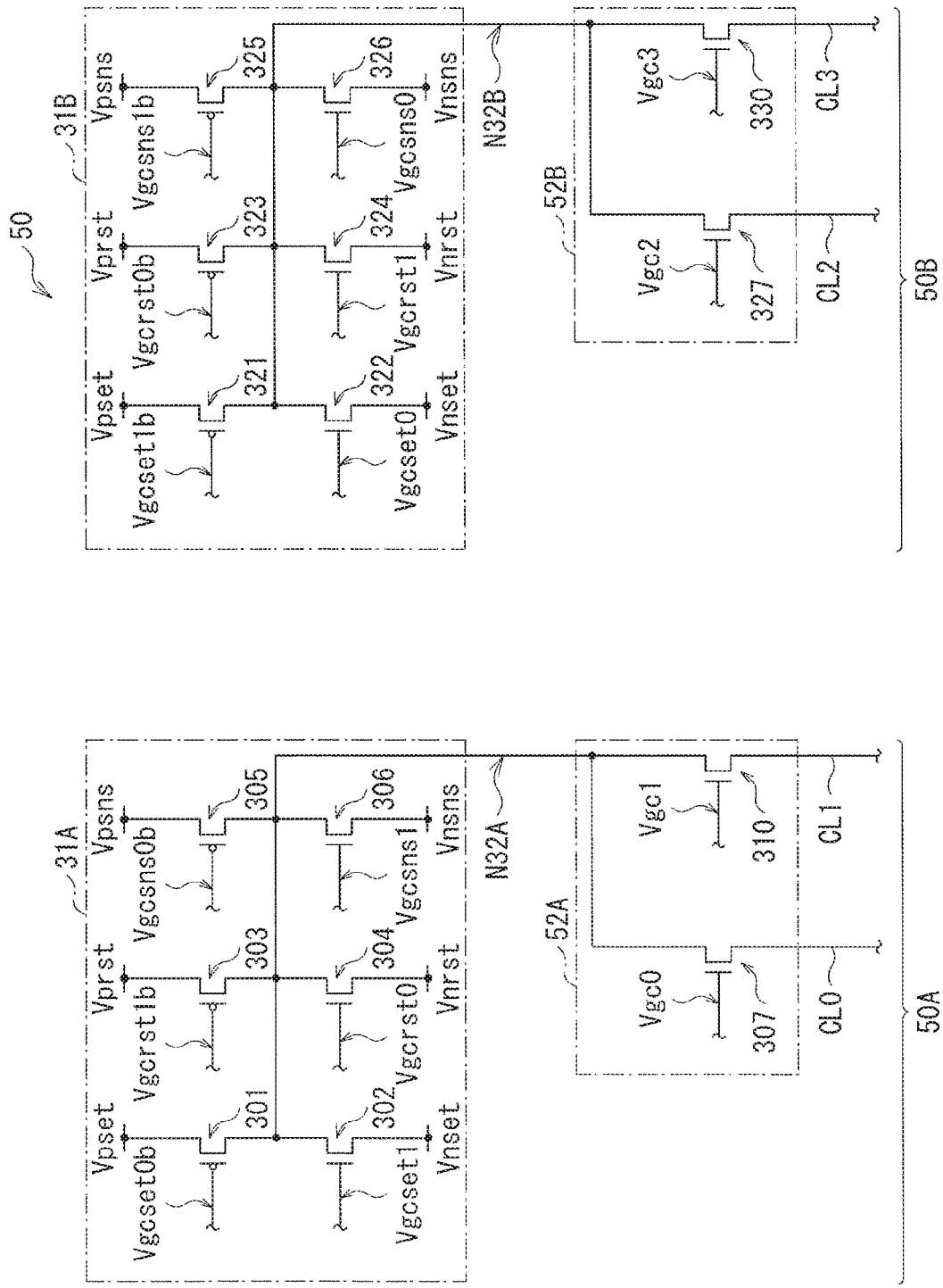
[FIG. 23]

[FIG. 24]
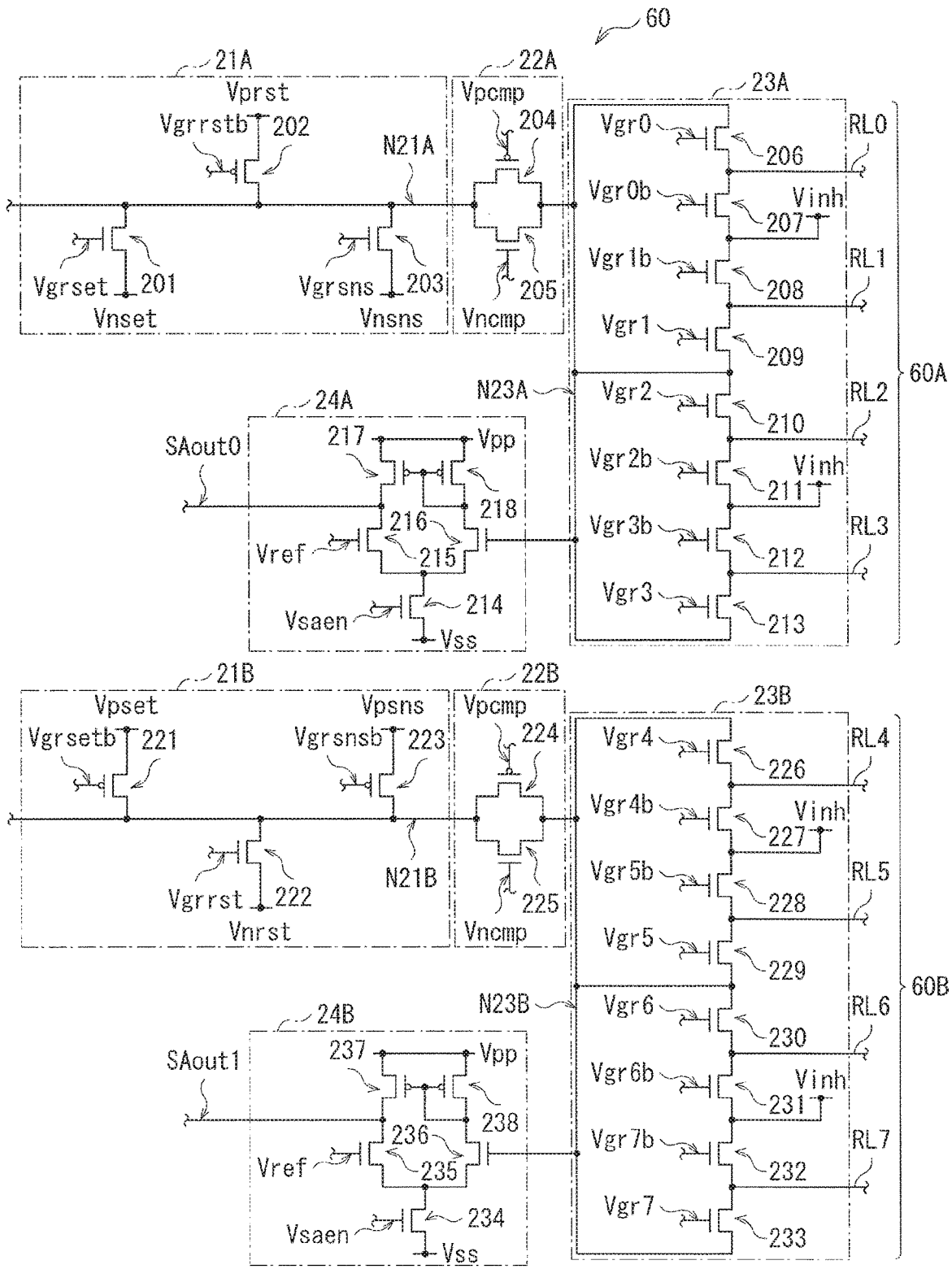

[FIG. 25]
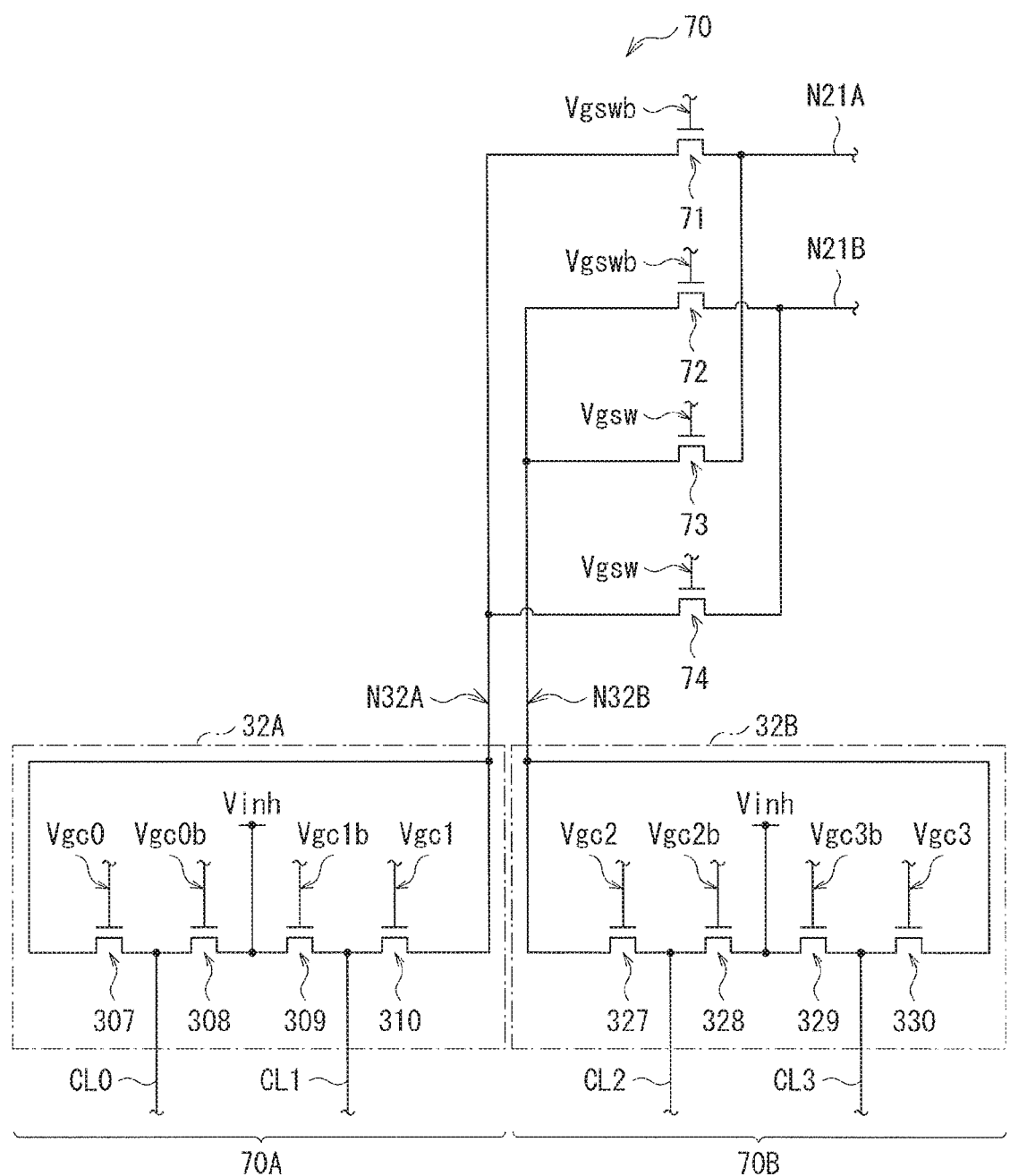

[FIG. 26A]
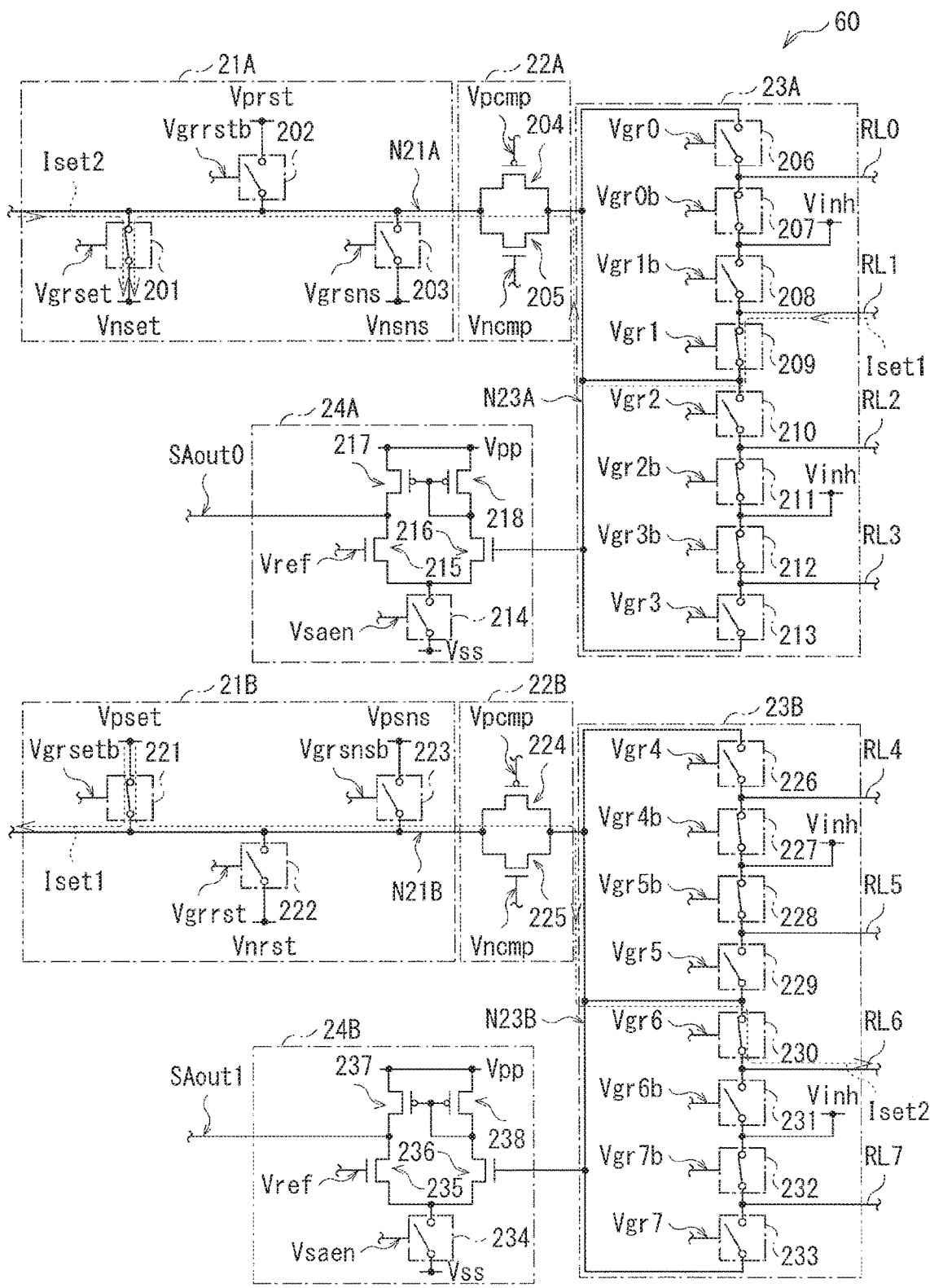

[ FIG. 26B ]
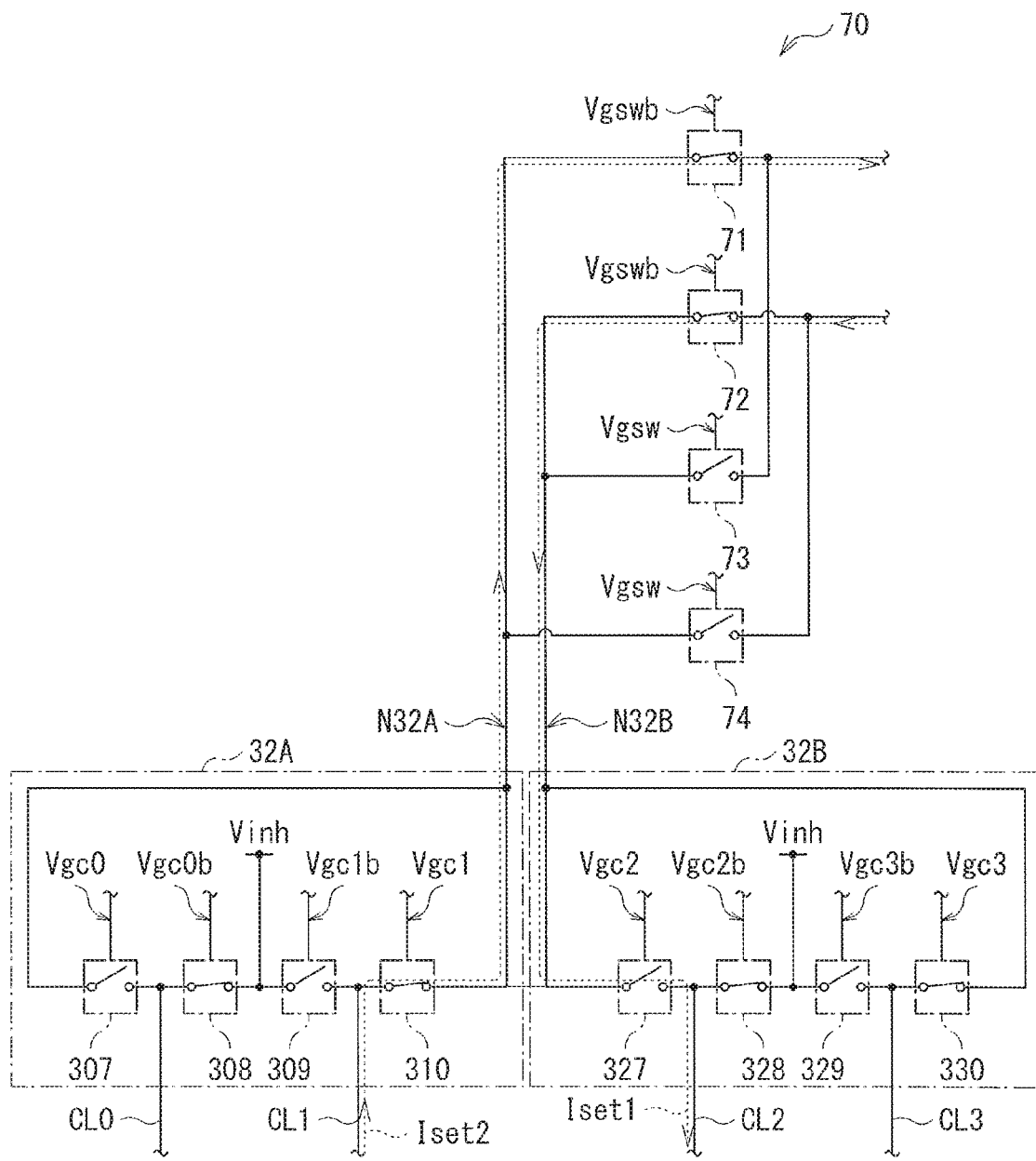

[FIG. 27]
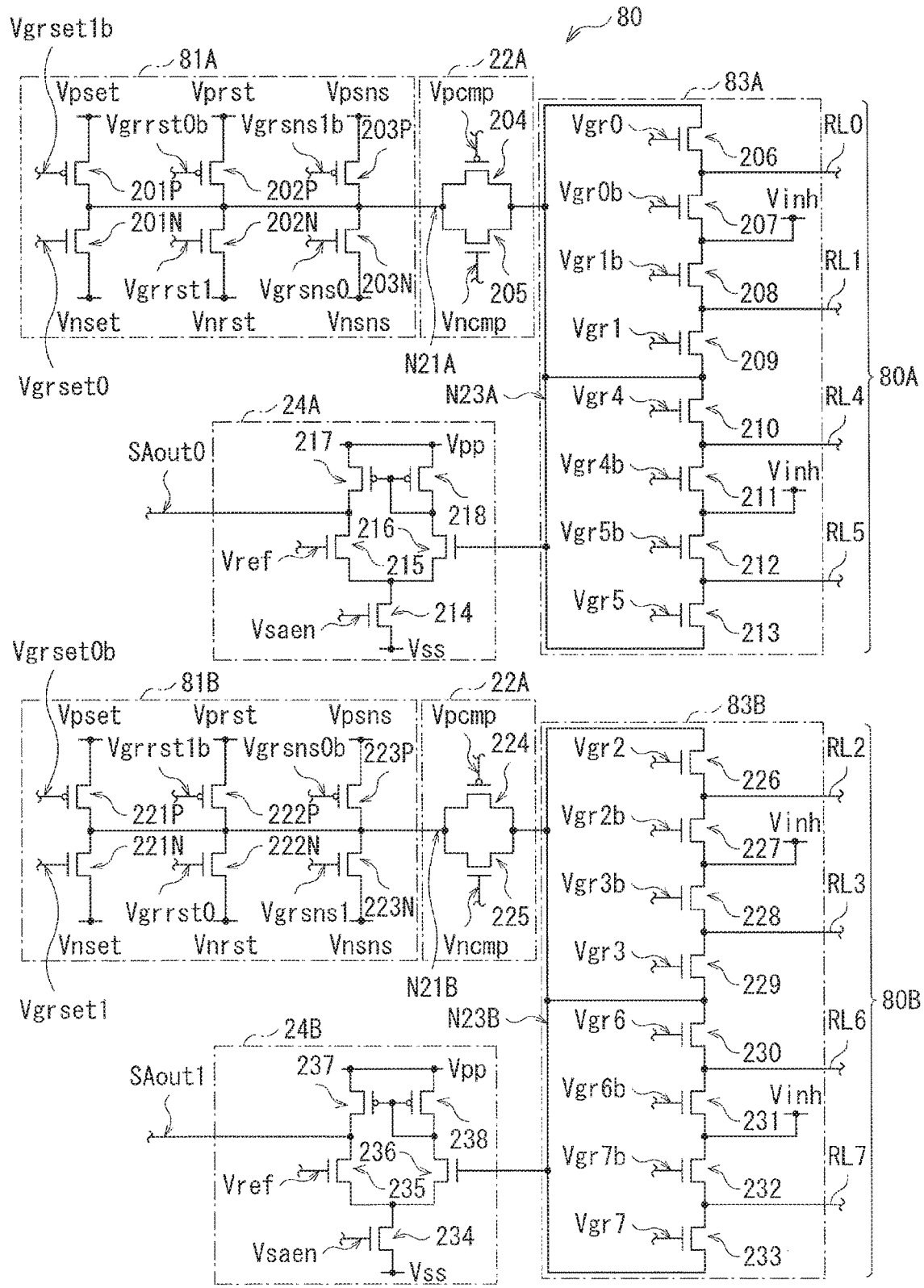

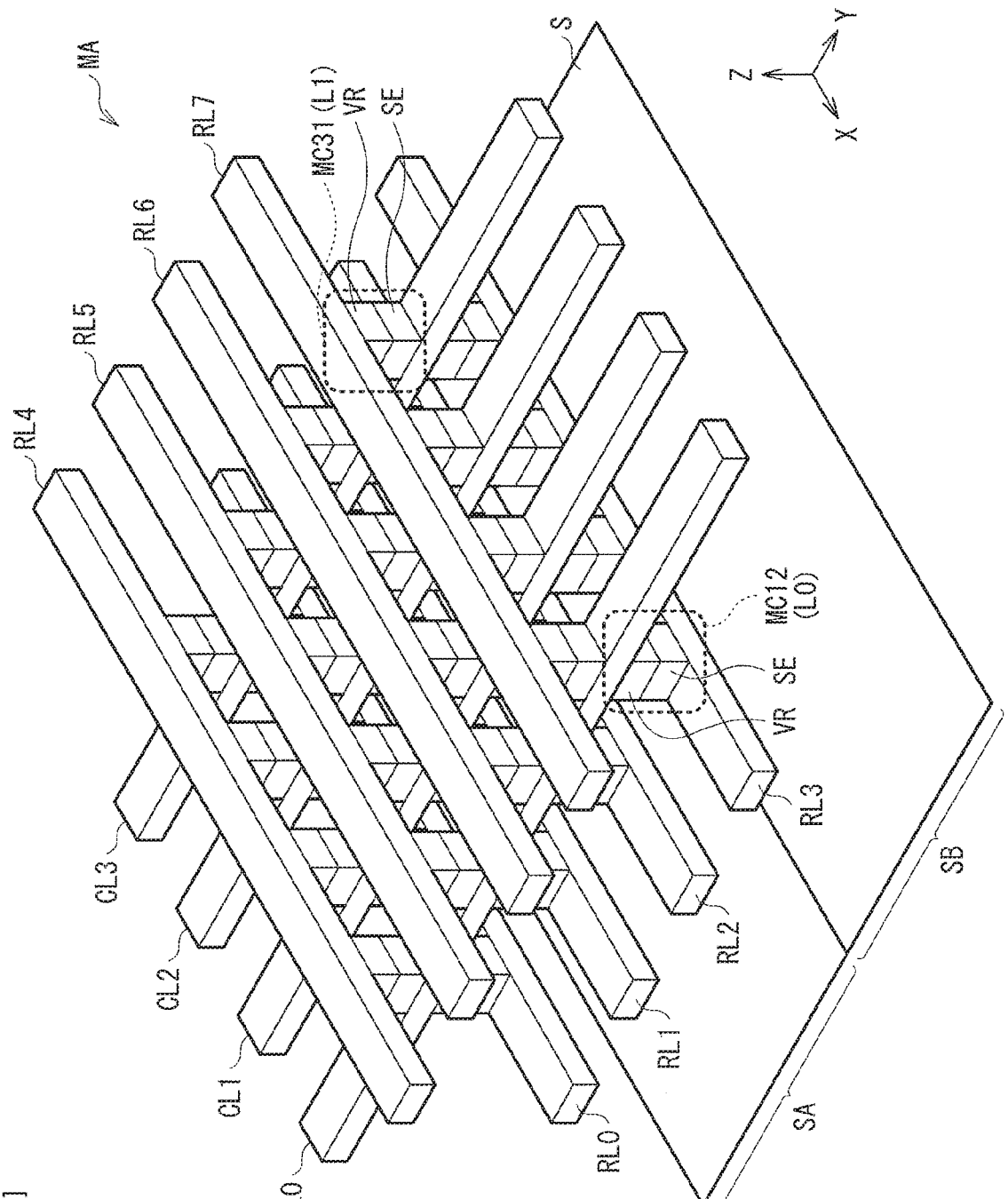
[FIG. 28]

[FIG. 29]
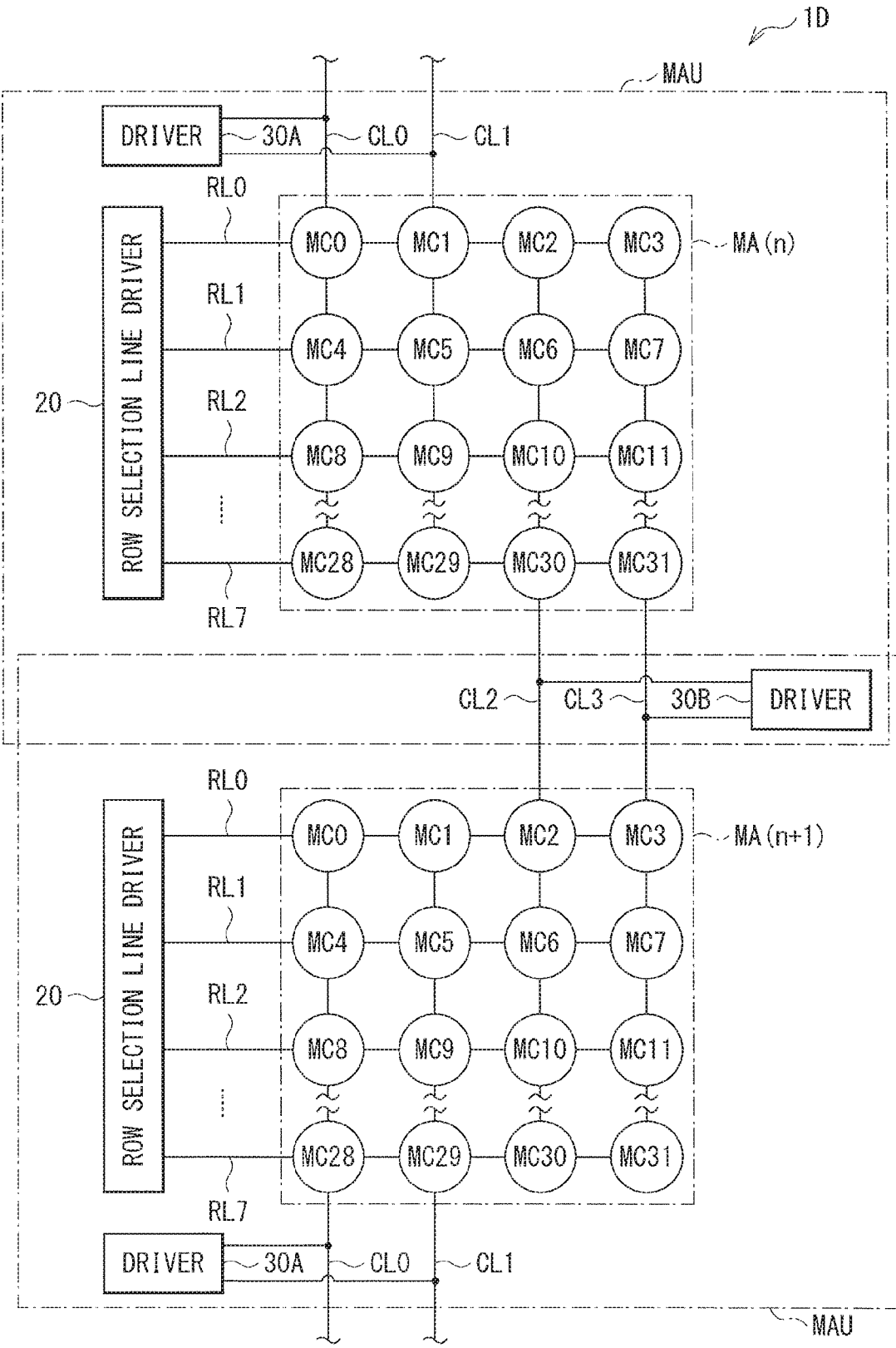

[ FIG. 30 ]
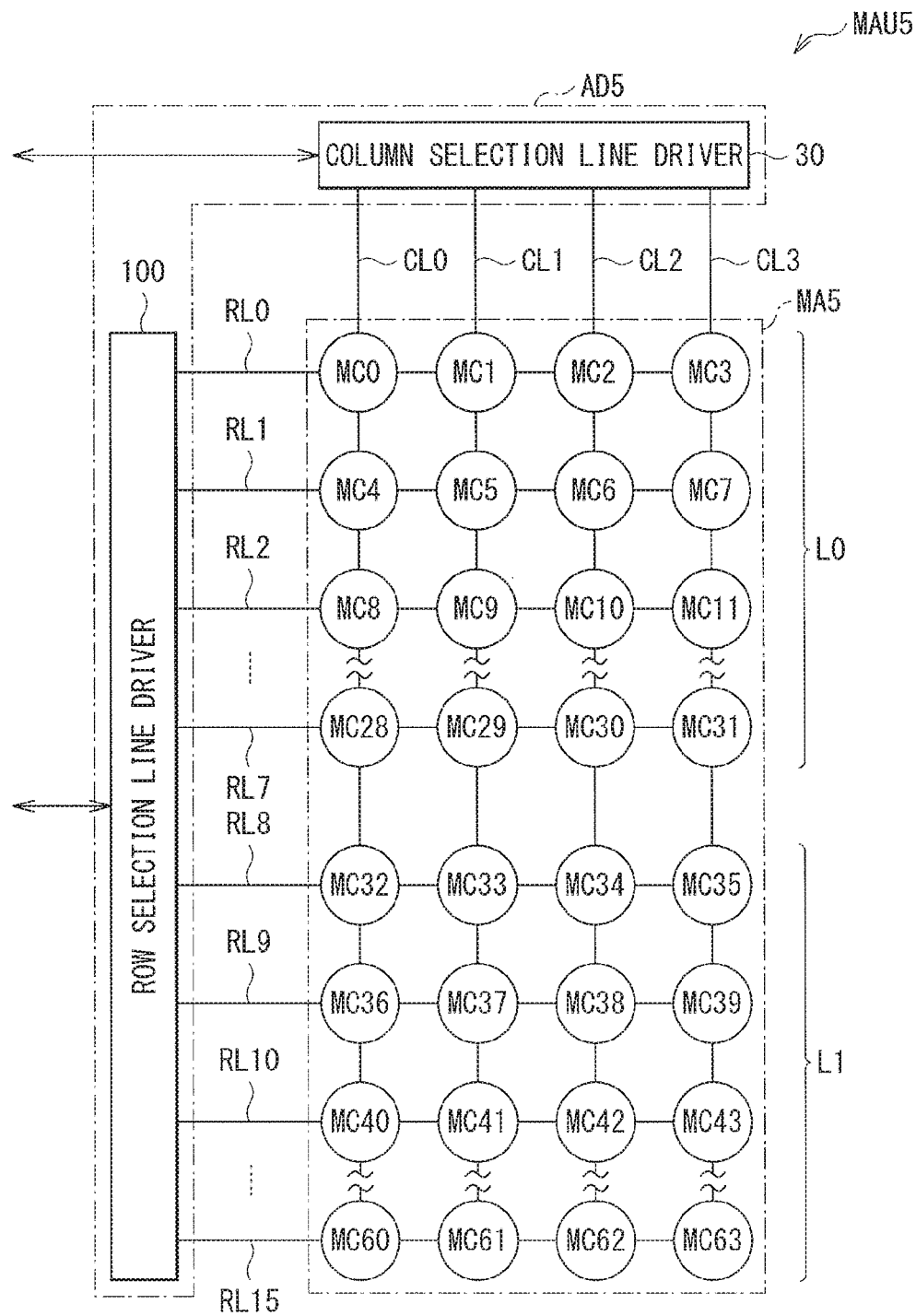

[FIG. 31A]
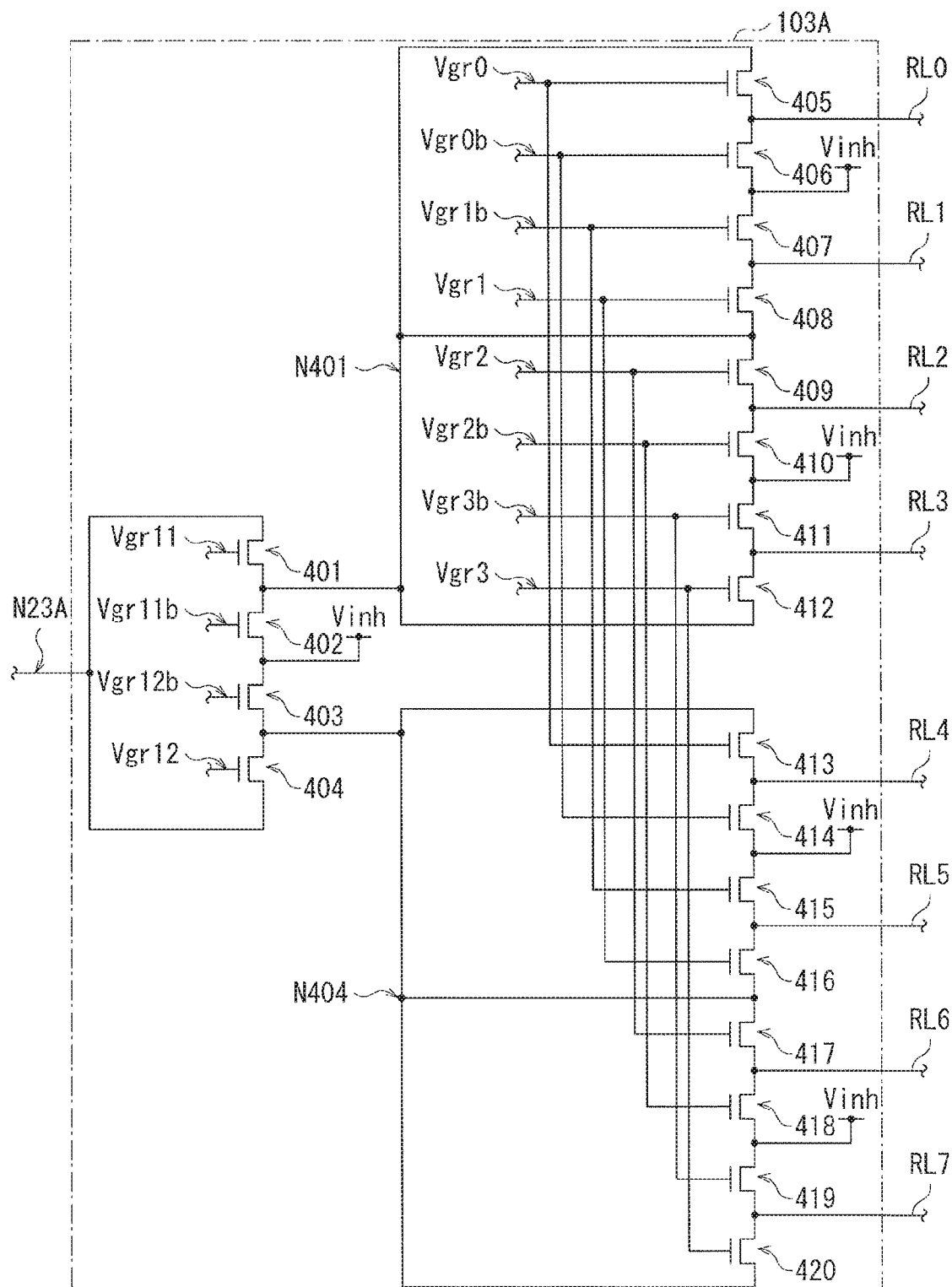

[FIG. 31B]
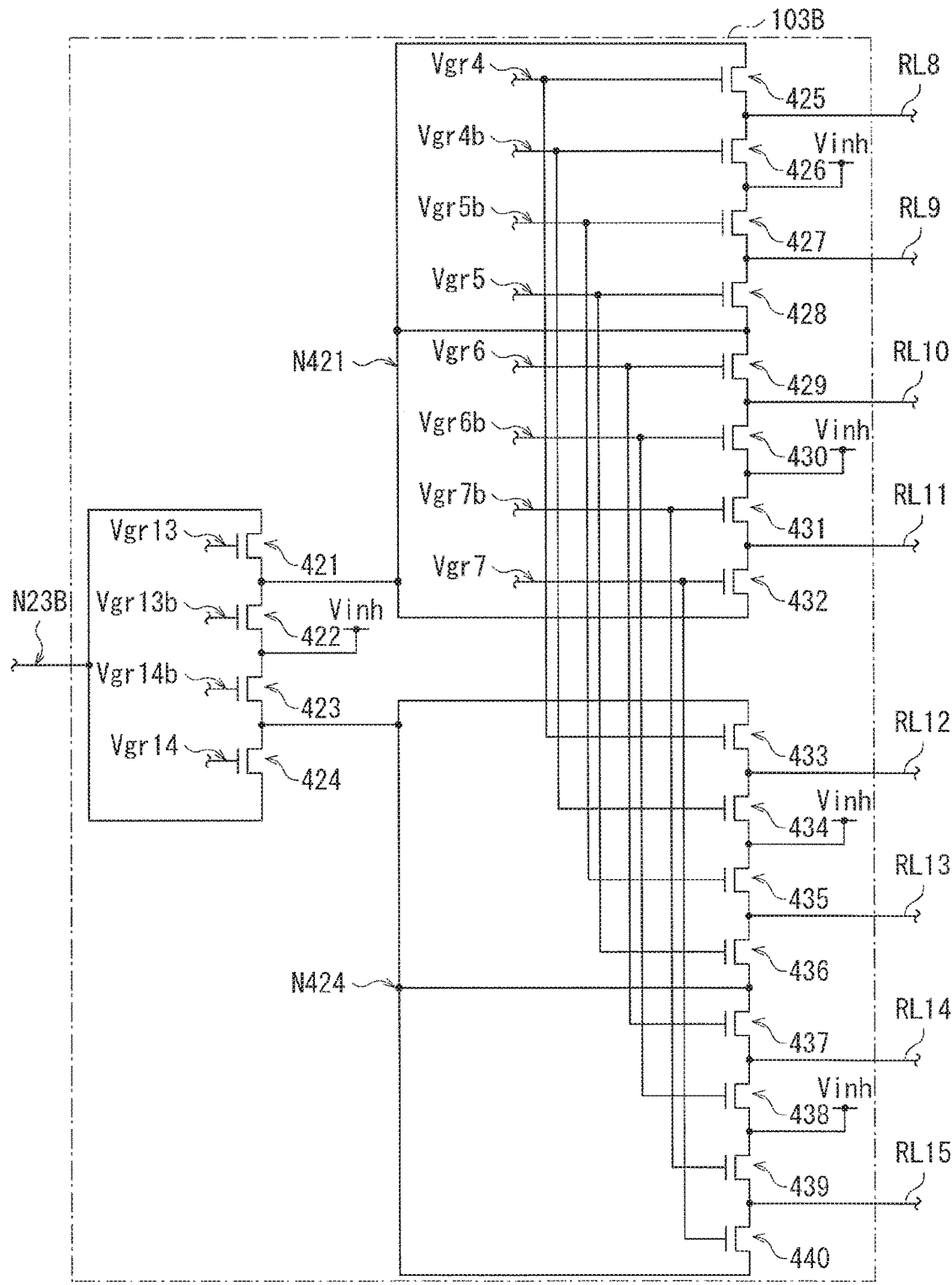

[FIG. 32]
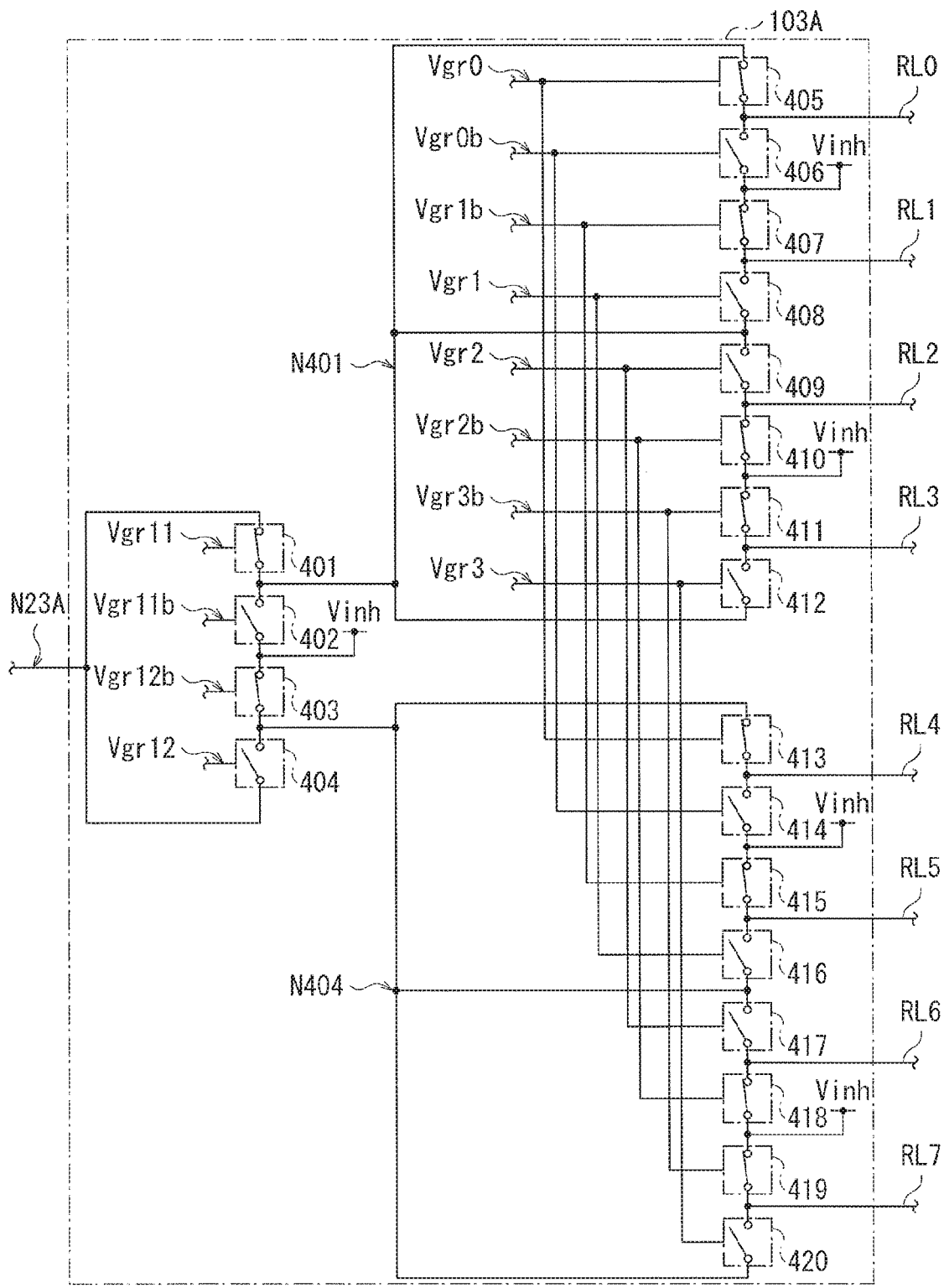

[FIG. 33]
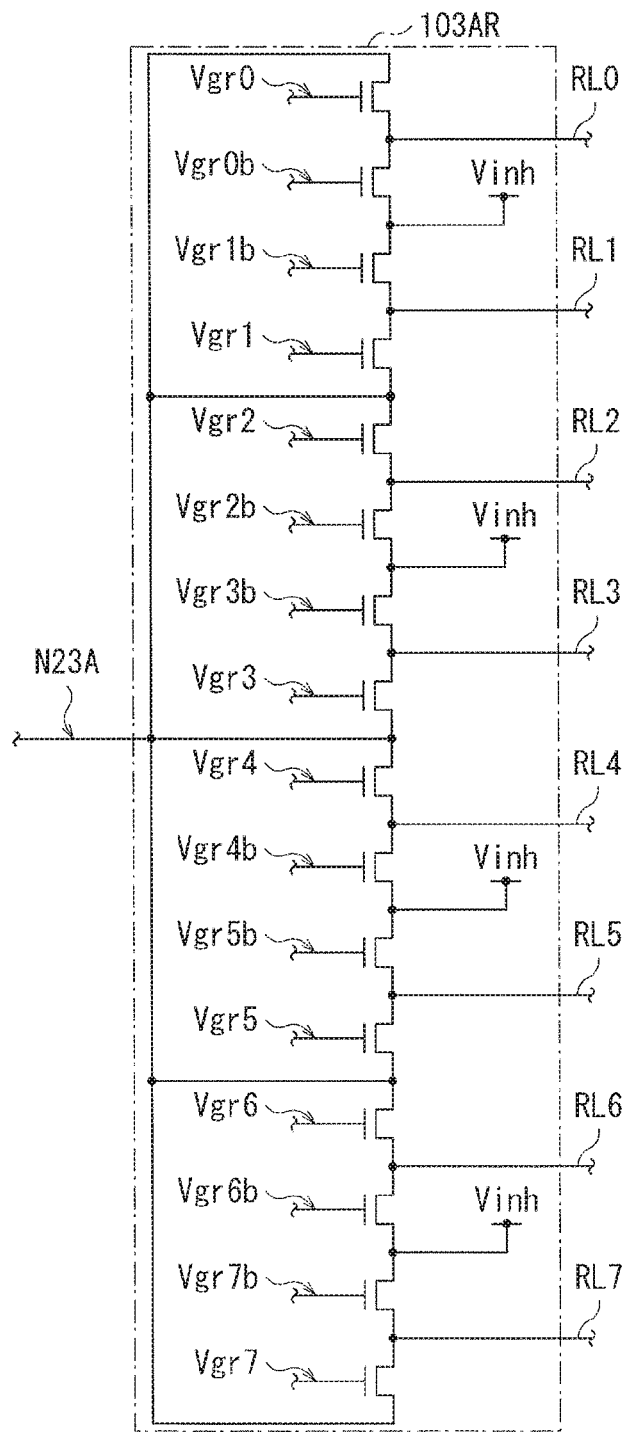

[FIG. 34]
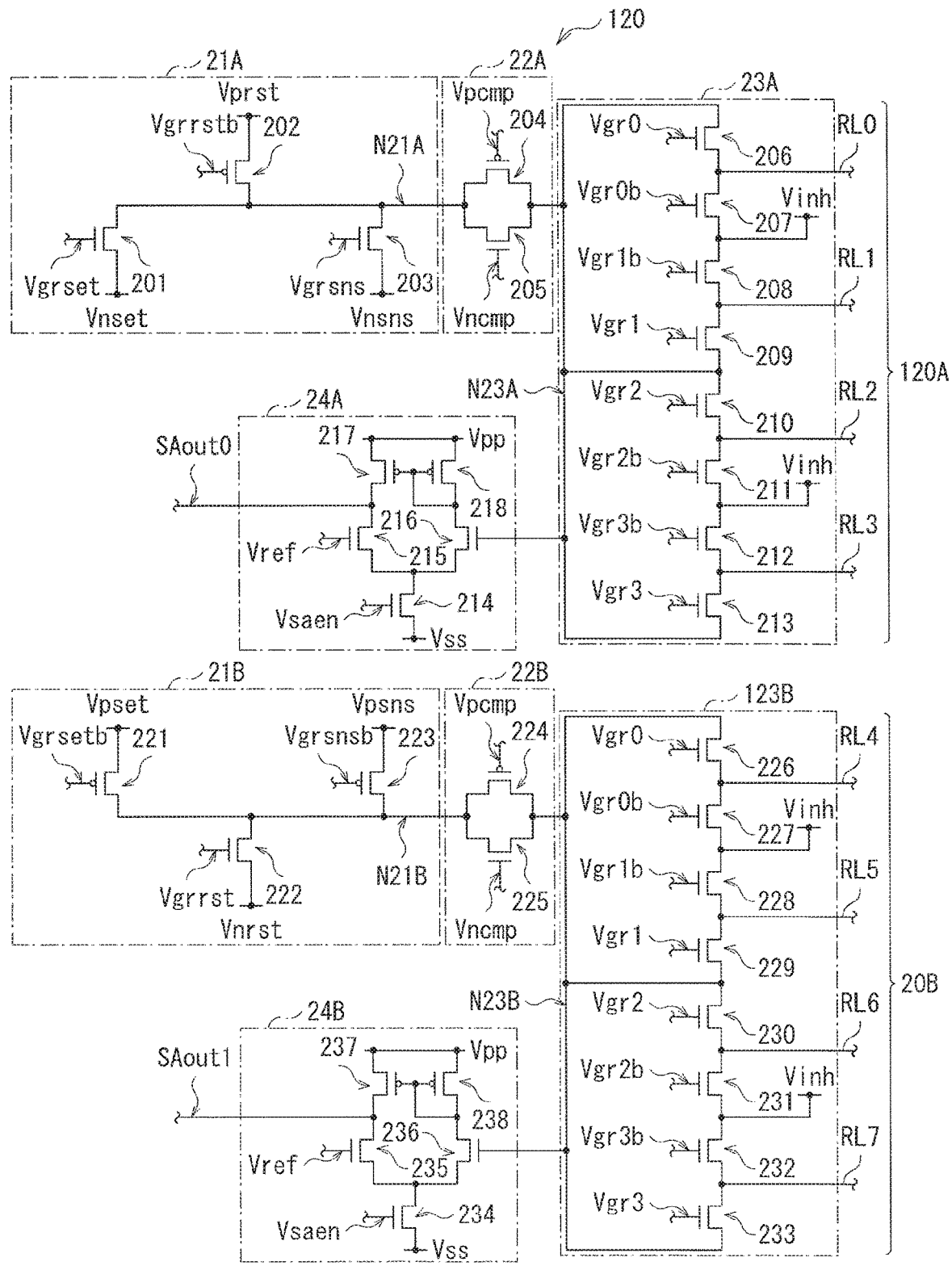

[FIG. 35]
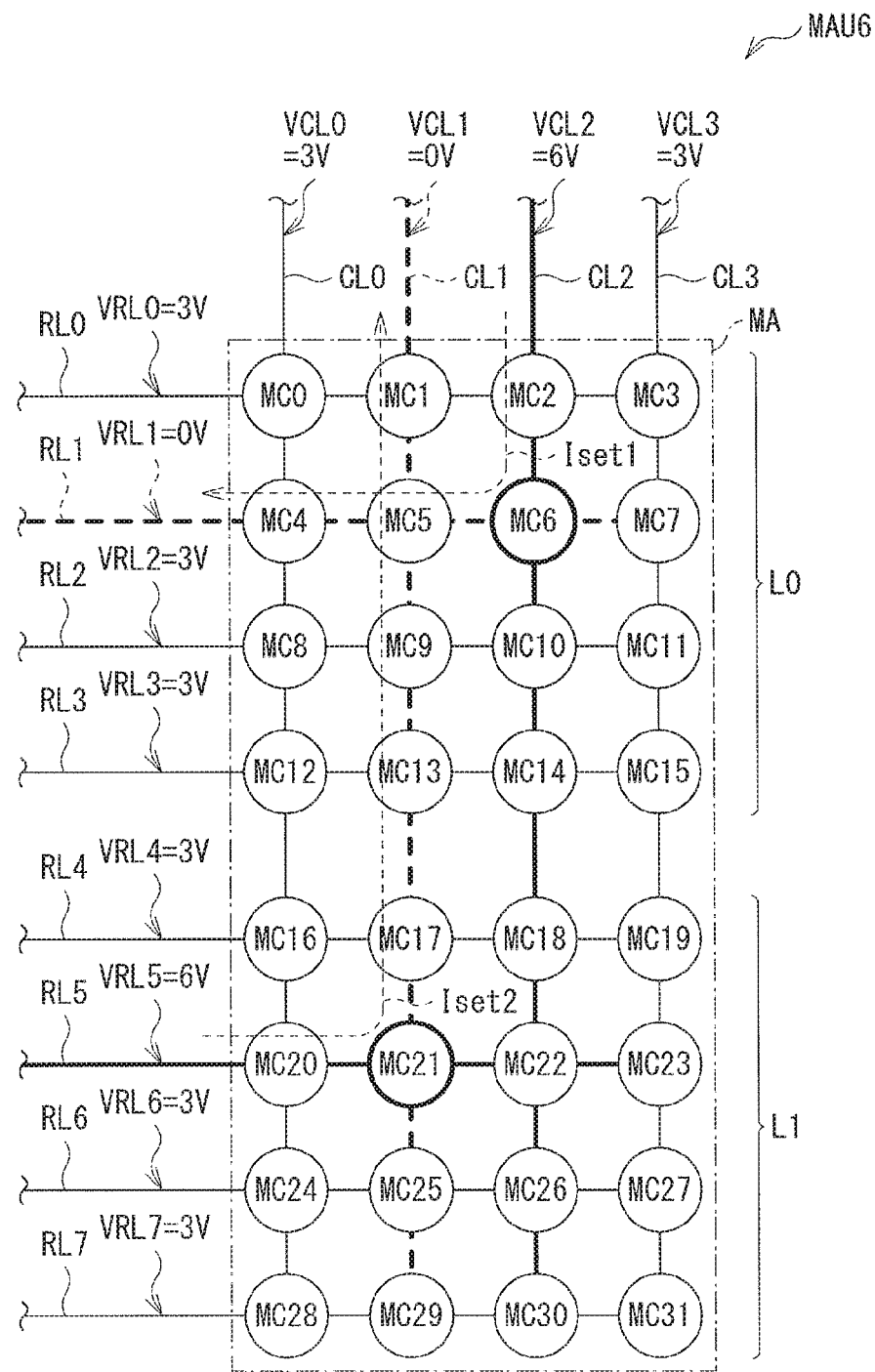

[FIG. 36]
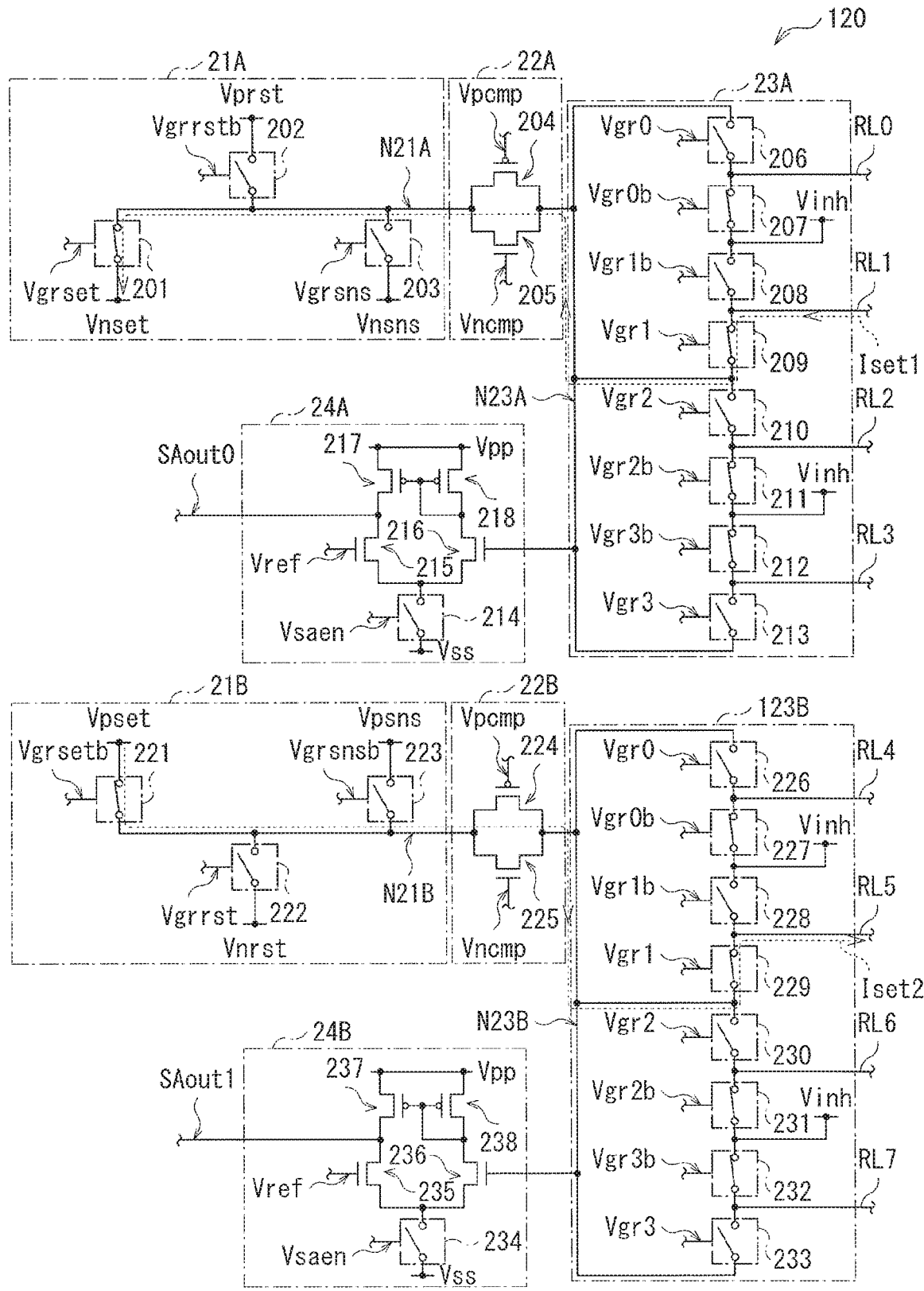

[FIG. 37]
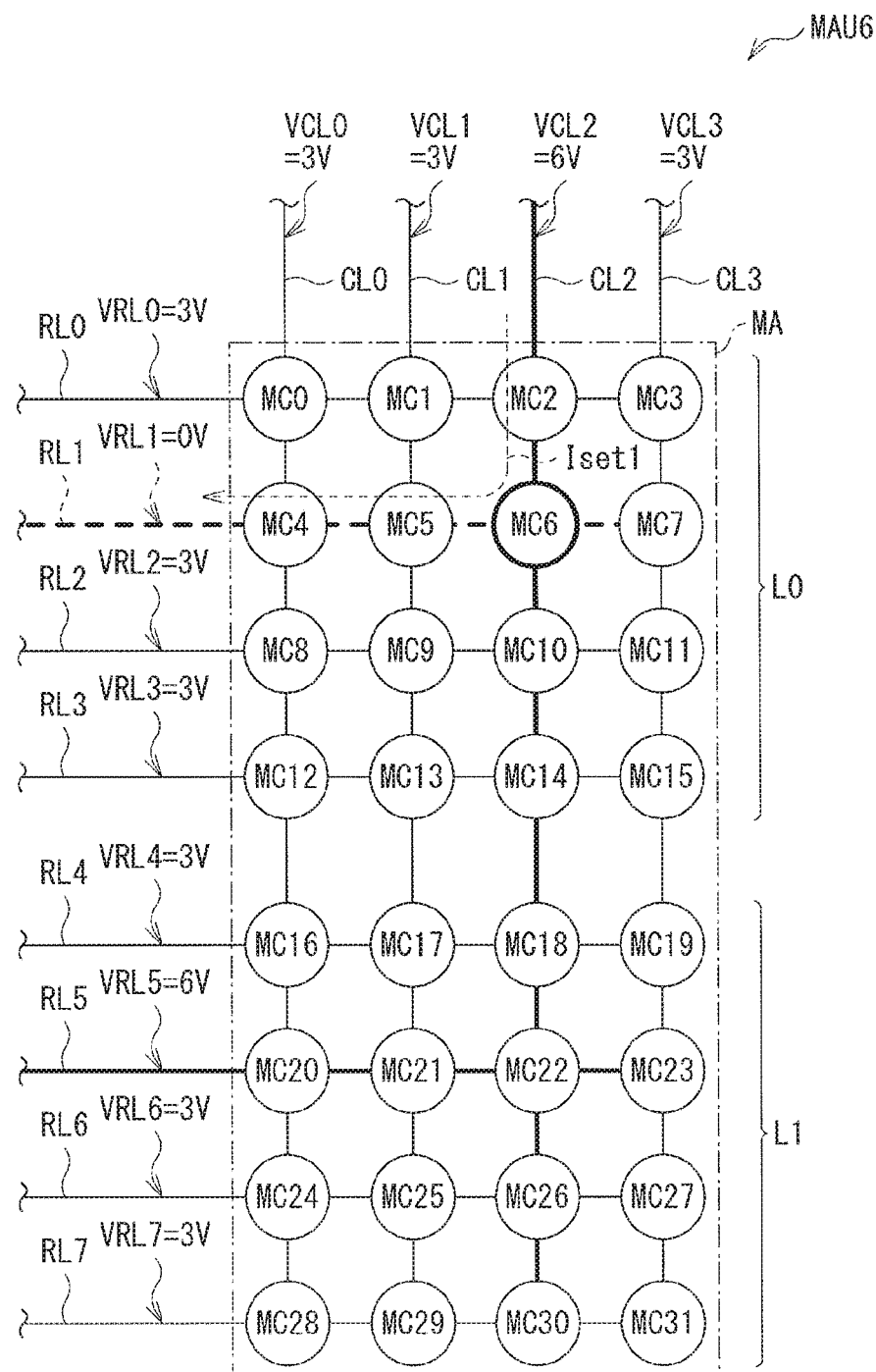

[FIG. 38]
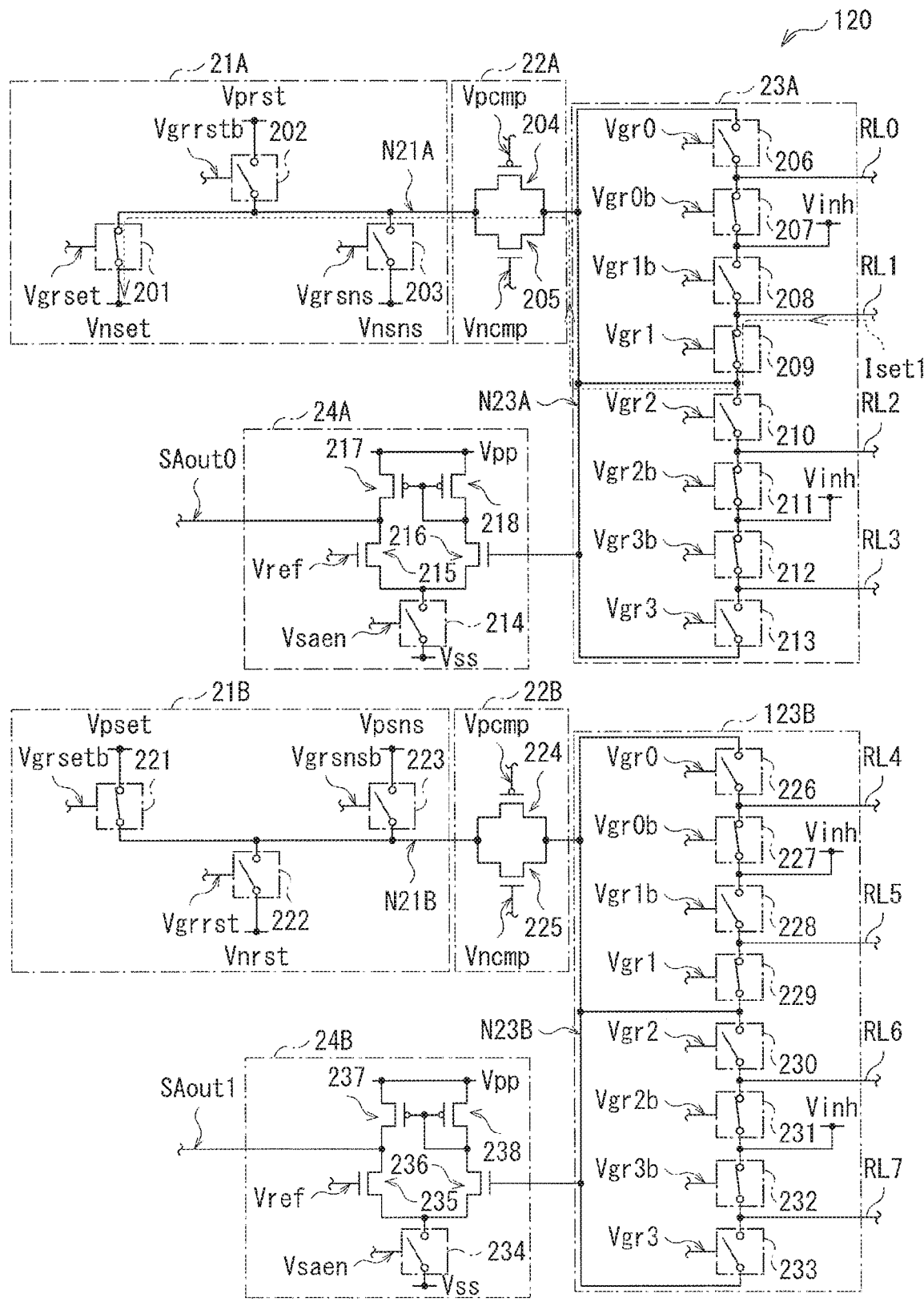

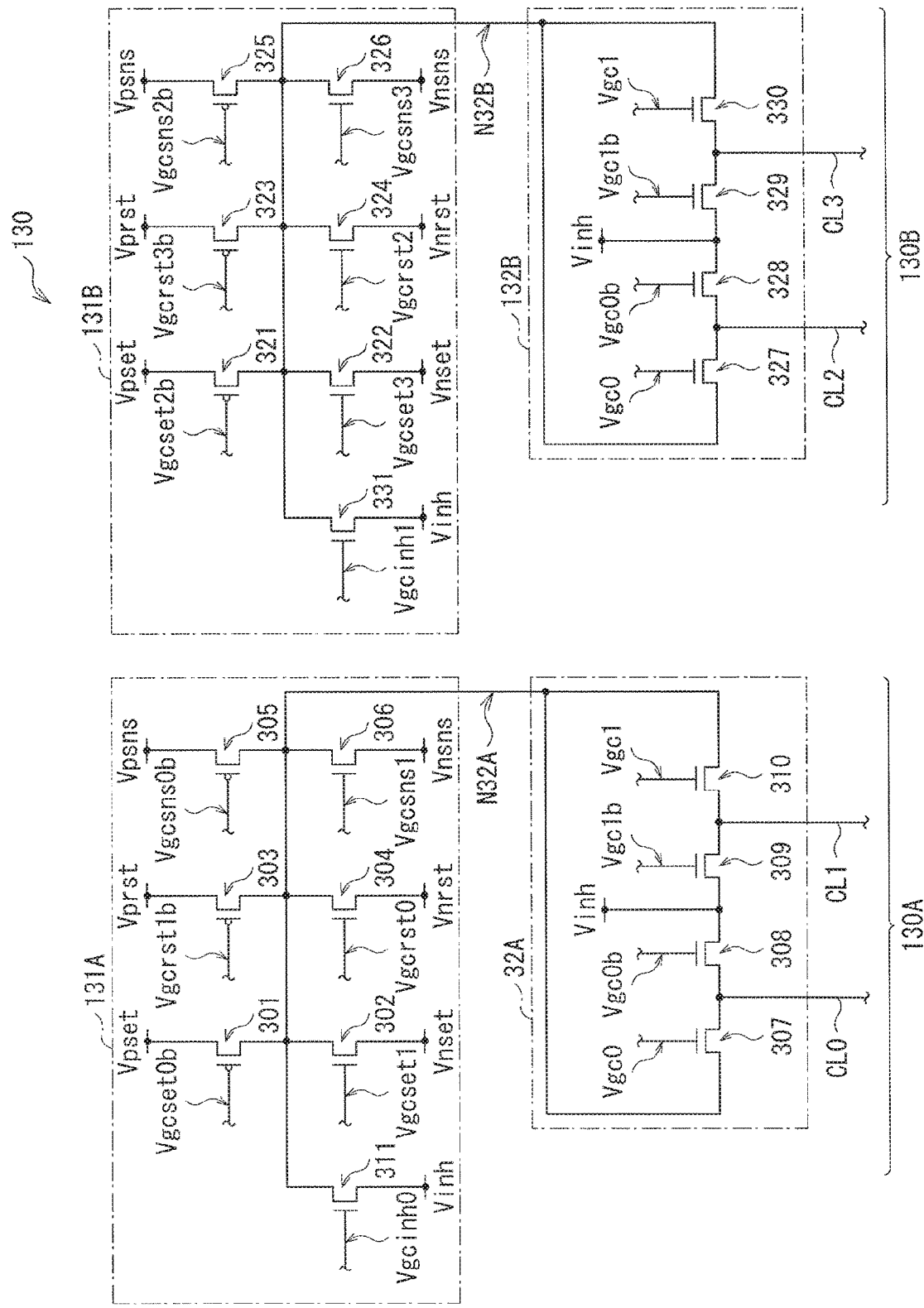
[FIG. 39]

[ FIG. 40 ]
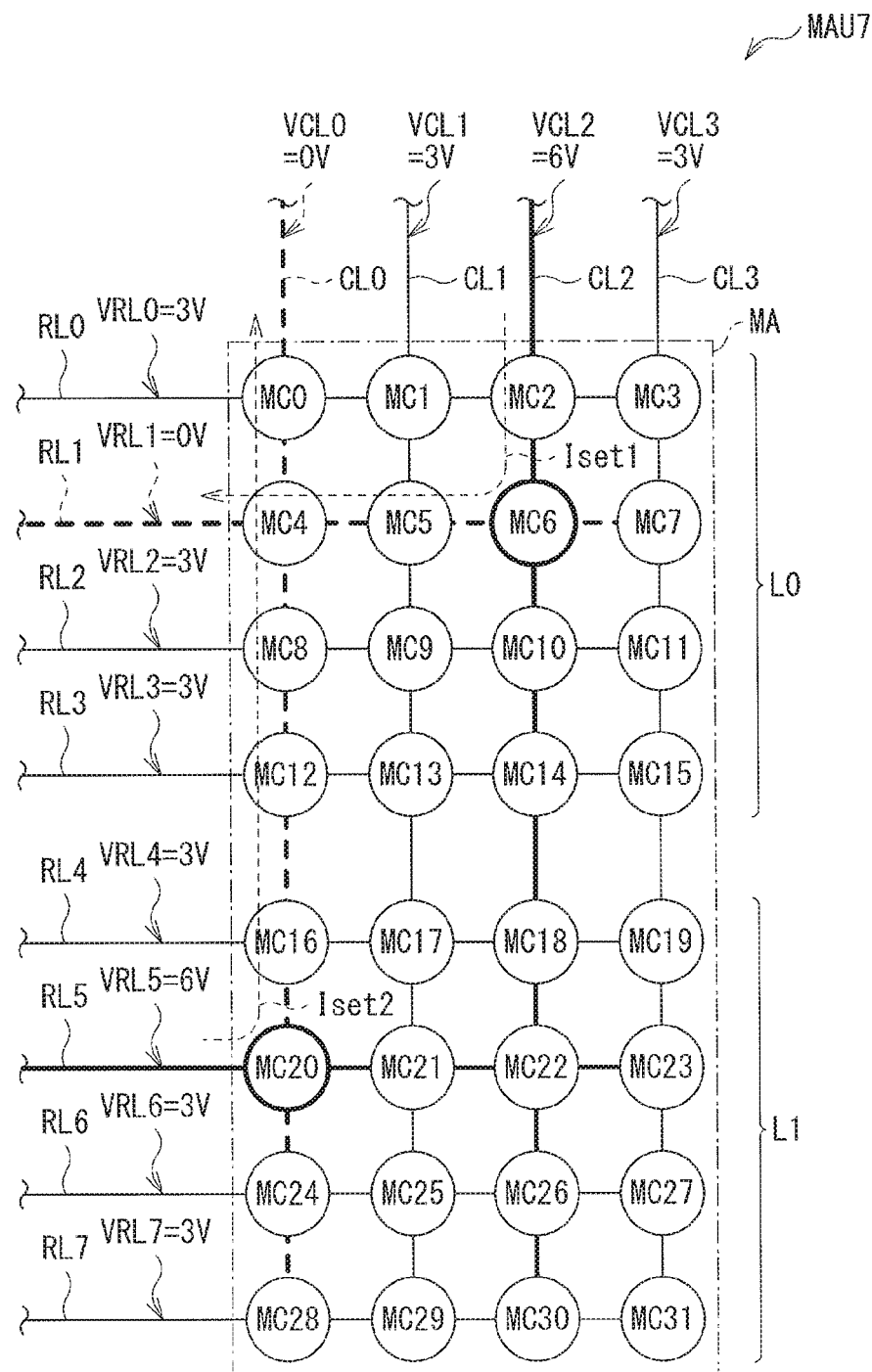

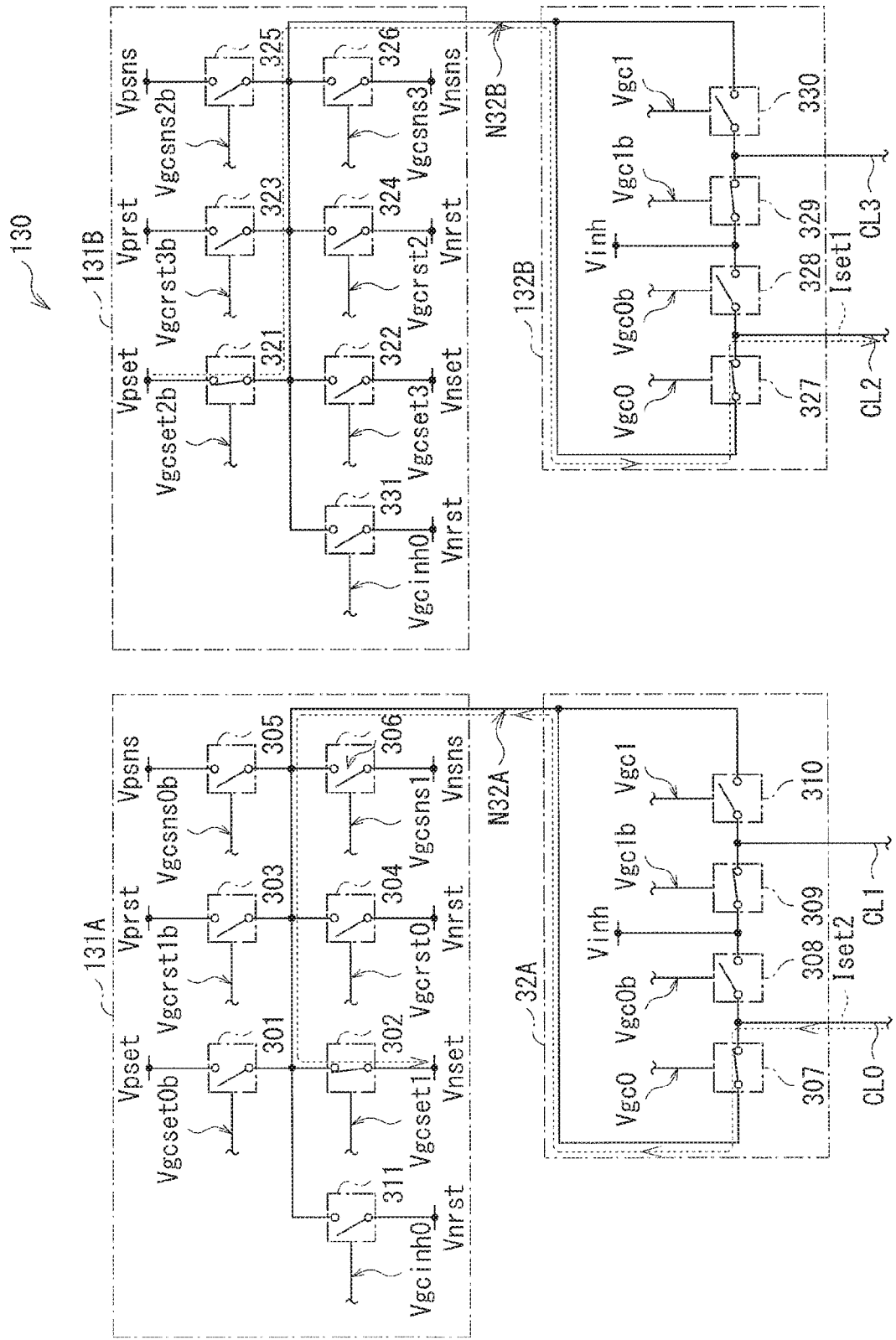
[FIG. 41]

[FIG. 42]
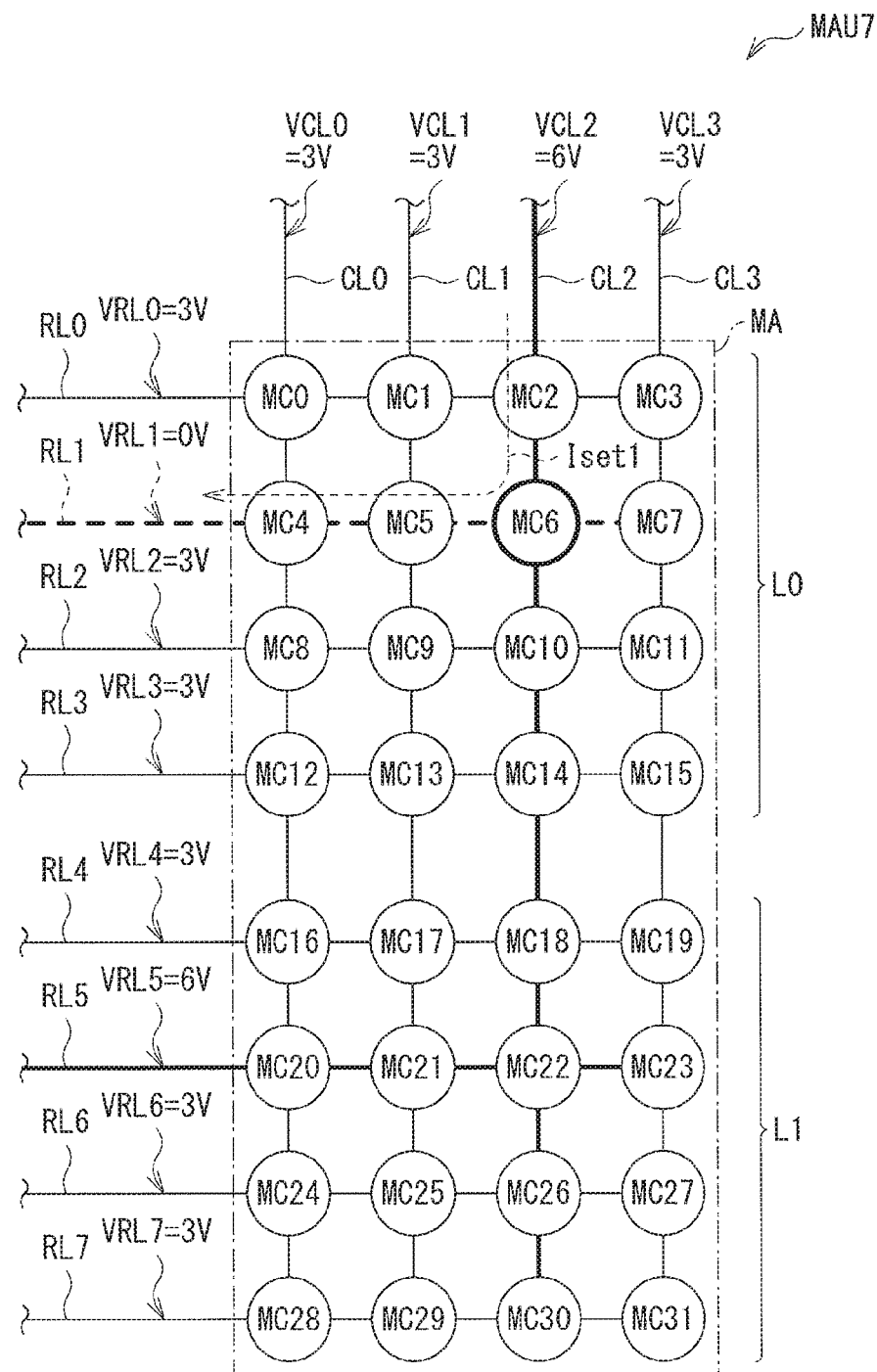

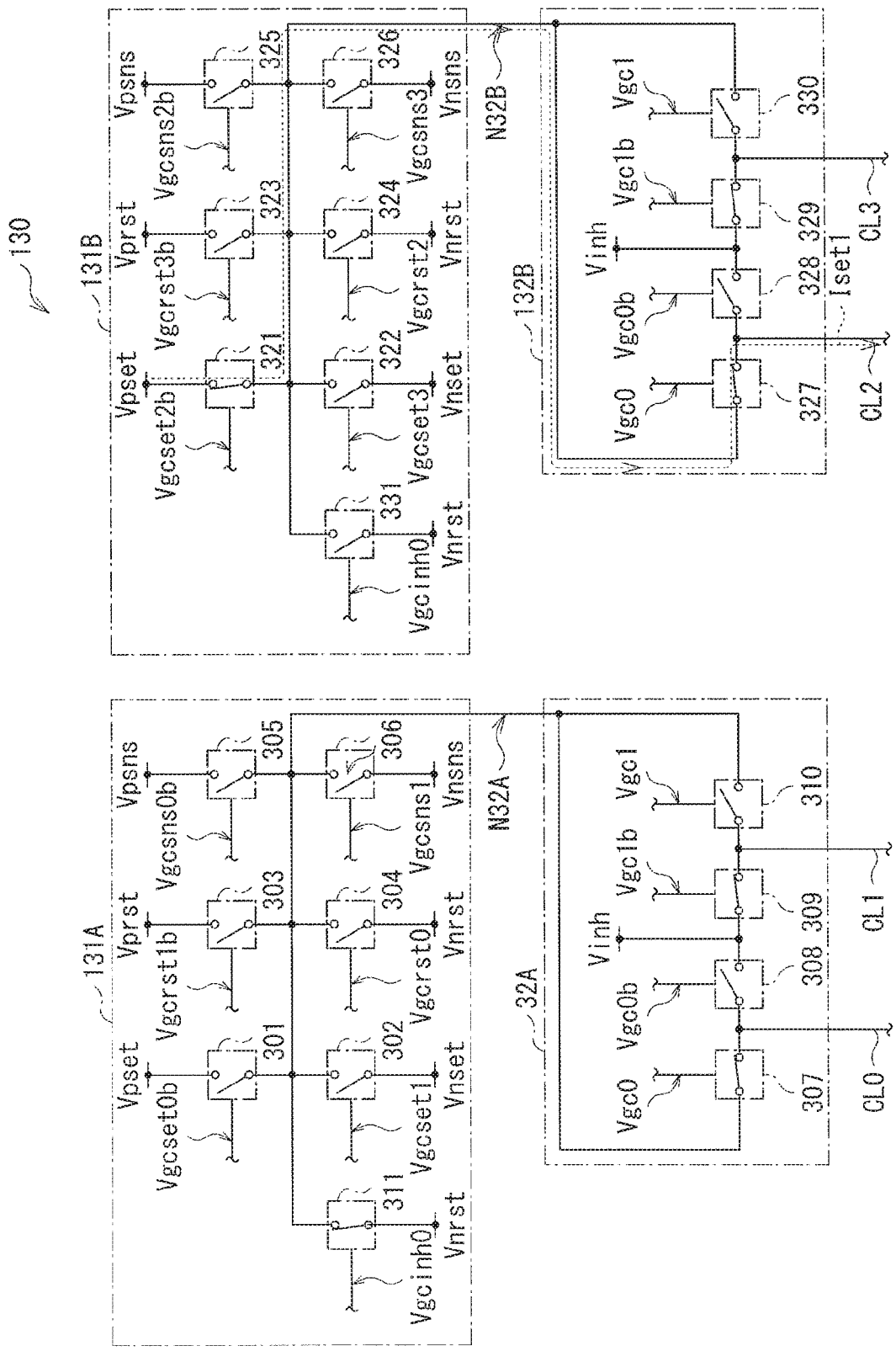
[FIG. 43]

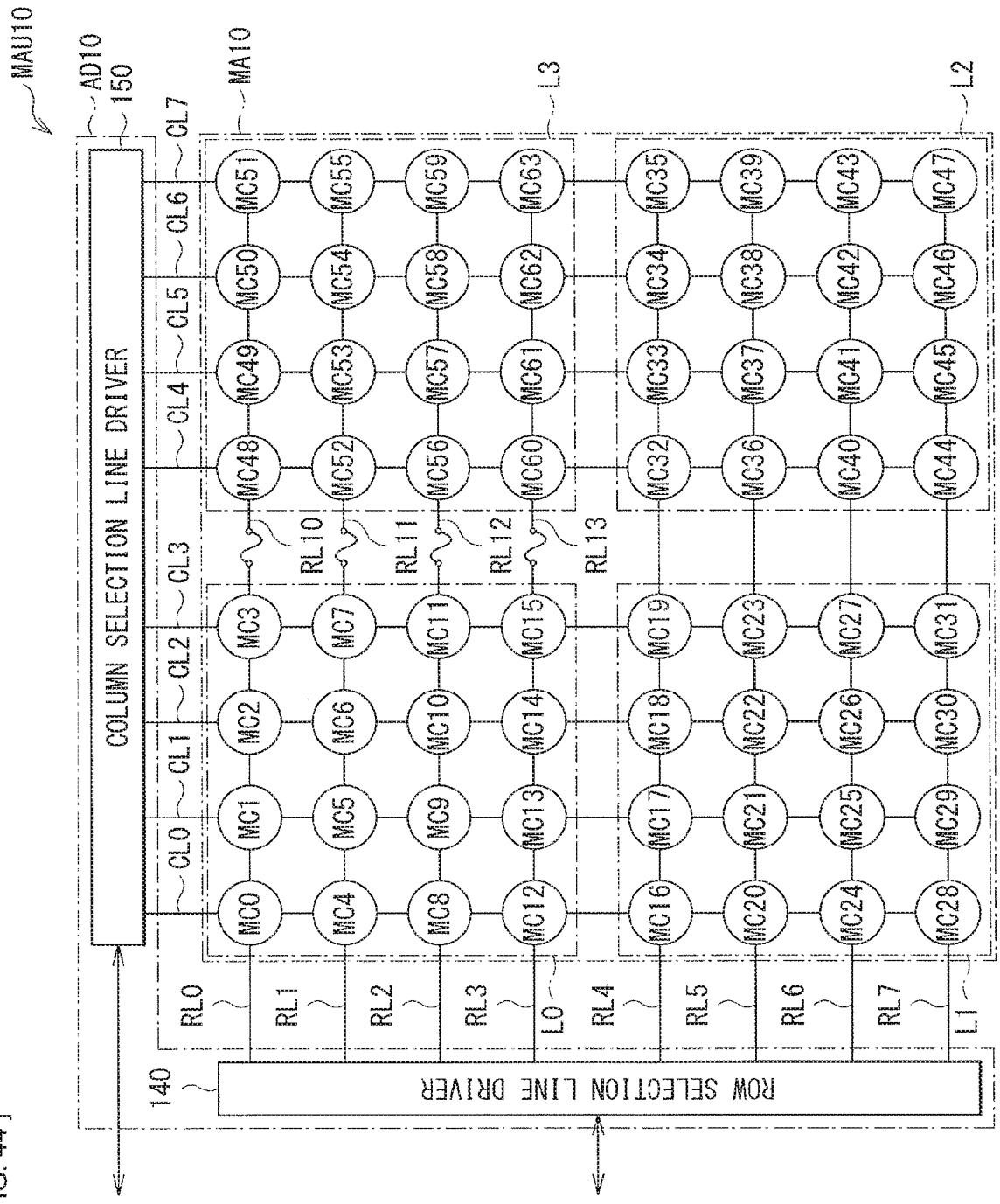
[FIG. 44]

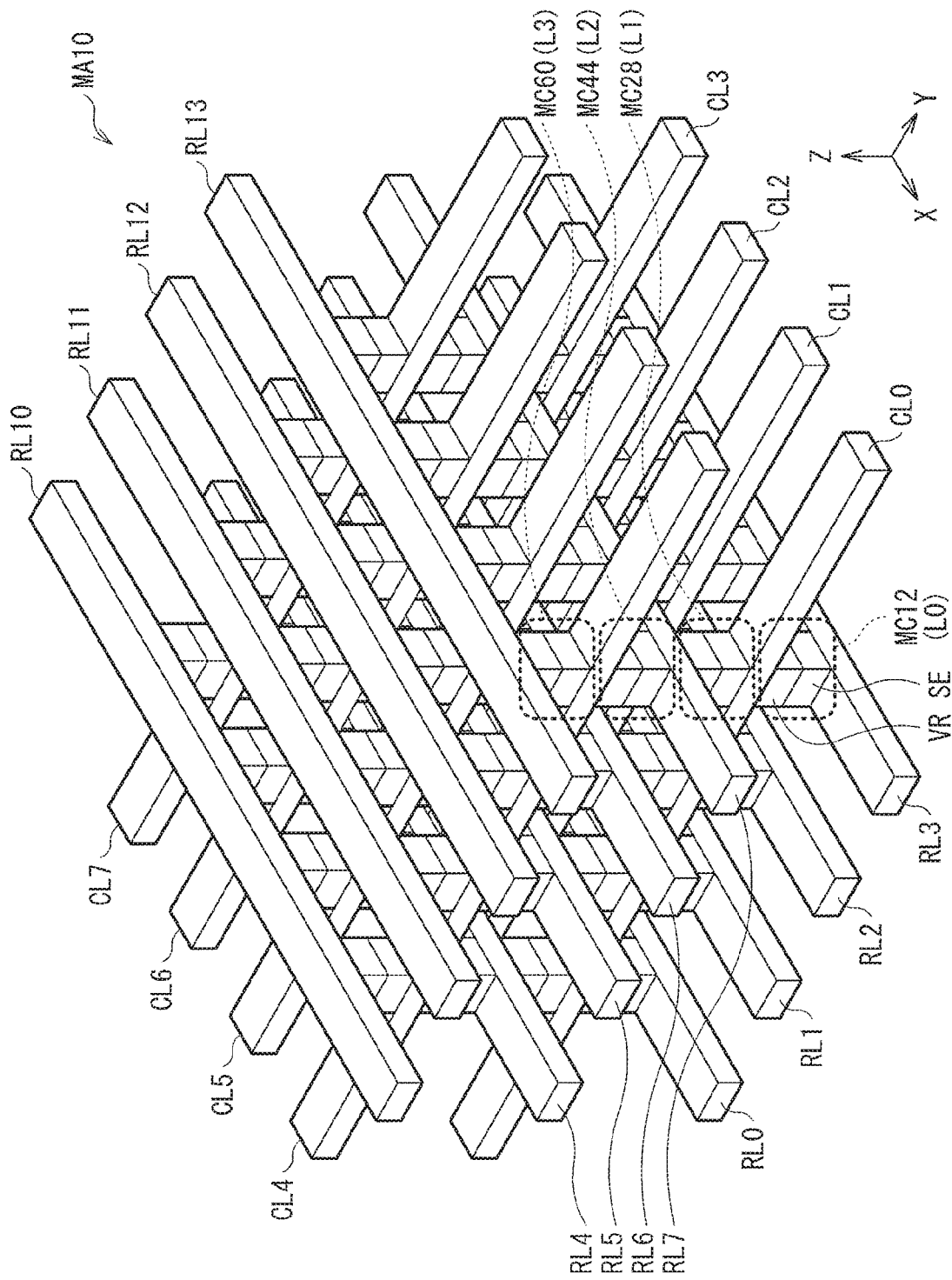
[FIG. 45]

[FIG. 46]
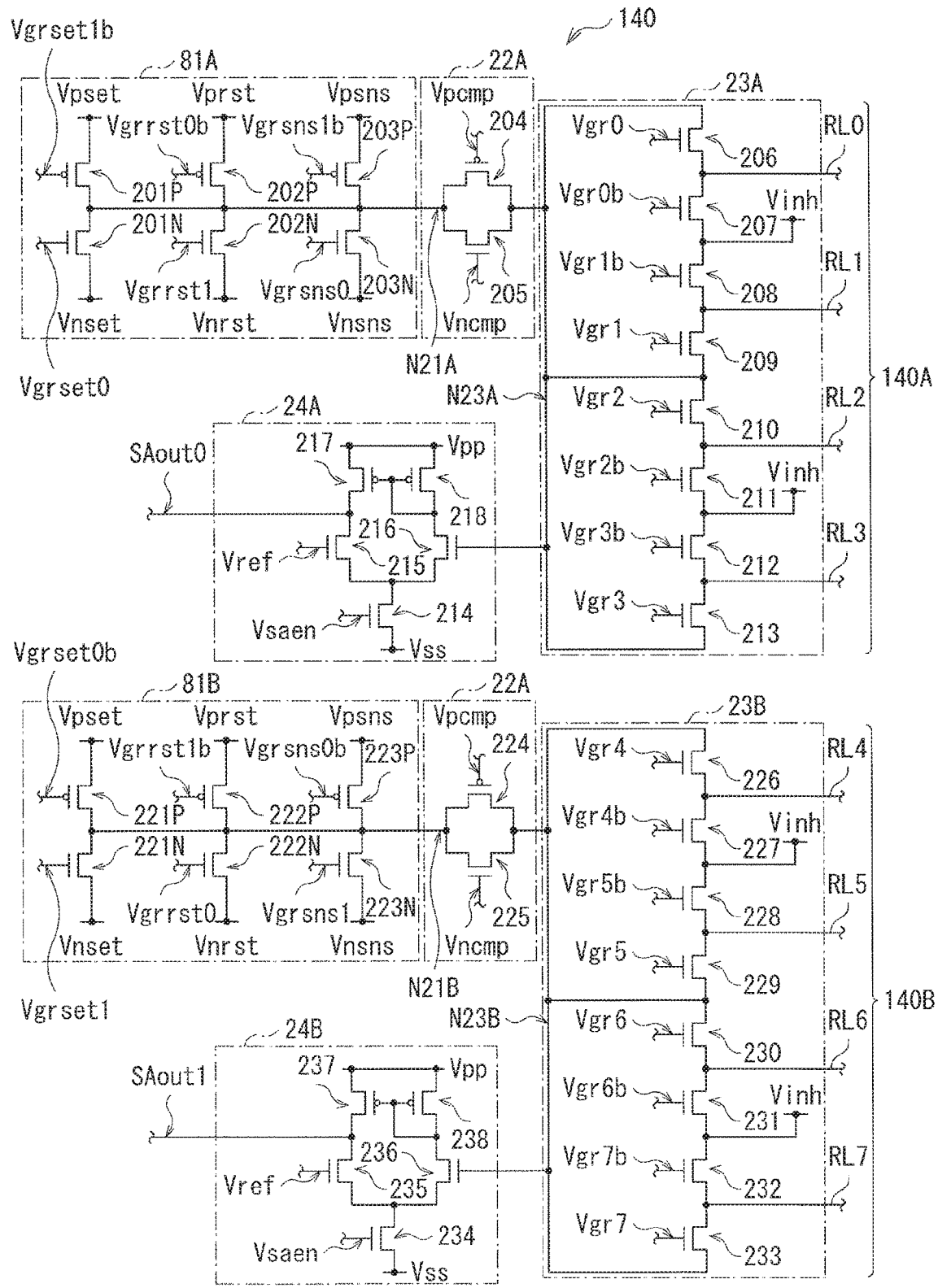

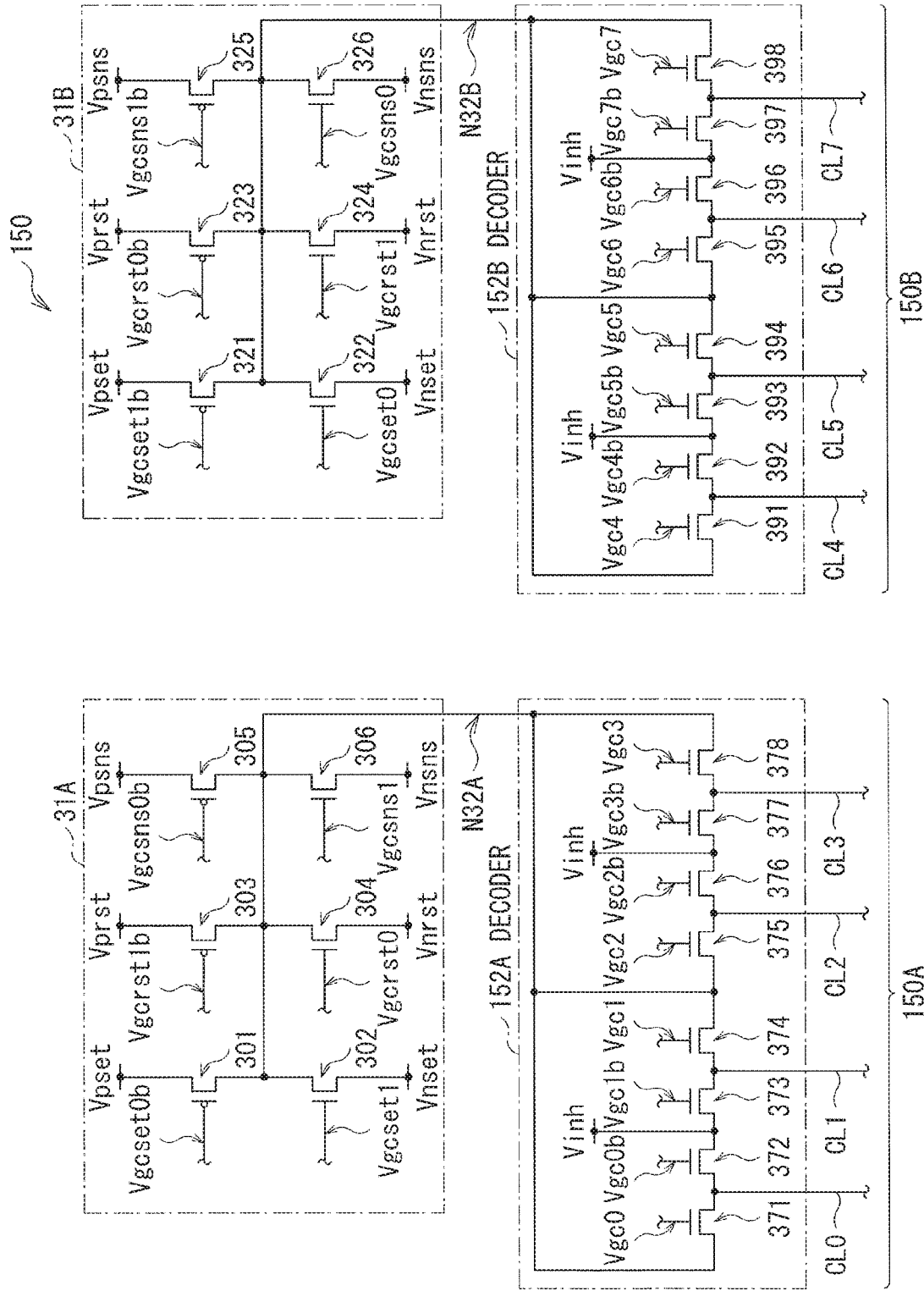
[FIG. 47]

[FIG. 48]
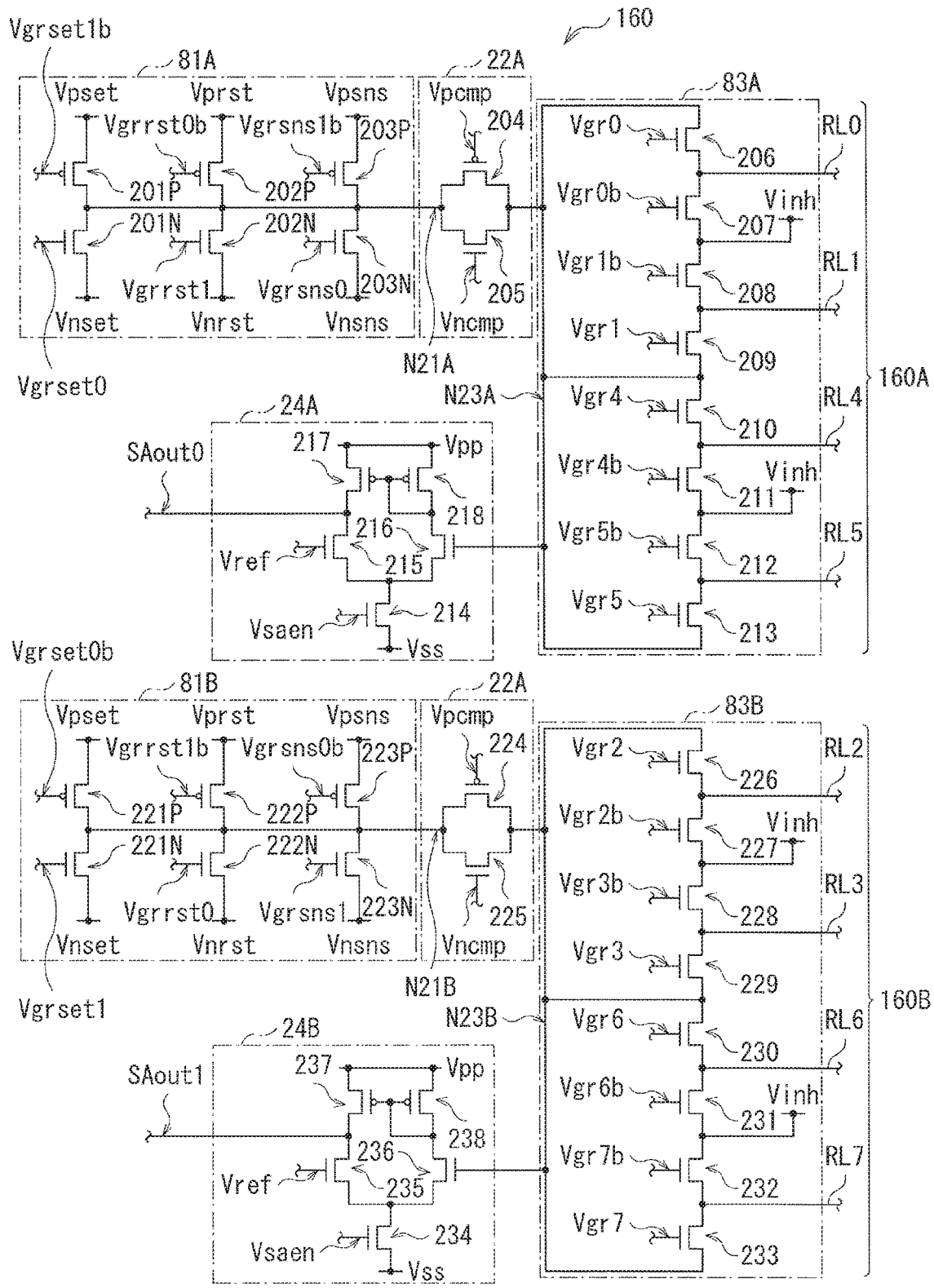

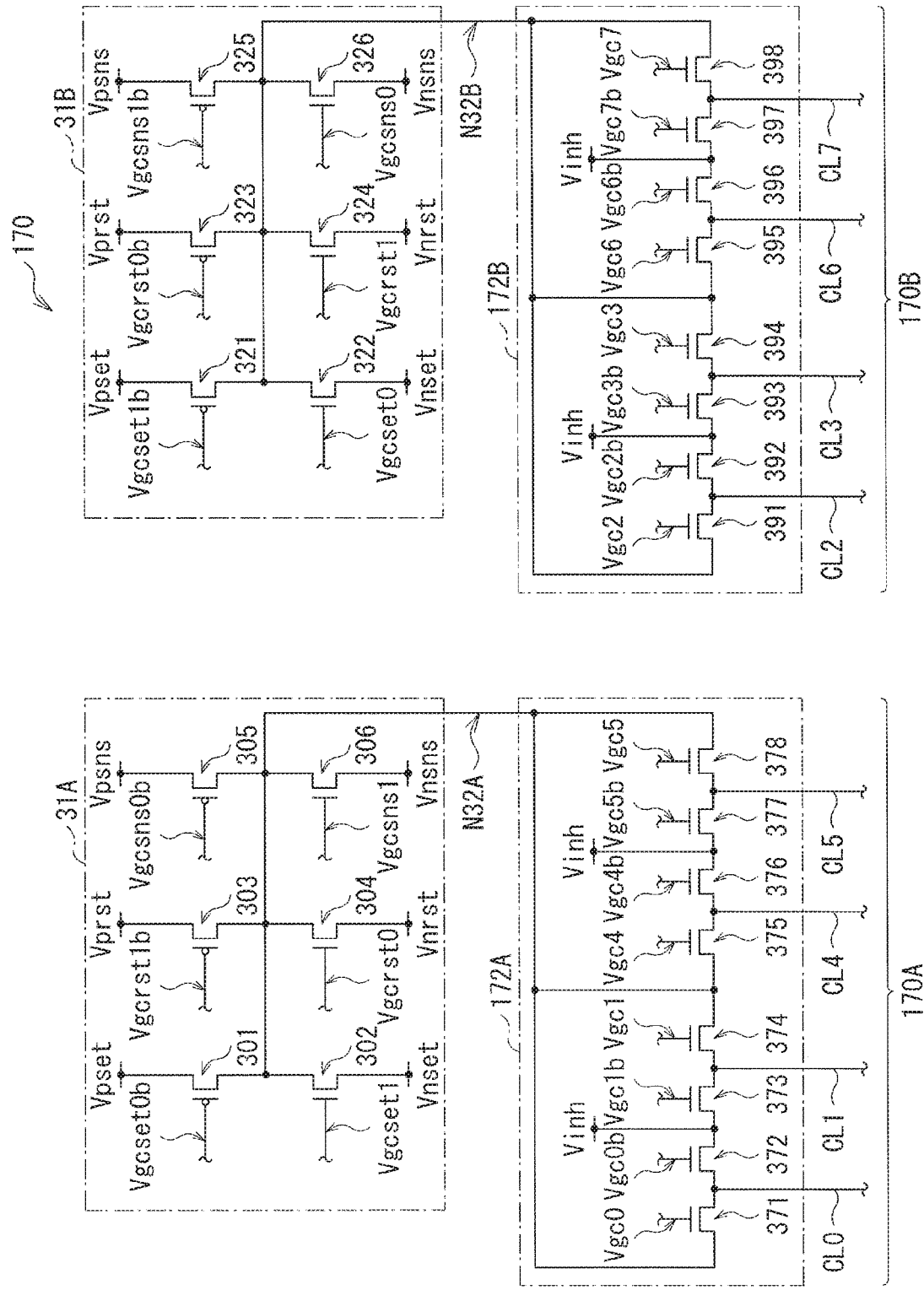
[FIG. 49]

STORAGE DEVICE AND CONTROL METHOD FOR CONTROLLING OPERATIONS OF THE STORAGE DEVICE

CROSS REFERENCE TO RELATED APPLICATIONS

This application is a U.S. National Phase of International Patent Application No. PCT/JP2017/040401 filed on Nov. 9, 2017, which claims priority benefit of Japanese Patent Application No. JP 2016-251416 filed in the Japan Patent Office on Dec. 26, 2016. Each of the above-referenced applications is hereby incorporated herein by reference in its entirety.

TECHNICAL FIELD

The present disclosure relates to a storage device that stores data and to a method of controlling such a storage device.

BACKGROUND ART

In recent years, for example, much focus has been placed on a nonvolatile memory device using a resistive random access memory that allows for performance of faster data access than a flash memory. For example, PTL1 discloses a storage device that writes the same data to a plurality of memory cells at the same time.

CITATION LIST

Patent Literature

PTL1: Japanese Unexamined Patent Application Publication No. 2006-323924.

SUMMARY OF THE INVENTION

Meanwhile, in the storage device, for example, high reliability is desired for a data write operation and a data read operation, and further improvement of reliability is expected.

It is desirable to provide a storage device and a control method that make it possible to increase reliability.

A storage device according to an embodiment of the present disclosure includes a first storage section, a first selection line driver, and a second selection line driver. The first storage section includes a plurality of first wiring lines extending in a first direction and including a plurality of first selection lines and a plurality of second selection lines, a plurality of second wiring lines extending in a second direction that intersects with the first direction and including a plurality of third selection lines and a plurality of fourth selection lines, and a plurality of first memory cells each being inserted between a corresponding one of the plurality of first wiring lines and a corresponding one of the plurality of second wiring lines. The first selection line driver applies, to one or more selection lines of the plurality of first selection lines, a first voltage that is one of a first selection voltage and a second selection voltage, and applies, to one or more selection lines of the plurality of second selection lines, a second voltage that is one of the first selection voltage and the second selection voltage and is different from the first voltage. The second selection line driver applies, to one or more selection lines of the plurality of third selection lines, a third voltage that is one of the first selection voltage and the second selection voltage, and applies, to one or more selection lines of the plurality of fourth selection lines, a fourth voltage that is one of the first selection voltage and the second selection voltage and is different from the third voltage.

A control method according to an embodiment of the present disclosure includes: with respect to a first storage section that includes a plurality of first wiring lines, a plurality of second wiring lines, and a plurality of first memory cells, the plurality of first wiring lines extending in a first direction and including a plurality of first selection lines and a plurality of second selection lines, the plurality of second wiring lines extending in a second direction that intersects with the first direction and including a plurality of third selection lines and a plurality of fourth selection lines, and the plurality of first memory cells each being inserted between a corresponding one of the plurality of first wiring lines and a corresponding one of the plurality of second wiring lines, applying a first voltage to one or more selection lines of the plurality of first selection lines while applying a second voltage to one or more selection lines of the plurality of second selection lines, the first voltage being one of a first selection voltage and a second selection voltage, and the second voltage being one of the first selection voltage and the selection voltage and being different from the first voltage; and applying a third voltage to one or more selection lines of the plurality of third selection lines while applying a fourth voltage to one or more selection lines of the plurality of fourth selection lines, the third voltage being one of the first selection voltage and the second selection voltage, and the fourth voltage being one of the first selection voltage and the second selection voltage and being different from the third voltage.

In the storage device and the control method according to the embodiments of the present disclosure, the first voltage is applied to the one or more selection lines of the plurality of first selection lines in the first storage section, and the second voltage is applied to the one or more selection lines of the plurality of second selection lines. In addition, the third voltage is applied to the one or more selection lines of the plurality of third selection lines, and the fourth voltage is applied to the one or more selection lines of the plurality of fourth selection lines. The first voltage is set to one voltage of the first selection voltage and the second selection voltage, and the second voltage is set to a voltage different from the first voltage of the first selection voltage and the second selection voltage. Likewise, the third voltage is set to one voltage of the first selection voltage and the second selection voltage, and the fourth voltage is set to a voltage different from the third voltage of the first selection voltage and the second selection voltage.

According to the storage device and the control method in the embodiments of the present disclosure, the first voltage is applied to the one or more selection lines of the plurality of first selection lines while the second voltage that is different from the first voltage is applied to the one or more selection lines of the plurality of second selection lines, and the third voltage is applied to the one or more selection lines of the plurality of third selection lines while the fourth voltage that is different from the third voltage is applied to the one or more selection lines of the plurality of fourth selection lines, thus making it possible to increase reliability. It is to be noted that the effects described here are not necessarily limitative, and may have any of the effects described in the present disclosure.

BRIEF DESCRIPTION OF DRAWINGS

FIG. 1 is a block diagram that illustrates a configuration example of a storage device according to an embodiment of the present disclosure.

FIG. 2 is a configuration diagram that illustrates a configuration example of a memory array unit according to a first embodiment.

FIG. 3 is a perspective view that illustrates a configuration example of a memory array illustrated in FIG. 2.

FIG. 4 is a circuit diagram that illustrates a configuration example of a memory cell illustrated in FIG. 2.

FIG. 5 is a characteristic diagram that illustrates a characteristic example of a storage element illustrated in FIG. 4.

FIG. 6 is a circuit diagram that illustrates a configuration example of a row selection line driver illustrated in FIG. 2.

FIG. 7 is a circuit diagram that illustrates a configuration example of a column selection line driver illustrated in FIG. 2.

FIG. 8 describes an example of a set operation in the memory array unit illustrated in FIG. 2.

FIG. 9A describes an example of the set operation in the row selection line driver illustrated in FIG. 6.

FIG. 9B describes an example of the set operation in the column selection line driver illustrated in FIG. 7.

FIG. 10 describes an example of a reset operation in the memory array unit illustrated in FIG. 2.

FIG. 11A describes an example of the reset operation in the row selection line driver illustrated in FIG. 6.

FIG. 11B describes an example of the reset operation in the column selection line driver illustrated in FIG. 7.

FIG. 12 describes an example of a sense operation in the memory array unit illustrated in FIG. 2.

FIG. 13A describes an example of the sense operation in the row selection line driver illustrated in FIG. 6.

FIG. 13B describes an example of the sense operation in the column selection line driver illustrated in FIG. 7.

FIG. 14 is a circuit diagram that illustrates a configuration example of a row selection line driver according to a comparative example.

FIG. 15 is a circuit diagram that illustrates a configuration example of a column selection line driver according to the comparative example.

FIG. 16 describes an example of a set operation in a memory array unit according to the comparative example.

FIG. 17 describes another operation example of the set operation in the memory array unit illustrated in FIG. 2.

FIG. 18A describes another operation example of the set operation in the row selection line driver illustrated in FIG. 6.

FIG. 18B describes another operation example of the set operation in the column selection line driver illustrated in FIG. 7.

FIG. 19 describes another operation example of the set operation in the memory array unit illustrated in FIG. 2.

FIG. 20A describes another operation example of the set operation in the row selection line driver illustrated in FIG. 6.

FIG. 20B describes another operation example of the set operation in the column selection line driver illustrated in FIG. 7.

FIG. 21 describes another operation example of the set operation in the memory array unit according to the comparative example.

FIG. 22 is a circuit diagram that illustrates a configuration example of a row selection line driver according to a modification example.

FIG. 23 is a circuit diagram that illustrates a configuration example of a column selection line driver according to the modification example.

FIG. 24 is a circuit diagram that illustrates a configuration example of a row selection line driver according to another modification example.

FIG. 25 is a circuit diagram that illustrates a configuration example of a column selection line driver according to another modification example.

FIG. 26A describes an example of a set operation in the row selection line driver illustrated in FIG. 24.

FIG. 26B describes an example of the set operation in the column selection line driver illustrated in FIG. 25.

FIG. 27 is a circuit diagram that illustrates a configuration example of a row selection line driver according to another modification example.

FIG. 28 describes a region in which the driver illustrated in FIG. 27 is formed.

FIG. 29 is a configuration diagram that illustrates a configuration example of a storage device according to another modification example.

FIG. 30 is a configuration diagram that illustrates a configuration example of a memory array unit according to another modification example.

FIG. 31A is a circuit diagram that illustrates a configuration example of a decoder in a row selection line driver illustrated in FIG. 30.

FIG. 31B is a circuit diagram that illustrates a configuration example of another decoder in the row selection line driver illustrated in FIG. 30.

FIG. 32 describes an operation example of the decoder illustrated in FIG. 31A.

FIG. 33 is a circuit diagram that illustrates a configuration example of a decoder according to another comparative example.

FIG. 34 is a circuit diagram that illustrates a configuration example of a row selection line driver according to another modification example.

FIG. 35 describes an example of a set operation in a memory array unit according to another modification example.

FIG. 36 describes an example of the set operation in the row selection line driver illustrated in FIG. 34.

FIG. 37 describes another operation example of the set operation in the memory array unit according to another modification example.

FIG. 38 describes an example of the set operation in the row selection line driver illustrated in FIG. 34.

FIG. 39 is a circuit diagram that illustrates a configuration example of a column selection line driver according to another modification example.

FIG. 40 describes an example of the set operation in the memory array unit according to another modification example.

FIG. 41 describes an example of the set operation in the column selection line driver illustrated in FIG. 39.

FIG. 42 describes another operation example of the set operation in the memory array unit according to another modification example.

FIG. 43 describes another operation example of the set operation in the column selection line driver illustrated in FIG. 39.

FIG. 44 is a configuration diagram that illustrates a configuration example of a memory array unit according to a second embodiment.

FIG. 45 is a perspective view that illustrates a configuration example of a memory array illustrated in FIG. 44.

FIG. 46 is a circuit diagram that illustrates a configuration example of a row selection line driver illustrated in FIG. 44.

FIG. 47 is a circuit diagram that illustrates a configuration example of a column selection line driver illustrated in FIG. 44.

FIG. 48 is a circuit diagram that illustrates a configuration example of a row selection line driver according to a modification example.

FIG. 49 is a circuit diagram that illustrates a configuration example of a column selection line driver according to a modification example.

MODES FOR CARRYING OUT THE INVENTION

In the following, some embodiments of the present disclosure are described in detail with reference to the drawings. It is to be noted that descriptions are given in the following order:
1. First Embodiment (Example of including two storage layers L0 and L1)
2. Second Embodiment (Example of including four storage layers L0 to L3)

1. First Embodiment

Configuration Example

FIG. 1 illustrates a configuration example of a storage device (a storage device 1) according to an embodiment. The storage device 1 is a nonvolatile storage device that stores data using a resistive random access storage element. It is to be noted that a method of controlling the storage device according to an embodiment of the present disclosure is embodied by the present embodiment, and thus is also described.

The storage device 1 selectively performs a data write operation or a data read operation on the basis of an instruction from a controller 99. The controller 99 instructs the storage device 1 in response to a request from a host (not illustrated) to perform the data write operation or the data read operation. Specifically, in a case of instructing the storage device 1 to perform the data write operation, the controller 99 supplies a command signal CMD that instructs data writing, an address signal ADR, and a data signal DT. In this case, the storage device 1 writes data indicated by the data signal DT to an address indicated by the address signal ADR. In addition, in a case of instructing the storage device 1 to perform the data read operation, the controller 99 supplies a command signal CMD that instructs data reading, and the address signal ADR. In this case, the storage device 1 reads data from an address indicated by the address signal ADR and supplies the read data to the controller 99 as the data signal DT.

The storage device 1 includes an interface circuit IF and a plurality of banks BK (in this example, four banks BK1 to BK4). Each of the plurality of banks BK includes a plurality of memory array units MAU and a microcontroller MCON. In this example, the storage device 1 is a so-called semiconductor memory die that is formed on a semiconductor substrate.

The interface circuit IF performs communication with the controller 99, and performs arbitration for the microcontroller MCON in each of the banks BK.

In each of the banks BK, as described later, each of the plurality of memory array units MAU includes a memory array MA that includes a plurality of memory cells MC. The plurality of memory array units MAU is arranged in a matrix in the semiconductor substrate. Each of the memory array units MAU is configured to allow for access in units of two bits. The microcontroller MCON controls an operation of the plurality of memory array units MAU on the basis of a control signal from the interface circuit IF. In access to each memory array unit MAU, the microcontroller MCON allow for access in units of two bits.

For example, in a case where each of the memory array units MAU has a storage capacity of 8M bits and each of the banks BK includes about 1000 (1k=32×32) memory array units MAU, each of the banks BK has a storage capacity of about 8 G bits. Thus, in this example, it is possible for the storage device 1 to have a storage capacity of 32 G bits. In this example, for example, it is possible for the controller 99 to access the storage device 1 in units of 2 k bits. The interface circuit IF selects one bank BK for one access on the basis of an instruction from the controller 99. The microcontroller MCON in the selected bank BK accesses each of the 1 k memory array units MAU in units of two bits. Thus, it is possible for the controller 99 to write data to the storage device 1 in units of 2 k bits or read data from the storage device 1 in units of 2 k bits.

FIG. 2 illustrates a configuration example of the memory array unit MAU. The memory array unit MAU includes a memory array MA and an array driver AD. In this example, for convenience of description, the memory array unit MAU has a storage capacity of 32 bits.

The memory array MA includes a plurality of row selection lines RL (in this example, eight row selection lines RL0 to RL7), a plurality of column selection lines CL (in this example, four column selection lines CL0 to CL3), and a plurality of memory cells MC (in this example, 32 memory cells MC0 to MC31). One end of each of the row selection lines RL0 to RL7 and one end of each of the column selection lines CL0 to CL3 are coupled to the array driver AD. In FIG. 2, the memory cells MC0 to MC31 are provided corresponding to 32 intersections between the row selection lines RL0 to RL7 and the column selection lines CL0 to CL3.

It is to be noted that in this example, 32 (=8×4) memory cells MC are formed through providing the eight row selection lines RL0 to RL7 and the four column selection lines CL0 to CL3. For example, as described above, in a case where the memory array unit MAU has a storage capacity of 8M bits, it is possible to form 8M (=2 k×4 k) memory cells MC, for example, through providing 4 k row selection lines RL and 2 k column selection lines CL.

FIG. 3 illustrates a configuration example of a memory array MA. The memory array MA is a so-called cross-point type memory array. The row selection lines RL0 to RL7 are formed to extend in an x-direction in an x-y plane parallel to a substrate surface S of a semiconductor. In addition, the column selection lines CL0 to CL3 are formed to extend in a y-direction in this x-y plane. The row selection lines RL0 to RL3 are formed in the same layer, and the column selection lines CL0 to CL3 are formed in a layer above the layer in which the row selection lines RL0 to RL3 are formed. Then, the row selection lines RL4 to RL7 are formed in a layer above the layer in which the column selection lines CL0 to CL3 are formed. Thus, in the memory array MA, the layer in which the row selection lines RL are formed and the layer in which the column selection lines CL are formed are alternately disposed.

In a storage layer L0 interposed between the layer in which the four row selection lines RL0 to RL3 are formed and the layer in which the four column selection lines CL0 to CL3 are formed, 16 (=4×4) memory cells MC (MC0 to MC15) are formed. Likewise, in a storage layer L1 interposed between the layer in which the four column selection lines CL0 to CL3 are formed and the layer in which the four row selection lines RL4 to RL7 are formed, 16 (=4×4) memory cells MC (MC16 to MC31) are formed.

FIG. 4 illustrates a configuration example of the memory cell MC. The memory cell MC includes a storage element VR, a selection element SE, and terminals TU and TL.

The storage element VR is a resistive random access storage element with a resistance state RS that changes reversibly in accordance with a polarity of a voltage difference between voltages applied to both ends. In other words, the resistance state RS of the storage element VR changes reversibly in accordance with a direction of a current flowing between both ends. For the storage element VR, for example, it is possible to use a stack of an ion source layer and a resistance change layer. The storage element VR has one end coupled to the terminal TU of the memory cell MC, and another end coupled to one end of the selection element SE.

FIG. 5 schematically illustrates a distribution of a resistance value of the storage element VR. The storage element VR possibly takes two identifiable resistance states RS (a high resistance state HRS and a low resistance state LRS). In this example, the high resistance state HRS corresponds to data "0", and the low resistance state LRS corresponds to data "1", for example. In other words, the storage element VR functions as a storage element that stores one-bit data. In the following, causing a change from the high resistance state HRS to the low resistance state LRS is referred to as "set", and causing a change from the low resistance state LRS to the high resistance state HRS is referred to as "reset".

The selection element SE (FIG. 4) has bidirectional diode characteristics. Specifically, the selection element SE becomes conductive (on-state) in a case where an absolute value of the voltage difference between the voltages applied to both ends is larger than a predetermined voltage difference, and becomes nonconductive (off-state) in a case where the absolute value of the voltage difference is smaller than the predetermined voltage difference. The selection element SE has the one end coupled to the other end of the storage element VR, and another end coupled to the TL terminal of the memory cell MC.

The terminal TU is a terminal coupled to a selection line above a storage layer in which the memory cell MC is formed, and the terminal TL is a terminal coupled to a selection line below the storage layer in which the memory cell MC is formed. Specifically, as illustrated in FIG. 3, in each of the memory cells MC (the memory cells MC0 to MC15) formed in the storage layer L0, the terminal TU is coupled to one of the column selection lines CL0 to CL3, and the terminal TL is coupled to one of the row selection lines RL0 to RL3. Likewise, in each of the memory cells MC (the memory cells MC16 to MC31) formed in the storage layer L1, the terminal TU is coupled to one of the row selection lines RL4 to RL7, and the terminal TL is coupled to one of the column selection lines CL0 to CL3. As described above, the terminal TU is coupled to the one end of the storage element VR, and the terminal TL is coupled to the other end of the selection element SE. In other words, in the memory cell MC, as illustrated in FIG. 3, irrespective of which one of the storage layers L0 and L1 the memory cell MC is formed in, the storage element VR is formed above the selection element SE.

Thus, in the storage device 1, respective storage layers have the same stacking order, thus allowing for cost reduction and quality improvement. In other words, for example, in a case of forming, in the storage layer L0, the storage element VR above the selection element SE and forming, in the storage layer L1, the selection element SE above the storage element VR, there is a possibility that a manufacturing process is complicated and a characteristic difference occurs between characteristics of the memory cell MC formed in the storage layer L0 and characteristics of the memory cell MC formed in the storage layer L1. In contrast, in the storage device 1, the respective storage layers have the same stacking order, which makes it possible to simplify the manufacturing process, thus allowing for cost reduction. In addition, it is possible to suppress the characteristic difference between the characteristics of the memory cell MC formed in the storage layer L0 and the characteristics of the memory cell MC formed in the storage layer L1, thus allowing for quality improvement.

The array driver AD (FIG. 2) writes data to the memory cell MC or reads data from the memory cell MC through selectively applying a voltage to the row selection lines RL0 to RL7 and the column selection lines CL0 to CL3 on the basis of an instruction from the microcontroller MCON.

The array driver AD writes data to the memory cell MC through performing a set operation OP1 or a reset operation OP2. The array driver AD reads data stored in the memory cell MC through performing a sense operation OP3.

Specifically, in a case of performing the set operation OP1 on a certain memory cell MC of the memory cells MC0 to MC15 formed in the storage layer L0, the array driver AD selects the certain memory cell MC through applying a selection voltage Vpset (for example, 6 V) to the column selection line CL related to the certain memory cell MC and applying a selection voltage Vnset (for example, 0 V) to the row selection line RL related to certain the memory cell MC. In addition, in a case of performing the set operation OP1 on a certain memory cell MC of the memory cells MC16 to MC31 formed in the storage layer L1, the array driver AD selects the certain memory cell MC through applying the selection voltage Vpset (for example, 6 V) to the row selection line RL related to the certain memory cell MC and applying the selection voltage Vnset (for example, 0 V) to the column selection line CL related to the certain memory cell MC. In the selected memory cell MC, as illustrated in FIG. 4, a voltage at the terminal TU becomes higher than a voltage at the terminal TL. This turns on the selection element SE to cause a set current Iset to flow from the terminal TU to the terminal TL, thus setting the storage element VR.

In addition, in a case of performing the reset operation OP2 on a certain memory cell MC of the memory cells MC0 to MC15 formed in the storage layer L0, the array driver AD selects the certain memory cell MC through applying a selection voltage Vnrst (for example, 0 V) to the column selection line CL related to the certain memory cell MC and applying a selection voltage Vprst (for example, 6 V) to the row selection line RL related to the certain memory cell MC. In addition, in a case of performing the reset operation OP2 on a certain memory cell MC of the memory cells MC16 to MC31 formed in the storage layer L1, the array driver AD selects the certain memory cell MC through applying the selection voltage Vnrst (for example, 0 V) to the row selection line RL related to the certain memory cell MC and applying the selection voltage Vprst (for example, 6 V) to the column selection line CL related to the certain memory cell MC. In the selected memory cell MC, as illustrated in FIG. 4, the voltage at the terminal TL becomes higher than the voltage at the terminal TU. This turns on the selection element SE to cause a reset current Irst to flow from the terminal TL to the terminal TU, thus resetting the storage element VR.

In addition, in a case of performing the sense operation OP3 on a certain memory cell MC of the memory cells MC0 to MC15 formed in the storage layer L0, the array driver AD selects the certain memory cell MC through applying a selection voltage Vpsns (for example, 5 V) to the column selection line CL related to the certain memory cell MC and applying a selection voltage Vnsns (for example, 1 V) to the row selection line RL related to the certain memory cell MC. In addition, in a case of performing the sense operation OP3 on a certain memory cell MC of the memory cells MC16 to MC31 formed in the storage layer L1, the array driver AD selects the certain memory cell MC through applying the selection voltage Vpsns (for example, 5 V) to the row selection line RL related to the certain memory cell MC and applying the selection voltage Vnsns (for example, 1 V) to the column selection line CL related to the certain memory cell MC. In the selected memory cell MC, as illustrated in FIG. 4, the voltage at the terminal TU becomes higher than the voltage at the terminal TL to cause a sense current Isns to flow from the terminal TU to the terminal TL. Then, sense amplifiers 24A and 24B (described later) detect a voltage generated in the memory cell MC, thereby determining the resistance state RS of the storage element VR. In the sense operation OP3, for example, as compared to the set operation OP1, the voltage difference between the voltage at the terminal TU and the voltage at the terminal TL is small. This does not sufficiently turn on the selection element SE, and therefore does not set the storage element VR. As a result, in the sense operation OP3, the resistance state RS of the storage element VR is maintained.

In addition, in a case of not performing any of the set operation OP1, the reset operation OP2, and the sense operation OP3 on a certain memory cell MC of the memory cells MC0 to MC31, the array driver AD applies a non-selection voltage Vinh (for example, 3 V) to the row selection line RL related to the certain memory cell MC, and applies the non-selection voltage Vinh (for example, 3 V) to the column selection line CL related to the certain memory cell MC. This causes the voltages at the terminals TU and TL to be equal to each other in the memory cell MC; the selection element SE is turned off; and a current hardly flows. As a result, in this memory cell MC, the resistance state RS of the storage element VR is maintained.

The array driver AD includes a row selection line driver 20 and a column selection line driver 30. The row selection line driver 20 selectively applies a voltage to the row selection lines RL0 to RL7 on the basis of an instruction from the microcontroller MCON. The column selection line driver 30 selectively applies a voltage to the column selection lines CL0 to CL3 on the basis of an instruction from the microcontroller MCON. In the following, the row selection line driver 20 and the column selection line driver 30 are described in detail.

(Row Selection Line Driver 20)

FIG. 6 illustrates a configuration example of the row selection line driver 20. The row selection line driver 20 includes voltage selection circuits 21A and 21B, current limiting (compliance) circuits 22A and 22B, decoders 23A and 23B, and the sense amplifiers 24A and 24B. In addition, although not illustrated, the row selection line driver 20 also includes an inverting circuit that respectively generates, on the basis of logic signals Vgrset, Vgrrst, Vgrsns, and Vgr0 to Vgr7 supplied from the microcontroller MCON, logic signals Vgrsetb, Vgrrstb, Vgrsns, and Vgr0b to Vgr7b each of which is an inverted signal of a corresponding one of these logic signals. The voltage selection circuit 21A, the current limiting circuit 22A, the decoder 23A, and the sense amplifier 24A are included in a driver 20A, and the voltage selection circuit 21B, the current limiting circuit 22B, the decoder 23B, and the sense amplifier 24B are included in a driver 20B.

The voltage selection circuit 21A outputs one of the selection voltages Vnset, Vprst, and Vnsns on the basis of the logic signals Vgrset, Vgrrst, and Vgrsns supplied from the microcontroller MCON. The voltage selection circuit 21A includes transistors 201 to 203. The transistors 201 and 203 are n-type MOS (Metal Oxide Semiconductor) transistors, and the transistor 202 is a p-type MOS transistor. The transistor 201 has a gate supplied with the logic signal Vgrset, a source supplied with the selection voltage Vnset (for example, 0 V), and a drain coupled to a node N21A. The transistor 202 has a gate supplied with the logic signal Vgrrstb that is the inverted signal of the logic signal Vgrrst, a source supplied with the selection voltage Vprst (for example, 6 V), and a drain coupled to a node N21. The transistor 203 has a gate supplied with the logic signal Vgrsns, a source supplied with the selection voltage Vnsns (for example, 1 V), and a drain coupled to the node N21.

In the set operation OP1, the voltage selection circuit 21A outputs the selection voltage Vnset (for example, 0 V) on the basis of the high-level logic signal Vgrset supplied from the microcontroller MCON. In addition, in the reset operation OP2, the voltage selection circuit 21A outputs the selection voltage Vprst (for example, 6 V) on the basis of the low-level logic signal Vgrrstb corresponding to the high-level logic signal Vgrrst supplied from the microcontroller MCON. In addition, in the sense operation OP3, the voltage selection circuit 21A outputs the selection voltage Vnsns (for example, 1 V) on the basis of the high-level logic signal Vgrsns supplied from the microcontroller MCON.

The current limiting circuit 22A limits a current value of a current flowing between the voltage selection circuit 21A and the decoder 23A, on the basis of signals Vpcmp and Vncmp supplied from the microcontroller MCON. The current limiting circuit 22A includes transistors 204 and 205. The transistor 204 is a p-type MOS transistor, and the transistor 205 is an n-type MOS transistor. The transistor 204 has a gate supplied with the signal Vpcmp, a source coupled to the node N21A, and a drain coupled to the node N23A. The transistor 205 has a gate supplied with the signal Vncmp, a source coupled to the node N21A, and a drain coupled to the node N23A.

In the set operation OP1, in a case where the voltage selection circuit 21A outputs the selection voltage Vnset (for example, 0 V), the current limiting circuit 22A limits, on the basis of the signal Vncmp that is an analog voltage supplied from the microcontroller MCON, the current value of a current flowing from the decoder 23A to the voltage selection circuit 21A to a predetermined current value (for example, 10 uA) or smaller. In addition, in the reset operation OP2, in a case where the voltage selection circuit 21A outputs the selection voltage Vprst (for example, 6 V), the current limiting circuit 22A operates not to limit the current, on the basis of the low-level signal Vpcmp supplied from the microcontroller MCON. In addition, in the sense operation OP3, in a case where the voltage selection circuit 21A outputs the selection voltage Vnsns (for example, 1 V), the current limiting circuit 22A limits, on the basis of the signal Vncmp that is an analog voltage supplied from the microcontroller MCON, the current value of a current flowing from the decoder 23A to the voltage selection circuit 21A to a predetermined current value (for example, 1 uA) or smaller.

The decoder 23A selectively applies, to the row selection lines RL0 to RL3, the selection voltage supplied from the voltage selection circuit 21A via the current limiting circuit 22A on the basis of logic signals Vgr0 to Vgr3 supplied from the microcontroller MCON. The decoder 23A includes transistors 206 to 213. The transistors 206 to 213 are n-type MOS transistors. The transistor 206 has a gate supplied with the logic signal Vgr0, a source coupled to the node N23A, and a drain coupled to a drain of the transistor 207 and the row selection line RL0. The transistor 207 has a gate supplied with the logic signal Vgr0b that is the inverted signal of the logic signal Vgr0, a source supplied with the non-selection voltage Vinh (for example, 3 V), and a drain coupled to the drain of the transistor 206 and the row selection line RL0. The transistor 208 has a gate supplied with a logic signal Vgr1b that is an inverted signal of the logic signal Vgr1, a source supplied with the non-selection voltage Vinh (for example, 3 V), and a drain coupled to a drain of the transistor 209 and the row selection line RL1. The transistor 209 has a gate supplied with the logic signal Vgr1, a source coupled to the node N23A, and a drain coupled to the drain of the transistor 208 and the row selection line RL1. The transistor 210 has a gate supplied with the logic signal Vgr2, a source coupled to the node N23A, and a drain coupled to a drain of the transistor 211 and the row selection line RL2. The transistor 211 has a gate supplied with a logic signal Vgr2b that is an inverted signal of the logic signal Vgr2, a source supplied with the non-selection voltage Vinh (for example, 3 V), and a drain coupled to the drain of the transistor 210 and the row selection line RL2. The transistor 212 has a gate supplied with a logic signal Vgr3b that is an inverted signal of the logic signal Vgr3, a source supplied with the non-selection voltage Vinh (for example, 3V), and a drain coupled to a drain of the transistor 213 and the row selection line RL3. The transistor 213 has a gate supplied with the logic signal Vgr3, a source coupled to the node N23A, and a drain coupled to the drain of the transistor 212 and the row selection line RL3.

The sense amplifier 24A determines the resistance state RS of the memory cell MC on the basis of a signal Vsaen supplied from the microcontroller MCON. The sense amplifier 24A is included in a differential amplifier. The sense amplifier 24A includes transistors 214 to 218. The transistors 214 to 216 are n-type MOS transistors, and the transistors 217 and 218 are p-type MOS transistors. The transistor 214 has a gate supplied with the signal Vsaen, a drain coupled to a source of each of the transistors 215 and 216, and a source supplied with a voltage Vss. This transistor 214 functions as a current source for the differential amplifier. The transistor 215 has a gate supplied with a voltage Vref, a drain coupled to a drain of the transistor 217, and a source coupled to a source of the transistor 216 and the drain of the transistor 214. The transistor 216 has a gate coupled to the node N23A, a drain coupled to a drain of the transistor 218 and a gate of each of the transistors 217 and 218, and the source coupled to the source of the transistor 215 and the drain of the transistor 214. The transistors 215 and 216 function as differential pair transistors for the differential amplifier. The transistor 217 has a gate coupled to a gate of the transistor 218, and the drain of the transistor 216, and a drain of the transistor 218, a source supplied with a voltage Vpp, and the drain coupled to the drain of the transistor 215. The transistor 218 has the gate coupled to the gate of the transistor 217 and the drain of each of the transistors 216 and 218, a source supplied with the voltage Vpp, and the drain coupled to the gate of each of the transistors 217 and 218 and the drain of the transistor 216. The transistors 217 and 218 function as an active load for the differential amplifier.

In the sense operation OP3, the sense amplifier 24A generates a signal SAout0 through causing the transistor 214 to function as a current source on the basis of the signal Vsaen that is an analog voltage supplied from the microcontroller MCON, and comparing the voltage at the node N23A and the voltage Vref. Then, the sense amplifier 24A supplies this signal SAout0 to the microcontroller MCON. In addition, in a case of not performing the sense operation OP3, the sense amplifier 24A is turned off the transistor 214 on the basis of the low-level signal Vsaen supplied from the microcontroller MCON. This makes it possible for the sense amplifier 24A to reduce power consumption.

As with the voltage selection circuit 21A, the voltage selection circuit 21B outputs one of the selection voltages Vpset, Vnrst, and Vpsns on the basis of the logic signals Vgrset, Vgrrst, and Vgrsns supplied from the microcontroller MCON. The voltage selection circuit 21B includes transistors 221 to 223. The transistors 221 and 223 are p-type MOS transistors, and the transistor 222 is an n-type MOS transistor. The transistor 221 has a gate supplied with the logic signal Vgrsetb that is the inverted signal of the logic signal Vgrset, a source supplied with the selection voltage Vpset (for example, 6 V), and a drain coupled to the node N21B. The transistor 222 has a gate supplied with the logic signal Vgrrst, a source supplied with the selection voltage Vnrst (for example, 0 V), and a drain coupled to the node N21B. The transistor 223 has a gate supplied with a logic signal Vgrsnsb that is an inverted signal of the logic signal Vgrsns, a source supplied with the selection voltage Vpsns (for example, 5 V), and a drain coupled to the node N21B.

In the set operation OP1, the voltage selection circuit 21B outputs the selection voltage Vpset (for example, 6 V) on the basis of the low-level logic signal Vgrsetb corresponding to the high-level logic signal Vgrset supplied from the microcontroller MCON. In addition, in the reset operation OP2, the voltage selection circuit 21B outputs the selection voltage Vnrst (for example, 0 V) on the basis of the high-level logic signal Vgrrst supplied from the microcontroller MCON. In addition, in the sense operation OP3, the voltage selection circuit 21B outputs the selection voltage Vpsns (for example, 5 V) on the basis of the low-level logic signal Vgrsnsb corresponding to the high-level logic signal Vgrsns supplied from the microcontroller MCON.

As with the current limiting circuit 22A, the current limiting circuit 22B limits, on the basis of the signals Vpcmp and Vncmp supplied from the microcontroller MCON, the current value of a current flowing between the voltage selection circuit 21B and the decoder 23B. The current limiting circuit 22B has a configuration similar to that of the current limiting circuit 22A. The current limiting circuit 22B includes transistors 224 and 225. The transistors 224 and 225 respectively correspond to the transistors 204 and 205 in the current limiting circuit 22A.

In the set operation OP1, in a case where the voltage selection circuit 21B outputs the selection voltage Vpset (for example, 6 V), the current limiting circuit 22B limits, on the basis of the signal Vpcmp that is an analog voltage supplied from the microcontroller MCON, the current value of a current flowing from the voltage selection circuit 21B to the decoder 23B to a predetermined current value (for example, 10 uA) or smaller. In addition, in the reset operation OP2, in a case where the voltage selection circuit 21B outputs the selection voltage Vnrst (for example, 0 V), the current limiting circuit 22B operates not to limit the current, on the basis of the high-level signal Vncmp supplied from the microcontroller MCON. In addition, in the sense operation OP3, in a case where the voltage selection circuit 21B outputs the selection voltage Vpsns (for example, 5 V), the current limiting circuit 22B limits, on the basis of the signal Vpcmp that is an analog voltage supplied from the microcontroller MCON, the current value of a current flowing from the voltage selection circuit 21B to the decoder 23B to a predetermined current value (for example, 1 uA) or smaller.

As with the decoder 23A, the decoder 23B selectively applies, to the row selection lines RL4 to RL7, the selection voltage supplied from the voltage selection circuit 21B via the current limiting circuit 22B on the basis of logic signals Vgr4 to Vgr7 supplied from the microcontroller MCON. The decoder 23B includes transistors 226 to 233. The transistors 226 to 233 are n-type MOS transistors. The transistor 226 has a gate supplied with the logic signal Vgr4, a source coupled to a node N23B, and a drain coupled to a drain of the transistor 227 and the row selection line RL4. The transistor 227 has a gate supplied with a logic signal Vgr4b that is an inverted signal of the logic signal Vgr4, a source supplied with the non-selection voltage Vinh (for example, 3 V), and the drain coupled to the drain of the transistor 226 and the row selection line RL4. The transistor 228 has a gate supplied with a logic signal Vgr5b that is an inverted signal of the logic signal Vgr5, a source supplied with the non-selection voltage Vinh (for example, 3 V), and a drain coupled to a drain of the transistor 229 and the row selection line RL5. The transistor 229 has a gate supplied with the logic signal Vgr5, a source coupled to the node N23B, and the drain coupled to the drain of the transistor 228 and the row selection line RL5. The transistor 230 has a gate supplied with the logic signal Vgr6, a source coupled to the node N23B, and a drain coupled to a drain of the transistor 231 and the row selection line RL6. The transistor 231 has a gate supplied with a logic signal Vgr6b that is an inverted signal of the logic signal Vgr6, a source supplied with the non-selection voltage Vinh (for example, 3 V), and the drain coupled to the drain of the transistor 230 and the row selection line RL6. The transistor 232 has a gate supplied with a logic signal Vgr7b that is an inverted signal of the logic signal Vgr7, a source supplied with the non-selection voltage Vinh (for example, 3 V), and a drain coupled to a drain of the transistor 233 and the row selection line RL7. The transistor 233 has a gate supplied with the logic signal Vgr7, a source coupled to the node N23B, and the drain coupled to the drain of the transistor 232 and the row selection line RL7.

As with the sense amplifier 24A, the sense amplifier 24B determines the resistance state RS of the memory cell MC on the basis of the signal Vsaen supplied from the microcontroller MCON. The sense amplifier 24B has a configuration similar to that of the sense amplifier 24A. The sense amplifier 24B includes transistors 234 to 238. The transistors 234 to 238 respectively correspond to the transistors 214 to 218 in the sense amplifier 24A.

In the sense operation OP3, the sense amplifier 24B generates a signal SAout1 through causing the transistor 234 to function as a current source on the basis of the signal Vsaen that is an analog voltage supplied from the microcontroller MCON, and comparing the voltage at the node N23B and the voltage Vref. Then, the sense amplifier 24B supplies this signal SAout1 to the microcontroller MCON. In addition, in a case of not performing the sense operation OP3, the sense amplifier 24B is turned off the transistor 234 on the basis of the low-level signal Vsaen supplied from the microcontroller MCON. This makes it possible for the sense amplifier 24B to reduce power consumption.

(Column Selection Line Driver 30)

FIG. 7 illustrates a configuration example of the column selection line driver 30. The column selection line driver 30 includes voltage selection circuits 31A and 31B and decoders 32A and 32B. In addition, although not illustrated, the column selection line driver 30 also includes an inverting circuit that respectively generates, on the basis of the logic signals Vgcset0, Vgcset1, Vgcrst0, Vgcrst1, Vgcsns0, Vgcsns1, and Vgc0 to Vgc3 supplied from the microcontroller MCON, logic signals Vgcset0b, Vgcset1b, Vgcrst0b, Vgcrst1b, Vgcsns0b, Vgcsns1b, and Vgc0b to Vgc3b each of which is an inverted signal of a corresponding one of these logic signals. The voltage selection circuit 31A and the decoder 32A are included in a driver 30A, and the voltage selection circuit 31B and the decoder 32B are included in a driver 30B.

The voltage selection circuit 31A outputs one of the selection voltages Vpset, Vnset, Vprst, Vnrst, Vpsns, and Vnsns on the basis of the logic signals Vgcset0, Vgcset1, Vgcrst0, Vgcrst1, Vgcsns0, and Vgcsns1 supplied from the microcontroller MCON. The voltage selection circuit 31A includes transistors 301 to 306. The transistors 301, 303, and 305 are p-type MOS transistors, and the transistors 302, 304, and 306 are n-type MOS transistors. The transistor 301 has a gate supplied with the logic signal Vgcset0b that is the inverted signal of the logic signal Vgcset0, a source supplied with the selection voltage Vpset (for example, 6 V), and a drain coupled to a node N32A. The transistor 302 has a gate supplied with the logic signal Vgcset1, a source supplied with the selection voltage Vnset (for example, 0 V), and a drain coupled to the node N32A. The transistor 303 has a gate supplied with the logic signal Vgcrst1b that is the inverted signal of the logic signal Vgcrst1, a source supplied with the selection voltage Vprst (for example, 6 V), and a drain coupled to the node N32A. The transistor 304 has a gate supplied with the logic signal Vgcrst0, a source supplied with the selection voltage Vnrst (for example, 0 V), and a drain coupled to the node N32A. The transistor 305 has a gate supplied with the logic signal Vgcsns0b that is the inverted signal of the logic signal Vgcsns0, a source supplied with the selection voltage Vpsns (for example, 5 V), and a drain coupled to the node N32A. The transistor 306 has a gate supplied with the logic signal Vgcsns1, a source supplied with the selection voltage Vnsns (for example, 1 V), and a drain coupled to the node N32A.

In the set operation OP1, the voltage selection circuit 31A outputs the selection voltage Vpset (for example, 6 V) on the basis of the low-level logic signal Vgcset0b corresponding to the high-level logic signal Vgcset0 supplied from the microcontroller MCON, or outputs the selection voltage Vnset (for example, 0 V) on the basis of the high-level logic signal Vgcset1 supplied from the microcontroller MCON. In addition, in the reset operation OP2, the voltage selection circuit 31A outputs the selection voltage Vprst (for example, 6 V) on the basis of the low-level logic signal Vgcrst1b corresponding to the high-level logic signal Vgcrst1 supplied from the microcontroller MCON, or outputs the selection voltage Vnrst (for example, 0 V) on the basis of the high-level logic signal Vgcrst0 supplied from the microcontroller MCON. In addition, in the sense operation OP3, the voltage selection circuit 31A outputs the selection voltage Vpsns (for example, 5 V) on the basis of the low-level logic signal Vgcsns0b corresponding to the high-level logic signal Vgcsns0 supplied from the microcontroller MCON, or outputs the selection voltage Vnsns (for example, 1V) on the basis of the high-level logic signal Vgcsns1 supplied from the microcontroller MCON.

The decoder 32A selectively applies, to the column selection lines CL0 and CL1, the selection voltage supplied from the voltage selection circuit 31A on the basis of the logic signals Vgc0 and Vgc1 supplied from the microcontroller MCON. The decoder 32A includes transistors 307 to 310. The transistors 307 to 310 are n-type MOS transistors. The transistor 307 has a gate supplied with the logic signal Vgc0, a source coupled to the node N32A, and a drain coupled to a drain of the transistor 308 and the column selection line CL0. The transistor 308 has a gate supplied with the logic signal Vgc0b that is the inverted signal of the logic signal Vgc0, a source supplied with the non-selection voltage Vinh (for example, 3 V), and the drain coupled to the drain of the transistor 307 and the column selection line CL0. The transistor 309 has a gate supplied with a logic signal Vgc1b that is an inverted signal of the logic signal Vgc1, a source supplied with the non-selection voltage Vinh (for example, 3 V), and a drain coupled to a drain of the transistor 310 and the column selection line CL1. The transistor 310 has a gate supplied with the logic signal Vgc1, a source coupled to the node N32A, and the drain coupled to the drain of the transistor 309 and the column selection line CL1.

As with the voltage selection circuit 31A, the voltage selection circuit 31B outputs one of the selection voltages Vpset, Vnset, Vprst, Vnrst, Vpsns, and Vnsns on the basis of the logic signals Vgcset0, Vgcset1, Vgcrst0, Vgcrst1, Vgcsns0, and Vgcsns1 supplied from the microcontroller MCON. The voltage selection circuit 31B includes transistors 321 to 326. The transistors 321, 323, and 325 are p-type MOS transistors, and the transistors 322, 324, and 326 are n-type MOS transistors. The transistor 321 has a gate supplied with the logic signal Vgcset1b that is the inverted signal of the logic signal Vgcset1, a source supplied with the selection voltage Vpset (for example, 6 V), and a drain coupled to the node N32B. The transistor 322 has a gate supplied with the logic signal Vgcset0, a source supplied with the selection voltage Vnset (for example, 0 V), and a drain coupled to the node N32B. The transistor 323 has a gate supplied with the logic signal Vgcrst0b that is the inverted signal of the logic signal Vgcrst0, a source supplied with the selection voltage Vprst (for example, 6 V), and a drain coupled to the node N32B. The transistor 324 has a gate supplied with the logic signal Vgcrst1, a source supplied with the selection voltage Vnrst (for example, 0 V), and a drain coupled to the node N32B. The transistor 325 has a gate supplied with the logic signal Vgcsns1b that is the inverted signal of the logic signal Vgcsns1, a source supplied with the selection voltage Vpsns (for example, 5 V), and a drain coupled to the node N32B. The transistor 326 has a gate supplied with the logic signal Vgcsns0, a source supplied with the selection voltage Vnsns (for example, 1 V), and a drain coupled to the node N32B.

In the set operation OP1, the voltage selection circuit 31B outputs the selection voltage Vpset (for example, 6 V) on the basis of the low-level logic signal Vgcset1b corresponding to the high-level logic signal Vgcset1 supplied from the microcontroller MCON, or outputs the selection voltage Vnset (for example, 0 V) on the basis of the high-level logic signal Vgcset0 supplied from the microcontroller MCON. In addition, in the reset operation OP2, the voltage selection circuit 31B outputs the selection voltage Vprst (for example, 6 V) on the basis of the low-level logic signal Vgcrst0b corresponding to the high-level logic signal Vgcrst0 supplied from the microcontroller MCON, or outputs the selection voltage Vnrst (for example, 0 V) on the basis of the high-level logic signal Vgcrst1 supplied from the microcontroller MCON. In addition, in the sense operation OP3, the voltage selection circuit 31B outputs the selection voltage Vpsns (for example, 5 V) on the basis of the low-level logic signal Vgcsns1b corresponding to the high-level logic signal Vgcsns1 supplied from the microcontroller MCON, or outputs the selection voltage Vnsns (for example, 1 V) on the basis of the high-level logic signal Vgcsns0 supplied from the microcontroller MCON.

As with the decoder 32A, the decoder 32B selectively applies, to column selection lines CL2 and CL3, the selection voltage supplied from the voltage selection circuit 31B, on the basis of logic signals Vgc2 and Vgc3 supplied from the microcontroller MCON. The decoder 32B includes transistors 327 to 330. The transistors 327 to 330 are n-type MOS transistors. The transistor 327 has a gate supplied with the logic signal Vgc2, a source coupled to the node N32B, and a drain coupled to a drain of the transistor 328 and the column selection line CL2. The transistor 328 has a gate supplied with a logic signal Vgc2b that is an inverted signal of the logic signal Vgc2, a source supplied with the non-selection voltage Vinh (for example, 3 V), and the drain coupled to the drain of the transistor 327 and the column selection line CL2. The transistor 329 has a gate supplied with a logic signal Vgc3b that is an inverted signal of the logic signal Vgc3, a source supplied with the non-selection voltage Vinh (for example, 3 V), and a drain coupled to a drain of the transistor 330 and the column selection line CL3. The transistor 330 has a gate supplied with the logic signal Vgc3, a source coupled to the node N32B, and the drain coupled to the drain of the transistor 329 and the column selection line CL3.

With this configuration, as described later, for example, in the set operation OP1, the row selection line driver 20 in the array driver AD applies the selection voltage Vnset (for example, 0 V) to one of the row selection lines RL0 to RL3, and applies the selection voltage Vpset (for example, 6 V) to one of the row selection lines RL4 to RL7. Then, in the set operation OP1, the column selection line driver 30 in the array driver AD applies one of the selection voltage Vpset (for example, 6 V) and the selection voltage Vnset (for example, 0 V) to the column selection line CL0 or the column selection line CL1, and applies the other of the selection voltage Vpset and the selection voltage nset to the column selection line CL2 or the column selection line CL3. Thus, in the memory array MA, the storage elements VR in two memory cells MC of the 32 memory cells MC are selected. At the time, two current paths different from each other are formed in the memory array unit MAU. The same applies to the reset operation OP2 and the sense operation OP3. This makes it possible to increase reliability in the data write operation and the data read operation in the storage device 1.

Here, the memory array MA corresponds to a specific example of a "first storage section" in the present disclosure. The row selection lines RL0 to RL3 correspond to a specific example of a "plurality of first selection lines" in the present disclosure, and the row selection lines RL4 to RL7 correspond to a specific example of a "plurality of second selection lines" in the present disclosure. The column selection lines CL0 and CL1 correspond to a specific example of a "plurality of third selection lines" in the present disclosure, and the column selection lines CL2 and CL3 correspond to a specific example of a "plurality of fourth selection lines" in the present disclosure. The row selection line driver 20 corresponds to a specific example of a "first selection line driver" in the present disclosure. The driver 20A corresponds to a specific example of a "first driver" in the present disclosure, and the driver 20B corresponds to a specific example of a "second driver" in the present disclosure. The column selection line driver 30 corresponds to a specific example of a "second selection line driver" in the present disclosure. The driver 30A corresponds to a specific example of a "third driver" in the present disclosure, and the driver 30B corresponds to a specific example of a "fourth driver" in the present disclosure. For example, the selection voltage Vpset corresponds to a specific example of a "first selection voltage" in the present disclosure, and the selection voltage Vnset corresponds to a specific example of a "second selection voltage" in the present disclosure.

The decoder 23A corresponds to a specific example of a "first voltage application section" in the present disclosure. The transistors 206, 209, 210, and 213 correspond to a specific example of a "plurality of first switches" in the present disclosure. The logic signals Vgr0, Vgr0*b*, Vgr1, Vgr1*b*, Vgr2, Vgr2*b*, Vgr3, and Vgr3*b* each correspond to a specific example of a "first selection signal" in the present disclosure. The voltage selection circuit 21A corresponds to a specific example of a "first supply section" in the present disclosure. The decoder 23B corresponds to a specific example of a "second voltage application section" in the present disclosure. The transistors 226, 229, 230, and 233 correspond to a specific example of a "plurality of second switches" in the present disclosure. The logic signals Vgr4, Vgr4*b*, Vgr5, Vgr5*b*, Vgr6, Vgr6*b*, Vgr7, and Vgr1*b* each correspond to a specific example of a "second selection signal" in the present disclosure. The voltage selection circuit 21B corresponds to a specific example of a "second supply section" in the present disclosure. The decoder 32A corresponds to a specific example of a "third voltage application section" in the present disclosure. The transistors 307 and 310 correspond to a specific example of a "plurality of third switches" in the present disclosure. The logic signals Vgc0, Vgc0*b*, Vgc1, and Vgc1*b* each correspond to a specific example of a "third selection signal" in the present disclosure. The voltage selection circuit 31A corresponds to a specific example of a "third supply section" in the present disclosure. The decoder 32B corresponds to a specific example of a "fourth voltage application section" in the present disclosure. The transistors 327 and 330 correspond to a specific example of a "plurality of fourth switches" in the present disclosure. The logic signals Vgc2, Vgc2*b*, Vgc3, and Vgc3*b* each correspond to a specific example of a "fourth selection signal" in the present disclosure. The voltage selection circuit 31B corresponds to a specific example of a "fourth supply section" in the present disclosure.

[Workings and Effects]

Next, workings and effects of the storage device 1 according to the present embodiment are described.

(Overview of Overall Operation)

First, an overview of an overall operation of the storage device 1 is described with reference to FIGS. 1 and 2. The interface circuit IF (FIG. 1) communicates with the controller 99, and performs arbitration for the microcontroller MCON in each of the banks BK. In each of the banks BK, the microcontroller MCON controls the operation of the plurality of memory array units MAU on the basis of the control signal from the interface circuit IF. In each of the memory array units MAU, the row selection line driver 20 in the array driver AD selectively applies a voltage to the row selection lines RL0 to RL7 on the basis of an instruction from the microcontroller MCON. The column selection line driver 30 in the array driver AD selectively applies a voltage to the column selection lines CL0 to CL3 on the basis of an instruction from the microcontroller MCON. The array driver AD writes data to the memory cell MC through performing the set operation OP1 or the reset operation OP2. In addition, the array driver AD reads data stored in the memory cell MC through performing the sense operation OP3.

(Detailed Operation)

In the following, the set operation OP1, the reset operation OP2, and the sense operation OP3 in a case where two memory cells MC (in this example, memory cells MC6 and MC25) are selected from 31 memory cells MC in the memory array unit MAU are described in detail.

(Set Operation OP1)

FIG. 8 schematically illustrates an operation in a case of performing the set operation OP1 on the two memory cells MC6 and MC25. In FIG. 8, the selection line to which the selection voltage Vpset (in this example, 6 V) is applied is indicated by a wide solid line, the selection line to which the selection voltage Vnset (in this example, 0 V) is applied is indicated by a wide dashed line, and the selection line to which the non-selection voltage Vinh (in this example, 3 V) is applied is indicated by a narrow solid line. The voltages VCL0 to VCL3 indicate voltages at the column selection lines CL0 to CL3, respectively, and the voltages VRL0 to VRL7 indicate voltages at the row selection lines RL0 to RL7, respectively.

FIGS. 9A and 9B schematically illustrate an operation of the array driver AD in the set operation OP1. FIG. 9A illustrates an operation of the row selection line driver 20, and FIG. 9B illustrates an operation of the column selection line driver 30. In FIG. 9A, each of the transistors in the voltage selection circuits 21A and 21B, each of the transistors in the decoders 23A and 23B, the transistor 214 in the sense amplifier 24A, and the transistor 234 in the sense amplifier 24B are illustrated using switches that indicate operation states of the transistors. Likewise, in FIG. 9B, each of the transistors in the voltage selection circuits 31A and 31B and each of the transistors in the decoders 32A and 32B are illustrated using switches that indicate operation states of the transistors.

In the example in FIG. 8, the row selection line driver 20 applies the selection voltage Vnset (in this example, 0 V) to the row selection line RL1, applies the selection voltage Vpset (in this example, 6 V) to the row selection line RL6, and applies the non-selection voltage Vinh (in this example, 3 V) to the remaining row selection lines RL0, RL2 to RL5, and RL7. In addition, the column selection line driver 30 applies the selection voltage Vnset (in this example, 0 V) to the column selection line CL1, applies the selection voltage Vpset (in this example, 6 V) to the column selection line CL2, and applies the non-selection voltage Vinh (in this example, 3 V) to the remaining column selection lines CL0 and CL3.

At this time, as illustrated in FIG. 9A, in the voltage selection circuit 21A in the row selection line driver 20, the transistor 201 is turned on while the transistors 202 and 203 are turned off. This causes the voltage selection circuit 21A to output the selection voltage Vnset (in this example, 0 V). Meanwhile, in the voltage selection circuit 21B, the transistor 221 is turned on while the transistors 222 and 223 are turned off. This causes the voltage selection circuit 21B to output the selection voltage Vpset (in this example, 6 V). In other words, in the row selection line driver 20, the gate of the transistor 201 is supplied with the logic signal Vgrset, and the gate of the transistor 221 is supplied with the logic signal Vgrsetb that is the inverted signal of the logic signal Vgrset. This sets the logic signal Vgrset to a high level, thus turning on the transistors 201 and 221 at the same time. As a result, each of the voltage selection circuits 21A and 21B outputs, out of the two selection voltages Vpset and Vnset used in the set operation OP1, one voltage different from the other.

Then, in the decoder 23A, the transistors 207, 209, 211, and 212 are turned on while the transistors 206, 208, 210, and 213 are turned off. As a result, the decoder 23A applies, to the row selection line RL1, the selection voltage Vnset (in this example, 0 V) supplied from the voltage selection circuit 21A via the current limiting circuit 22A, and applies the non-selection voltage Vinh (in this example, 3 V) to the row selection lines RL0, RL2, and RL3.

In addition, in the decoder 23B, the transistors 227, 228, 230, and 232 are turned on while the transistors 226, 229, 231, and 233 are turned off. As a result, the decoder 23B applies, to the row selection line RL6, the selection voltage Vpset (in this example, 6 V) supplied from the voltage selection circuit 21B via the current limiting circuit 22B, and applies the non-selection voltage Vinh (in this example, 3 V) to the row selection lines RL4, RL5, and RL7.

It is to be noted that in this set operation OP1, both the transistor 214 in the sense amplifier 24A and the transistor 234 in the sense amplifier 24B are off.

In addition, as illustrated in FIG. 9B, in the voltage selection circuit 31A in the column selection line driver 30, the transistor 302 is turned on while the transistors 301 and 303 to 306 are turned off. This causes the voltage selection circuit 31A to output the selection voltage Vnset (in this example, 0 V). Meanwhile, in the voltage selection circuit 31B, the transistor 321 is turned on while the transistors 322 to 326 are turned off. This causes the voltage selection circuit 31B to output the selection voltage Vpset (in this example, 6 V). In other words, in the column selection line driver 30, the gate of the transistor 302 is supplied with the logic signal Vgcset1, and the gate of the transistor 321 is supplied with the logic signal Vgcset1b that is the inverted signal of the logic signal Vgcset1. This sets the logic signal Vgcset1 to the high level, thus turning on the transistors 302 and 321 at the same time. As a result, each of the voltage selection circuits 31A and 31B outputs, out of the two selection voltages Vpset and Vnset used in the set operation OP1, one voltage different from the other.

Then, in the decoder 32A, the transistors 308 and 310 are turned on while the transistors 307 and 309 are turned off. As a result, the decoder 32A applies, to the column selection line CL1, the selection voltage Vnset (in this example, 0 V) supplied from the voltage selection circuit 31A, and applies the non-selection voltage Vinh (in this example, 3 V) to the column selection line CL0.

In addition, in the decoder 32B, the transistors 327 and 329 are turned on while the transistors 328 and 330 are turned off. As a result, the decoder 32B outputs, to the column selection line CL2, the selection voltage Vpset (in this example, 6 V) supplied from the voltage selection circuit 31B, and applies the non-selection voltage Vinh (in this example, 3 V) to the column selection line CL3.

As a result, in the memory array unit MAU, as illustrated in FIG. 8, the two memory cells MC6 and MC25 are selected as targets for the set operation OP1.

The memory cell MC6 is the memory cell MC formed in the storage layer L0; therefore, the selection voltage Vpset (in this example, 6 V) applied to the column selection line CL2 is supplied to the terminal TU of the memory cell MC6, and the selection voltage Vnset (in this example, 0 V) applied to the row selection line RL1 is supplied to the terminal TL of the memory cell MC6. As a result, in the memory cell MC6, as illustrated in FIG. 4, the set current Iset (a set current Iset1) flows from the terminal TU toward the terminal TL, thus setting the storage element VR. As illustrated in FIGS. 8, 9A, and 9B, the set current Iset1 flows through the voltage selection circuit 31B, the decoder 32B, the column selection line CL2, the memory cell MC6, the row selection line RL1, the decoder 23A, the current limiting circuit 22A, and the voltage selection circuit 21A in this order.

Meanwhile, the memory cell MC25 is the memory cell MC formed in the storage layer L1; therefore, the selection voltage Vpset (in this example, 6 V) applied to the row selection line RL6 is supplied to the terminal TU of the memory cell MC25, and the selection voltage Vnset (in this example, 0 V) applied to the column selection line CL1 is supplied to the terminal TL of the memory cell MC25. As a result, in the memory cell MC25, the set current Iset (a set current Iset2) flows from the terminal TU toward the terminal TL, thus setting the storage element VR. As illustrated in FIGS. 8, 9A, and 9B, the set current Iset2 flows through the voltage selection circuit 21B, the current limiting circuit 22B, the decoder 23B, the row selection line RL6, the memory cell MC25, the column selection line CL1, the decoder 32A, and the voltage selection circuit 31A in this order.

Thus, in the memory array unit MAU, it is possible to perform the set operation OP1 on two memory cells MC (in this example, MC6 and MC25) at the same time. At the time, as illustrated in FIGS. 8, 9A, and 9B, two current paths different from each other are formed in the memory array unit MAU.

It is to be noted that in this example, an example of performing the set operation OP1 on the memory cells MC6 and MC25 has been described. Alternatively, for example, in a case of performing the set operation OP1 on the memory cells MC5 and MC26, the column selection line driver 30 applies the selection voltage Vpset (in this example, 6 V) to the column selection line CL1, applies the selection voltage Vnset (in this example, 0 V) to the column selection line CL2, and applies the non-selection voltage Vinh (in this example, 3V) to the remaining column selection lines CL0 and CL3. Specifically, in the column selection line driver 30 (FIG. 7), in a case where the high-level logic signal Vgcset0 is supplied from the microcontroller MCON, the transistors 301 and 322 are turned on, thus causing the voltage selection circuit 31A to output the selection voltage Vpset and causing the voltage selection circuit 31B to output the selection voltage Vnset. Then, the decoder 32A applies, to the column selection line CL1, the selection voltage Vpset (in this example, 6 V) supplied from the voltage selection circuit 31A, and the decoder 32B applies, to the column selection line CL2, the selection voltage Vnset (in this example, 0 V) supplied from the voltage selection circuit 31B. Thus, it is possible for the array driver AD to perform the set operation OP1 on the memory cells MC5 and MC26.

In the memory array unit MAU, it is possible to access, at the same time, two memory cells MC that satisfy two conditions as described below. A first condition is that one of the two memory cells MC is coupled to one of the row selection lines RL0 to RL3, and the other is coupled to one of the row selection lines RL4 to RL7. In other words, one of the two memory cells MC is formed in the storage layer L1, and the other is formed in a storage layer L2. In addition, a second condition is that one of the two memory cells MC is coupled to one of the column selection lines CL0 and CL1, and the other is coupled to one of the column selection lines CL2 and CL3. In the storage device 1, it is possible to access the two memory cells MC at the same time as long as the two memory cells MC satisfy these two conditions.

(Reset Operation OP2)

FIG. 10 schematically illustrates an operation in a case of performing the reset operation OP2 on the two memory cells MC6 and MC25. FIGS. 11A and 11B schematically illustrate an operation of the array driver AD in the reset operation OP2. FIG. 11A illustrates an operation of the row selection line driver 20, and FIG. 11B illustrates an operation of the column selection line driver 30. In FIG. 10, the selection line to which the selection voltage Vprst (in this example, 6 V) is applied is indicated by a wide solid line, and the selection line to which the selection voltage Vnrst (in this example, 0 V) is applied is indicated by a wide dashed line.

In the example in FIG. 10, the row selection line driver 20 applies the selection voltage Vprst (in this example, 6 V) to the row selection line RL1, applies the selection voltage Vnrst (in this example, 0 V) to the row selection line RL6, and applies the non-selection voltage Vinh (in this example, 3 V) to the remaining row selection lines RL0, RL2 to RL5, and RL7. In addition, the column selection line driver 30 applies the selection voltage Vprst (in this example, 6 V) to the column selection line CL1, applies the selection voltage Vnrst (in this example, 0 V) to the column selection line CL2, and applies the non-selection voltage Vinh (in this example, 3 V) to the remaining column selection lines CL0 and CL3.

At this time, as illustrated in FIG. 11A, in the voltage selection circuit 21A in the row selection line driver 20, the transistor 202 is turned on while the transistors 201 and 203 are turned off. This causes the voltage selection circuit 21A to output the selection voltage Vprst (in this example, 6 V). Meanwhile, in the voltage selection circuit 21B, the transistor 222 is turned on while the transistors 221 and 223 are turned off. This causes the voltage selection circuit 21B to output the selection voltage Vnrst (in this example, 0 V). In other words, in the row selection line driver 20, the gate of the transistor 202 is supplied with the logic signal Vgrrstb that is the inverted signal of the logic signal Vgrrst, and the gate of the transistor 222 is supplied with the logic signal Vgrrst. This sets the logic signal Vgrrst to the high level, thus turning on the transistors 202 and 222 at the same time. As a result, each of the voltage selection circuits 21A and 21B outputs, out of the two selection voltages Vprst and Vnrst used in the reset operation OP2, one voltage different from the other.

Then, the decoder 23A applies, to the row selection line RL1, the selection voltage Vprst (in this example, 6 V) supplied from the voltage selection circuit 21A via the current limiting circuit 22A, and applies the non-selection voltage Vinh (in this example, 3 V) to the row selection lines RL0, RL2, and RL3. In addition, the decoder 23B applies, to the row selection line RL6, the selection voltage Vnrst (in this example, 0 V) supplied from the voltage selection circuit 21B via the current limiting circuit 22B, and applies the non-selection voltage Vinh (in this example, 3 V) to the row selection lines RL4, RL5, and RL7.

In addition, as illustrated in FIG. 11B, in the voltage selection circuit 31A in the column selection line driver 30, the transistor 303 is turned on while the transistors 301, 302, and 304 to 306 are turned off. This causes the voltage selection circuit 31A to output the selection voltage Vprst (in this example, 6 V). Meanwhile, in the voltage selection circuit 31B, the transistor 324 is turned on while the transistors 321 to 323, 325, and 326 are turned off. This causes the voltage selection circuit 31B to output the selection voltage Vnrst (in this example, 0 V). In other words, in the column selection line driver 30, the gate of the transistor 303 is supplied with the logic signal Vgcrst1b that is the inverted signal of the logic signal Vgcrst1, and the gate of the transistor 324 is supplied with the logic signal Vgcrst1. This sets the logic signal Vgcrst1 to the high level, thus turning on the transistors 303 and 324 at the same time. As a result, each of the voltage selection circuits 31A and 31B outputs, out of the two selection voltages Vprst and Vnrst used in the reset operation OP2, one voltage different from the other.

Then the decoder 32A applies, to the column selection line CL1, the selection voltage Vprst (in this example, 6 V) supplied from the voltage selection circuit 31A, and applies the non-selection voltage Vinh (in this example, 3 V) to the column selection line CL0. In addition, the decoder 32B applies, to the column selection line CL2, the selection voltage Vnrst (in this example, 0 V) supplied from the voltage selection circuit 31B, and applies the non-selection voltage Vinh (in this example, 3 V) to the column selection line CL3.

As a result, in the memory array unit MAU, as illustrated in FIG. 10, the two memory cells MC6 and MC25 are selected as targets for the reset operation OP2.

The memory cell MC6 is the memory cell MC formed in the storage layer L0; therefore, the selection voltage Vnrst (in this example, 0 V) applied to the column selection line CL2 is supplied to the terminal TU of the memory cell MC6, and the selection voltage Vprst (in this example, 6 V) applied to the row selection line RL1 is supplied to the terminal TL of the memory cell MC6. As a result, in the memory cell MC6, as illustrated in FIG. 4, a reset current Irst (a reset current Irst1) flows from the terminal TL toward the terminal TU, thus resetting the storage element VR. As illustrated in FIGS. 10, 11A, and 11B, the reset current Irst1 flows through the voltage selection circuit 21A, the current limiting circuit 22A, the decoder 23A, the row selection line RL1, the memory cell MC6, the column selection line CL2, the decoder 32B, and the voltage selection circuit 31B in this order.

Meanwhile, the memory cell MC25 is the memory cell MC formed in the storage layer L1; therefore, the selection voltage Vnrst (in this example, 0 V) applied to the row selection line RL6 is supplied to the terminal TU of the memory cell MC25, and the selection voltage Vprst (in this example, 6 V) applied to the column selection line CL1 is supplied to the terminal TL of the memory cell MC25. As a result, in the memory cell MC25, the reset current Irst (a reset current Irst2) flows from the terminal TL toward the terminal TU, thus resetting the storage element VR. As illustrated in FIGS. 10, 11A, and 11B, the reset current Irst2 flows through the voltage selection circuit 31A, the decoder 32A, the column selection line CL1, the memory cell MC25, the row selection line RL6, the decoder 23B, the current limiting circuit 22B, and the voltage selection circuit 21B in this order.

Thus, in the memory array unit MAU, it is possible to perform the reset operation OP2 on two memory cells MC (in this example, MC6 and MC25) at the same time. At the time, as illustrated in FIGS. 10, 11A, and 11B, two current paths different from each other are formed in the memory array unit MAU.

(Sense Operation OP3)

FIG. 12 schematically illustrates an operation in a case of performing the sense operation OP3 on the two memory cells MC6 and MC25. FIGS. 13A and 13B schematically illustrate an operation of the array driver AD in the sense operation OP3. FIG. 13A illustrates an operation of the row selection line driver 20, and FIG. 13B illustrates an operation of the column selection line driver 30. In FIG. 12, the selection line to which the selection voltage Vpsns (in this example, 5 V) is applied is indicated by a wide solid line, and the selection line to which the selection voltage Vnsns (in this example, 1 V) is applied is indicated by a wide dashed line.

In the example in FIG. 12, the row selection line driver 20 applies the selection voltage Vnsns (in this example, 1 V) to the row selection line RL1, applies the selection voltage Vpsns (in this example, 5 V) to the row selection line RL6, and applies the non-selection voltage Vinh (in this example, 3 V) to the remaining row selection lines RL0, RL2 to RL5, and RL7. In addition, the column selection line driver 30 applies the selection voltage Vnsns (in this example, 1 V) to the column selection line CL1, applies the selection voltage Vpsns (in this example, 5 V) to the column selection line CL2, and applies the non-selection voltage Vinh (in this example, 3 V) to the remaining column selection lines CL0 and CL3.

At this time, as illustrated in FIG. 13A, in the voltage selection circuit 21A in the row selection line driver 20, the transistor 203 is turned on while the transistors 201 and 202 are turned off. This causes the voltage selection circuit 21A to output the selection voltage Vnsns (in this example, 1 V). Meanwhile, in the voltage selection circuit 21B, the transistor 223 is turned on while the transistors 221 and 222 are turned off. This causes the voltage selection circuit 21B to output the selection voltage Vpsns (in this example, 5 V). In other words, in the row selection line driver 20, the gate of the transistor 203 is supplied with the logic signal Vgrsns, and the gate of the transistor 223 is supplied with the logic signal Vgrsnsb that is the inverted signal of the logic signal Vgrsns. This sets the logic signal Vgrsns to the high level, thus turning on the transistors 203 and 223 at the same time. As a result, each of the voltage selection circuits 21A and 21B outputs, out of the two selection voltages Vpsns and Vnsns used in the sense operation OP3, one voltage different from the other.

Then, the decoder 23A applies, to the row selection line RL1, the selection voltage Vnsns (in this example, 1 V) supplied from the voltage selection circuit 21A via the current limiting circuit 22A, and applies the non-selection voltage Vinh (in this example, 3 V) to the row selection lines RL0, RL2, and RL3. In addition, the decoder 23B applies, to the row selection line RL6, the selection voltage Vpsns (in this example, 5 V) supplied from the voltage selection circuit 21B via the current limiting circuit 22B, and applies the non-selection voltage Vinh (in this example, 3V) to the row selection lines RL4, RL5, and RL7.

In addition, as illustrated in FIG. 13B, in the voltage selection circuit 31A in the column selection line driver 30, the transistor 306 is turned on while the transistors 301 to 305 are turned off. This causes the voltage selection circuit 31A to output the selection voltage Vnsns (in this example, 1 V). Meanwhile, in the voltage selection circuit 31B, the transistor 325 are turned on while the transistors 321 to 324 and 326 are turned off. This causes the voltage selection circuit 31B to output the selection voltage Vpsns (in this example, 5 V). In other words, in the column selection line driver 30, the gate of the transistor 306 is supplied with the logic signal Vgcsns1, and the gate of the transistor 325 is supplied with the logic signal Vgcsns1b that is the inverted signal of the logic signal Vgcsns1. This sets the logic signal Vgcsns1 to the high level, thus turning on the transistors 306 and 325 at the same time. As a result, each of the voltage selection circuits 31A and 31B outputs, out of the two selection voltages Vpsns and Vnsns used in the sense operation OP3, one voltage different from the other.

Then, the decoder 32A applies, to the column selection line CL1, the selection voltage Vnsns (in this example, 1 V) supplied from the voltage selection circuit 31A, and applies the non-selection voltage Vinh (in this example, 3 V) to the column selection line CL0. In addition, the decoder 32B applies, to the column selection line CL2, the selection voltage Vpsns (in this example, 5 V) supplied from the voltage selection circuit 31B, and applies the non-selection voltage Vinh (in this example, 3 V) to the column selection line CL3.

As a result, in the memory array unit MAU, as illustrated in FIG. 12, the two memory cells MC6 and MC25 are selected as targets for the sense operation OP3.

The memory cell MC6 is the memory cell MC formed in the storage layer L0; therefore, the selection voltage Vpsns (in this example, 5 V) applied to the column selection line CL2 is supplied to the terminal TU of the memory cell MC6, and the selection voltage Vnsns (in this example, 1 V) applied to the row selection line RL1 is supplied to the terminal TL of the memory cell MC6. As a result, in the memory cell MC6, as illustrated in FIG. 4, a sense current Isns (a sense current Isns1) flows from the terminal TU toward the terminal TL. As illustrated in FIGS. 12, 13A, and 13B, the sense current Isns1 flows through the voltage selection circuit 31B, the decoder 32B, the column selection line CL2, the memory cell MC6, the row selection line RL1, the decoder 23A, the current limiting circuit 22A, and the voltage selection circuit 21A in this order.

Meanwhile, the memory cell MC25 is the memory cell MC formed in the storage layer L1; therefore, the selection voltage Vpsns (in this example, 5 V) applied to the row selection line RL6 is supplied to the terminal TU of the memory cell MC25, and the selection voltage Vnsns (in this example, 1 V) applied to the column selection line CL1 is supplied to the terminal TL of the memory cell MC25. As a result, in the memory cell MC25, the sense current Isns (a sense current Isns2) flows from the terminal TU toward the terminal TL. As illustrated in FIGS. 12, 13A, and 13B, the sense current Isns2 flows through the voltage selection circuit 21B, the current limiting circuit 22B, the decoder 23B, the row selection line RL6, to the memory cell MC25, to the column selection line CL1, the decoder 32A, and the voltage selection circuit 31A in this order.

Thus, in the memory array unit MAU, it is possible to perform the sense operation OP3 on two memory cells MC (in this example, MC6 and MC25) at the same time. At the time, as illustrated in FIGS. 12, 13A, and 13B, two current paths different from each other are formed in the memory array unit MAU.

In this sense operation OP3, as illustrated in FIG. 13A, in the sense amplifier 24A in the row selection line driver 20, the gate of the transistor 214 is supplied with the signal Vsaen that is an analog voltage. This causes the transistor 214 to function as a current source, and the sense amplifier 24A generates the signal SAout0 through comparing the voltage at the node N23A and the voltage Vref. This signal SAout0 corresponds to the resistance state RS of the storage element VR in the memory cell MC6. In other words, in the foregoing description, for convenience of description, the voltage at the row selection line RL1 is described as 1 V. However, actually, the current limiting circuit 22A limits the current value of the current flowing from the decoder 23A to the voltage selection circuit 21A; therefore, the voltage at the row selection line RL1 becomes a voltage higher than 1 V corresponding to the resistance state RS of the storage element VR in the memory cell M6. This makes it possible for the sense amplifier 24A to read data stored in the memory cell MC6 through comparing the voltage at the node N23A and the voltage Vref.

Likewise, in the sense amplifier 24B, the gate of the transistor 234 is supplied with the signal Vsaen that is an analog voltage. This causes the sense amplifier 24B to generate the signal SAout1 through comparing the voltage at the node N23B and the voltage Vref. This signal SAout1 corresponds to the resistance state RS of the storage element VR in the memory cell MC25. In other words, in the foregoing description, for convenience of description, the voltage at the row selection line RL6 is described as 5 V. However, actually, the current limiting circuit 22B limits the current value of the current flowing from the voltage selection circuit 21B to the decoder 23B; therefore, the voltage at the row selection line RL6 becomes a voltage lower than 5 V corresponding to the resistance state RS of the storage element VR in the memory cell MC25. This makes it possible for the sense amplifier 24B to read data stored in the memory cell MC25 through comparing the voltage at the node N23B and the voltage Vref.

Thus, in the storage device 1, the row selection line driver 20 is configured using dual drivers 20A and 20B, to cause these dual drivers 20A and 20B to output selection voltages different from each other. In addition, the column selection line driver 30 is configured using two drivers 30A and 30B, to cause these two drivers 30A and 30B to output voltages different from each other. This allows the storage device 1 to access two memory cells MC at the same time. Particularly, in a case of accessing two memory cells MC, two current paths different from each other are formed in the storage device 1. This makes it possible to increase reliability in the data write operation and the data read operation in the storage device 1, as compared to a comparative example described below.

In addition, in the storage device 1, as illustrated in FIGS. 3 and 6, the decoder 23A drives the row selection lines RL0 to RL3 formed in the same layer. Accordingly, the voltage selection circuit 21A, which supplies the selection voltage to the decoder 23A, does not necessarily output the selection voltages Vpset, Vnrst, and Vpsns, thus making it possible to reduce the number of transistors. In other words, the row selection lines RL0 to RL3 are coupled to the terminals TL of the 16 memory cells MC0 to MC15 stored in the storage layer L0. Thus, to the row selection line RL related to the selected memory cell MC of the row selection lines RL0 to RL3, the decoder 23A applies the selection voltage Vnset in the set operation OP1, applies the selection voltage Vprst in the reset operation OP2, and applies the selection voltage Vnsns in the sense operation OP3. In other words, the decoder 23A does not apply the selection voltage Vpset, Vnrst, or Vpsns to the row selection line RL related to the selected memory cell MC. Accordingly, the voltage selection circuit 21A does not necessarily output the selection voltages Vpset, Vnrst, and Vpsns, thus making it possible to reduce the number of transistors, as compared to the voltage selection circuits 31A and 31B (FIG. 7) that output the six selection voltages Vpset, Vnset, Vprst, Vnrst, Vpsns, and Vnsns. Likewise, as illustrated in FIGS. 3 and 6, the decoder 23B drives the row selection lines RL4 to RL7 formed in the same layer, and accordingly, the voltage selection circuit 21B does not necessarily output the selection voltages Vnset, Vprst, and Vnsns, thus making it possible to reduce the number of transistors.

Comparative Example

Next, a storage device 1R according to a comparative example is described. In the storage device 1R, a row selection line driver is configured using a single driver, and a column selection line driver is configured using a single driver. As with the storage device 1 (FIG. 1) according to the present embodiment, the storage device 1R includes a memory array unit MAUR. As with the memory array unit MAU (FIG. 2) according to the present embodiment, the memory array unit MAUR includes a row selection line driver 20R and a column selection line driver 30R.

FIG. 14 illustrates a configuration example of the row selection line driver 20R. The row selection line driver 20R includes a voltage selection circuit 21R, a current limiting circuit 22R, a decoder 23R, and a sense amplifier 24R. In addition, although not illustrated, the row selection line driver 20A also includes an inverting circuit that respectively generates, on the basis of logic signals Vgrset0, Vgrset1, Vgrrst0, Vgrrst1, Vgrsns0, Vgrsns1, and Vgr0 to Vgr7 supplied from the microcontroller MCON, logic signals Vgrset0b, Vgrset1b, Vgrrst0b, Vgrrst1b, Vgrsns0b, Vgrsns1b, and Vgr0b to Vgr7b each of which is the inverted signal of a corresponding one of these logic signals.

The voltage selection circuit 21R outputs one of the selection voltages Vpset, Vnset, Vprst, Vnrst, Vpsns, and Vnsns on the basis of the logic signals Vgrset0, Vgrset1, Vgrrst0, Vgrrst1, Vgrsns0, and Vgrsns1 supplied from the microcontroller MCON. The voltage selection circuit 21R includes transistors 251 to 256. The transistors 251, 253, and 255 are p-type MOS transistors, and the transistors 252, 254, and 256 are n-type MOS transistors. The transistor 251 has a gate supplied with the logic signal Vgcset1b that is the inverted signal of the logic signal Vgrset1, a source supplied with the selection voltage Vpset (for example, 6 V), and a drain coupled to a node N21R. The transistor 252 has a gate supplied with the logic signal Vgrset0, a source supplied with the selection voltage Vnset (for example, 0 V), and a drain coupled to the node N21R. The transistor 253 has a gate supplied with the logic signal Vgrrst0b that is the inverted signal of the logic signal Vgrrst0, a source supplied with the selection voltage Vprst (for example, 6 V), and a drain coupled to the node N21R. The transistor 254 has a gate supplied with the logic signal Vgrrst1, a source supplied with the selection voltage Vnrst (for example, 0 V), and a drain coupled to the node N21R. The transistor 255 has a gate supplied with the logic signal Vgrsns1b that is the inverted signal of the logic signal Vgrsns1, a source supplied with the selection voltage Vpsns (for example, 5 V), and a drain coupled to the node N21R. The transistor 256 has a gate supplied with the logic signal Vgrsns0, a source supplied with the selection voltage Vnsns (for example, 1 V), and a drain coupled to the node N21R.

The current limiting circuit 22R limits the current value of a current flowing between the voltage selection circuit 21R and the decoder 23R, on the basis of the signals Vpcmp and Vncmp supplied from the microcontroller MCON. The current limiting circuit 22R includes transistors 257 and 258. The transistor 257 is a p-type MOS transistor, and the transistor 258 is an n-type MOS transistor. The transistor 257 has a gate supplied with the signal Vpcmp, a source coupled to the node N21R, and a drain coupled to a node N23R. The transistor 258 has a gate supplied with the signal Vncmp, a source coupled to the node N21R, and a drain coupled to the node N23R.

In the set operation OP1, in a case where the voltage selection circuit 21R outputs the selection voltage Vpset (for example, 6 V), the current limiting circuit 22R limits, on the basis of the signal Vpcmp that is an analog voltage supplied from the microcontroller MCON, the current value of the current flowing from the voltage selection circuit 21R to the decoder 23R to a predetermined current value (for example, 10 uA) or smaller. In addition, in the set operation OP1, in a case where the voltage selection circuit 21R outputs the selection voltage Vnset (for example, 0 V), the current limiting circuit 22R limits, on the basis of the signal Vncmp that is an analog voltage supplied from the microcontroller MCON, the current value of the current flowing from the decoder 23R to the voltage selection circuit 21R to a predetermined current value (for example, 10 uA) or smaller. In addition, in the reset operation OP2, in a case where the voltage selection circuit 21R outputs the selection voltage Vprst (for example, 6 V), the current limiting circuit 22R operates not to limit the current, on the basis of the low-level signal Vpcmp supplied from the microcontroller MCON. In addition, in the reset operation OP2, in a case where the voltage selection circuit 21R outputs the selection voltage Vnrst (for example, 0 V), the current limiting circuit 22R operates not to limit the current, on the basis of the high-level signal Vncmp supplied from the microcontroller MCON. In addition, in the sense operation OP3, in a case where the voltage selection circuit 21R outputs the selection voltage Vpsns (for example, 5 V), the current limiting circuit 22R limits, on the basis of the signal Vpcmp that is an analog voltage supplied from the microcontroller MCON, the current value of the current flowing from the voltage selection circuit 21R to the decoder 23R to a predetermined current value (for example, 1 uA) or smaller. In addition, in the sense operation OP3, in a case where the voltage selection circuit 21R outputs the selection voltage Vnsns (for example, 1 V), the current limiting circuit 22R limits, on the basis of the signal Vncmp that is an analog voltage supplied from the microcontroller MCON, the current value of the current flowing from the decoder 23R to the voltage selection circuit 21R to a predetermined current value (for example, 1 uA) or smaller.

The decoder 23R selectively applies, to the row selection lines RL0 to RL7, the selection voltage supplied from the voltage selection circuit 21R via the current limiting circuit 22R, on the basis of the logic signals Vgr0 to Vgr7 supplied from the microcontroller MCON. The decoder 23R includes transistors 259 to 274. The transistors 259 to 274 are n-type MOS transistors. The transistor 259 has a gate supplied with the logic signal Vgr0, a source coupled to the node N23R, and a drain coupled to a drain of the transistor 260 and the row selection line RL0. The transistor 260 has a gate supplied with the logic signal Vgr0b that is the inverted signal of the logic signal Vgr0, a source supplied with the non-selection voltage Vinh (for example, 3 V), and the drain coupled to the drain of the transistor 259 and the row selection line RL0. The transistor 261 has a gate supplied with the logic signal Vgr1b that is the inverted signal of the logic signal Vgr1, a source supplied with the non-selection voltage Vinh (for example, 3 V), and a drain coupled to a drain of the transistor 262 and the row selection line RL1. The transistor 262 has a gate supplied with the logic signal Vgr1, a source coupled to the node N23R, and the drain coupled to the drain of the transistor 261 and the row selection line RL1. The same applies to the transistors 263 to 274.

As with the sense amplifiers 24A and 24B (FIG. 6), the sense amplifier 24R determines the resistance state RS of the memory cell MC on the basis of the signal Vsaen supplied from the microcontroller MCON. The sense amplifier 24R has a configuration similar to those of the sense amplifiers 24A and 24B. The sense amplifier 24R includes transistors 275 to 279. For example, the transistors 275 to 279 respectively correspond to the transistors 214 to 218 in the sense amplifier 24A.

FIG. 15 illustrates a configuration example of the column selection line driver 30R. The column selection line driver 30R includes a voltage selection circuit 31R and a decoder 32R. In addition, although not illustrated, the column selection line driver 30R also includes an inverting circuit that respectively generates, on the basis of the logic signals Vgcset0, Vgcset1, Vgcrst0, Vgcrst1, Vgcsns0, Vgcsns1, and Vgc0 to Vgc3 supplied from the microcontroller MCON, the logic signals Vgcset0b, Vgcset1b, Vgcrst0b, Vgcrst1b, Vgcsns0b, Vgcsns1b, and Vgc0b to Vgc3b each of which is the inverted signal of a corresponding one of these logic signals.

The voltage selection circuit 31R outputs one of the selection voltages Vpset, Vnset, Vprst, Vnrst, Vpsns, and Vnsns on the basis of the logic signals Vgcset0, Vgcset1, Vgcrst0, Vgcrst1, Vgcsns0, and Vgcsns1 supplied from the microcontroller MCON. The voltage selection circuit 31R has a configuration similar to that of the voltage selection circuit 31A (FIG. 7). The voltage selection circuit 31R includes transistors 351 to 356. The transistors 351 to 356 respectively correspond to the transistors 301 to 306 in the voltage selection circuit 31A. The drains of the transistors 351 to 356 are coupled to the node N32R.

The decoder 32R selectively applies, to the column selection lines CL0 to CL3, the selection voltage supplied from the voltage selection circuit 31R, on the basis of the logic signals Vgc0 to Vgc3 supplied from the microcontroller MCON. The decoder 32R includes transistors 357 to 364. The transistors 357 to 364 are n-type MOS transistors. The transistor 357 has a gate supplied with the logic signal Vgc0, a source coupled to the node N32R, and a drain coupled to a drain of the transistor 358 and the column selection line CL0. The transistor 358 has a gate supplied with the logic signal Vgc0b that is the inverted signal of the logic signal Vgc0, a source supplied with the non-selection voltage Vinh (for example, 3 V), and the drain coupled to the drain of the transistor 357 and the column selection line CL0. The transistor 359 has a gate supplied with the logic signal Vgc1b that is the inverted signal of the logic signal Vgc1, a source supplied with the non-selection voltage Vinh (for example, 3 V), and a drain coupled to a drain of the transistor 360 and the column selection line CL1. The transistor 360 has a gate supplied with the logic signal Vgc1, a source coupled to the node N32R, and the drain coupled to the drain of the transistor 359 and the column selection line CL1. The same applies to the transistors 361 to 364.

FIG. 16 schematically illustrates an operation in a case of performing the set operation OP1 on two memory cells MC5 and MC6. In FIG. 16, the selection line to which the selection voltage Vpset (in this example, 6 V) is applied is indicated by a wide solid line, and the selection line to which the selection voltage Vnset (in this example, 0 V) is applied is indicated by a wide dashed line.

In this example, the row selection line driver 20R applies the selection voltage Vnset (in this example, 0 V) to the row selection line RL1, and applies the non-selection voltage Vinh (in this example, 3 V) to the remaining row selection lines RL0 and RL2 to RL7. In addition, the column selection line driver 30R applies the selection voltage Vpset (in this example, 6 V) to the column selection lines CL1 and CL2, and applies the non-selection voltage Vinh (in this example, 3 V) to the remaining column selection lines CL0 and CL3.

As a result, in the memory array unit MAUR, as illustrated in FIG. 16, the two memory cells MC5 and MC6 are selected as targets for the set operation OP1.

At this time, the set current Iset (the set current Iset1) for setting the storage element VR in the memory cell MC5 flows through the voltage selection circuit 31R, the decoder 32R, the column selection line CL1, the memory cell MC5, the row selection line RL1, the decoder 23R, the current limiting circuit 22R, and the voltage selection circuit 21R. In addition, the set current Iset (the set current Iset2) for setting the storage element VR in the memory cell MC6 flows through the voltage selection circuit 31R, the decoder 32R, the column selection line CL2, the memory cell MC6, the row selection line RL1, the decoder 23R, the current limiting circuit 22R, and the voltage selection circuit 21R. Thus, the currents for setting the two memory cells MC flow through the row selection line RL1, the voltage selection circuit 31R, the current limiting circuit 22R, and the voltage selection circuit 21R, which causes a possibility that a larger voltage drops and the storage elements VR in the memory cells MC5 and MC6 are not settable sufficiently. In addition, for example, in a case where there is a variation in the characteristics of the memory cells MC5 and MC6 due to process variation, there is a possibility that the current flows intensively to one of the memory cells MC5 and MC6. In this case, there is a possibility that the storage element VR in the other of the memory cells MC5 and MC6 is not sufficiently set. It is to be noted that in this example, the set operation OP1 has been described, but the same applies to the reset operation OP2. Thus, in the storage device 1R according to the comparative example, there is a possibility of decreasing reliability in the data write operation.

In contrast, in the storage device 1 according to the present embodiment, the row selection line driver 20 is configured using the dual drivers 20A and 20B, to cause these dual drivers 20A and 20B to output voltages different from each other. In addition, the column selection line driver 30 is configured using the dual drivers 30A and 30B, to cause these dual drivers 30A and 30B to output voltages different from each other. Accordingly, in the memory array unit MAU, in a case where two memory cells MC are accessed at the same time in the set operation OP1 (for example, FIGS. 8, 9A, and 9B) and the reset operation OP2 (for example, FIGS. 10, 11A, and 11B), two current paths different from each other are formed. For example, this prevents the currents related to the two memory cells MC from flowing to one circuit, one row selection line RL, one column selection line CL, and so on, thus making it possible to suppress a voltage drop, and to reduce a possibility of occurrence of a write error.

Furthermore, in the storage device 1, in the memory array unit MAU, in a case where two memory cells MC are accessed at the same time in the sense operation OP3 (for example, FIGS. 12, 13A, and 13B), two current paths different from each other are formed. This makes it possible to suppress a voltage drop, and to reduce a possibility of occurrence of a read error.

Thus, in the storage device 1, it is possible to suppress a voltage drop, thus making it possible to reduce the possibility of occurrence of the write error and the read error. As a result, it is possible to increase reliability in the data write operation and the data read operation.

In addition, in the storage device 1, it is thus possible to increase reliability, thus making it possible to reduce write delay time in the data write operation. As a result, this makes it possible to increase data transfer speed in the write operation. In addition, increasing a read current makes it possible to reduce read delay time in the data read operation. As a result, it is possible to increase data transfer speed in the read operation. In addition, for example, miniaturizing the memory cell MC or increasing the number of stacked layers allows for reduction in cost per bit.

[Effects]

As described above, in the present embodiment, the row selection line driver is configured using dual drivers, to cause these dual drivers to output selection voltages different from each other, while the column selection line driver is configured using dual drivers, to cause these dual drivers to output selection voltages different from each other. In a case where two memory cells are accessed at the same time, two current paths different from each other are formed, thus making it possible to increase reliability in the data write operation and the data read operation. In addition, for example, it is possible to increase reliability in this manner, thus making it possible to increase the data transfer speed in the data write operation and the data read operation, or to reduce cost per bit.

Modification Example 1-1

In the foregoing embodiment, two memory cells MC are accessed at the same time, but it is not necessary to constantly access two memory cells MC at the same time. For example, only one memory cell MC may be accessed where necessary, or three or more memory cells MC may be accessed at the same time where necessary. In the following, the present modification example is described in detail.

FIG. 17 schematically illustrates an operation in a case of performing the set operation OP1 on one memory cell MC (in this example, the memory cell MC 6). FIGS. 18A and 18B schematically illustrate an operation of the array driver AD in the set operation OP1. FIG. 18A illustrates an operation of the row selection line driver 20, and FIG. 18B illustrates an operation of the column selection line driver 30. FIGS. 17, 18A, and 18B respectively correspond to FIGS. 8, 9A, and 9B according to the foregoing embodiment.

In the example in FIG. 17, the row selection line driver 20 applies the selection voltage Vnset (in this example, 0 V) to the row selection line RL1, and applies the non-selection voltage Vinh (in this example, 3 V) to the remaining row selection lines RL0 and RL2 to RL7. In addition, the column selection line driver 30 applies the selection voltage Vpset (in this example, 6 V) to the column selection line CL2, and applies the non-selection voltage Vinh (in this example, 3 V) to the remaining column selection lines CL0, CL1, and CL3.

At this time, as illustrated in FIG. 18A, in the voltage selection circuit 21A in the row selection line driver 20, the transistor 201 is turned on while the transistors 202 and 203 are turned off. This causes the voltage selection circuit 21A to output the selection voltage Vnset (in this example, 0 V). Meanwhile, in the voltage selection circuit 21B, the transistor 221 is turned on while the transistors 222 and 223 are turned off. This causes the voltage selection circuit 21B to output the selection voltage Vpset (in this example, 6 V).

Then, in the decoder 23A, the transistors 207, 209, 211, and 212 are turned on while the transistors 206, 208, 210, and 213 are turned off. As a result, the decoder 23A applies, to the row selection line RL1, the selection voltage Vnset (in this example, 0 V) supplied from the voltage selection circuit 21A via the current limiting circuit 22A, and applies the non-selection voltage Vinh (in this example, 3 V) to the row selection lines RL0, RL2, and RL3.

In addition, in the decoder 23B, the transistors 227, 228, 231, and 232 are turned on while the transistors 226, 229, 230, and 233 are turned off. In other words, in the example (FIG. 9A) in the foregoing embodiment, the transistor 230 is turned on while the transistor 231 is turned off, but in the present modification example (FIG. 18A), the transistor 231 is turned on while the transistor 230 is turned off. As a result, the decoder 23B applies the non-selection voltage Vinh (in this example, 3 V) to four row selection lines RL4 to RL7.

In addition, as illustrated in FIG. 18B, in the voltage selection circuit 31A in the column selection line driver 30, the transistor 302 is turned on while the transistors 301 and 303 to 306 are turned off. This causes the voltage selection circuit 31A to output the selection voltage Vnset (in this example, 0 V). Meanwhile, in the voltage selection circuit 31B, the transistor 321 is turned on while the transistors 322 to 326 are turned off. This causes the voltage selection circuit 31B to output the selection voltage Vpset (in this example, 6 V).

Then, in the decoder 32A, the transistors 308 and 309 are turned on while the transistors 307 and 310 are turned off. In other words, in the example (FIG. 9B) in the foregoing embodiment, the transistor 310 is turned on while the transistor 309 is turned off, but in the present modification example (FIG. 18B), the transistor 309 is turned on while the transistor 310 is turned off. As a result, the decoder 32A applies the non-selection voltage Vinh (in this example, 3 V) to two column selection lines CL0 and CL1.

In addition, in the decoder 32B, the transistors 327 and 329 are turned on while the transistors 328 and 330 are turned off. As a result, the decoder 32B applies, to the column selection line CL2, the selection voltage Vpset (in this example, 6 V) supplied from the voltage selection circuit 31B, and applies the non-selection voltage Vinh (in this example, 3 V) to the column selection line CL3.

As a result, in the memory array unit MAU, as illustrated in FIG. 17, one memory cell MC6 is selected as a target for the set operation OP1. Then, in the memory array unit MAU, as illustrated in FIGS. 17, 18A, and 18B, the set current Iset (the set current Iset1) through the voltage selection circuit 31B, the decoder 32B, the column selection line CL2, the memory cell MC6, the row selection line RL1, the decoder 23A, the current limiting circuit 22A, and the voltage selection circuit 21A in this order.

Next, an example of a case of accessing three or more memory cells MC at the same time is described in detail.

FIG. 19 schematically illustrates an operation in a case of performing the set operation OP1 on six memory cells MC (in this example, the memory cells MC6, MC7, MC10, MC11, MC21, and MC25). FIGS. 20A and 20B schematically illustrate an operation of the array driver AD in the set operation OP1. FIG. 20A illustrates an operation of the row selection line driver 20, and FIG. 20B illustrates an operation of the column selection line driver 30. FIGS. 19, 20A, and 20B respectively correspond to FIGS. 8, 9A, and 9B.

In the example in FIG. 19, the row selection line driver 20 applies the selection voltage Vnset (in this example, 0 V) to the row selection lines RL1 and RL2, applies the selection voltage Vpset (in this example, 6 V) to the row selection lines RL5 and RL6, and applies the non-selection voltage Vinh (in this example, 3 V) to the remaining row selection lines RL0, RL3, RL4, and RL7. In addition, the column selection line driver 30 applies the selection voltage Vpset (in this example, 6 V) to the column selection lines CL2 and CL3, applies the selection voltage Vnset (in this example, 0 V) to the column selection line CL1, and applies the non-selection voltage Vinh (in this example, 3 V) to the remaining column selection line CL0.

At this time, as illustrated in FIG. 20A, in the decoder 23A in the row selection line driver 20, the transistors 207, 209, 210, and 212 are turned on while the transistors 206, 208, 211, and 213 are turned off. As a result, the decoder 23A applies, to the row selection lines RL1 and RL2, the selection voltage Vnset (in this example, 0 V) supplied from the voltage selection circuit 21A via the current limiting circuit 22A, and applies the non-selection voltage Vinh (in this example, 3 V) to the row selection lines RL0 and RL3.

In addition, in the decoder 23B, the transistors 227, 229, 230, and 232 are turned on while the transistors 226, 228, 231, and 233 are turned off. As a result, the decoder 23B applies, to the row selection lines RL5 and RL6, the selection voltage Vpset (in this example, 6 V) supplied from the voltage selection circuit 21B via the current limiting circuit 22B, and applies the non-selection voltage Vinh (in this example, 3 V) to the row selection lines RL4 and RL7.

In addition, as illustrated in FIG. 20B, in the decoder 32A in the column selection line driver 30, the transistors 308 and 310 are turned on while the transistors 307 and 309 are turned off. As a result, the decoder 32A applies the selection voltage Vnset (in this example, 0 V) to the column selection line CL1, and applies the non-selection voltage Vinh (in this example, 3 V) to the column selection line CL0.

In addition, in the decoder 32B, the transistors 327 and 330 are turned on while the transistors 328 and 329 are turned off. As a result, the decoder 32B applies, to the column selection lines CL2 and CL3, the selection voltage Vpset (in this example, 6 V) supplied from the voltage selection circuit 31B.

As a result, in the memory array unit MAU, as illustrated in FIG. 19, six memory cells MC6, MC7, MC10, MC11, MC21, and MC25 are selected as targets for the set operation OP1. At this time, a total current of a set current Iset5 related to the memory cell MC21 and a set current Iset6 related to the memory cell MC25 flows through the column selection line CL1, a total current of the set current Iset1 related to the memory cell MC6 and a set current Iset3 related to the memory cell MC10 flows through the column selection line CL2, and a total current of the set current Iset2 related to the memory cell MC7 and a set current Iset4 related to the memory cell MC11 flows through the column selection line CL3. In addition, a total current of the set currents Iset1 and Iset2 flows through the row selection line RL1, a total current of the set currents Iset3 and Iset4 flows through the row selection line RL2, the set current Iset5 flows through the row selection line RL5, and the set current Iset6 flows through the row selection line RL6.

In this case, compared to the case of selecting two memory cells MC as in the set operation OP1 (FIGS. 8, 9A, and 9B) according to the foregoing embodiment, for example, a significant voltage may drop due to the row selection lines RL1 and RL2 and the column selection lines CL1 to CL3. However, for example, if a write error is at an acceptable level, the operation may be performed in this manner.

In other words, for example, in a case of performing the set operation OP1 on the six memory cells MC using the storage device 1R according to the foregoing comparative example, as illustrated in FIG. 21, for example, it is possible to select the memory cells MC5 to MC7 and MC9 to MC11. At this time, a total current of the set current Iset1 related to the memory cell MC5 and the set current Iset4 related to the memory cell MC9 flows through the column selection line CL1, a total current of the set current Iset2 related to the memory cell MC6 and the set current Iset5 related to the memory cell MC10 flows through the column selection line CL2, and a total current of the set current Iset3 related to the memory cell MC7 and the set current Iset6 related to the memory cell MC11 flows through the column selection line CL3. In addition, a total current of the set currents Iset1 to Iset3 flows through the row selection line RL1, and a total current of the set currents Iset4 to Iset6 flows through the row selection line RL2. Thus, in this example, for example, the currents related to three memory cells MC5, MC6, and MC7 flow through the row selection line RL1, and for example, the currents related to three memory cells MC9, MC10, and MC11 flow through the row selection line RL2, thus causing a possibility that a significant voltage drops. In contrast, in the storage device 1 (FIG. 19), for example, the currents related to the two memory cells MC5 and MC6 flow through the row selection line RL1.

Thus, in the storage device 1, even in a case of accessing three or more memory cells MC at the same time, it is possible to suppress an amount of the current flowing through one row selection line RL or one column selection line CL. This makes it possible to increase reliability in the data write operation and the data read operation. [Modification Example 1-2]

In the foregoing embodiment, the row selection line driver 20 applies the non-selection voltage Vinh (for example, 3 V) to the row selection line RL that is not selected from the row selection lines RL0 to RL7, and the column selection line driver 30 applies the non-selection voltage Vihn (for example, 3 V) to the column selection line CL that is not selected from the column selection lines CL0 to CL3, but this is not limitative. Alternatively, the row selection line RL and the column selection line CL that are not selected may be set to a floating state. In the following, a storage device 1A according to the present modification example is described in detail.

As with the storage device 1 (FIG. 1) according to the foregoing embodiment, the storage device 1A includes a memory array unit MAUL As with the memory array unit MAU (FIG. 2) according to the foregoing embodiment, the memory array unit MAU1, includes an array driver AD1 that includes a row selection line driver 40 and a column selection line driver 50.

FIG. 22 illustrates a configuration example of the row selection line driver 40. The row selection line driver 40 includes decoders 43A and 43B. The decoder 43A corresponds to the decoder 23A (FIG. 6) according to the foregoing embodiment from which the four transistors 207, 208, 211, and 212 are omitted. Likewise, the decoder 43B corresponds to the decoder 23B (FIG. 6) according to the foregoing embodiment from which the four transistors 227, 228, 231, and 232 are omitted. The voltage selection circuit 21A, the current limiting circuit 22A, the decoder 43A, and the sense amplifier 24A are included in a driver 40A, and the voltage selection circuit 21B, the current limiting circuit 22B, the decoder 43B, and the sense amplifier 24B are included in a driver 40B.

FIG. 23 illustrates a configuration example of the column selection line driver 50. The column selection line driver 50 includes decoders 52A and 52B. The decoder 52A corresponds to the decoder 32A (FIG. 7) according to the foregoing embodiment from which the two transistors 308 and 309 are omitted. Likewise, the decoder 52B corresponds to the decoder 32B (FIG. 7) according to the foregoing embodiment from which the two transistors 328 and 329 are omitted. The voltage selection circuit 31A and the decoder 52A are included in a driver 50A, and the voltage selection circuit 31B and the decoder 52B are included in a driver 50B.

In the storage device 1A, this configuration makes it possible to reduce the number of transistors. As the number of the row selection lines RL and the number of the column selection lines CL are larger, the present modification example is more effective.

Modification Example 1-3

In the foregoing embodiment, as illustrated in FIG. 6, the voltage selection circuits 21A and 21B in the row selection line driver 20 supply the selection voltage to the decoders 23A and 23B, and as illustrated in FIG. 7, the voltage selection circuits 31A and 31B in the column selection line driver 30 supply the selection voltage to the decoders 32A and 32B, but this is not limitative. Alternatively, for example, the voltage selection circuits 31A and 31B may be omitted and the voltage selection circuits 21A and 21B may supply the selection voltage to the decoders 23A and 23B and the decoders 32A and 32B, or the voltage selection circuits 21A and 21B may be omitted and the voltage selection circuits 31A and 31B may supply the selection voltage to the decoders 23A and 23B and the decoders 32A and 32B. In the following, an example in which the voltage selection circuits 21A and 21B supply the selection voltage to the decoders 23A and 23B and the decoders 32A and 32B is described in detail.

As with the storage device 1 (FIG. 1) according to the foregoing embodiment, a storage device 1B according to the present modification example includes a memory array unit MAU2. As with the memory array unit MAU (FIG. 2) according to the foregoing embodiment, the memory array unit MAU2, includes an array driver AD2 that includes a row selection line driver 60 and a column selection line driver 70.

FIG. 24 illustrates a configuration example of the row selection line driver 60. The row selection line driver 60 includes the voltage selection circuits 21A and 21B. The voltage selection circuit 21A also supplies the selection voltage to the column selection line driver 70, and the voltage selection circuit 21B also supplies the selection voltage to the column selection line driver 70. The voltage selection circuit 21A, the current limiting circuit 22A, the decoder 23A, and the sense amplifier 24A are included in a driver 60A, and the voltage selection circuit 21B, the current limiting circuit 22B, the decoder 23B, and the sense amplifier 24B are included in a driver 60B.

FIG. 25 illustrates a configuration example of the column selection line driver 70. The column selection line driver 70 includes transistors 71 to 74. In addition, although not illustrated, the column selection line driver 70 also includes an inverting circuit that respectively generates, on the basis of logic signals Vgsw and Vgc0 to Vgc3 supplied from the microcontroller MCON, logic signals Vgswb and Vgc0b to Vgc3b each of which is an inverted signal of a corresponding one of these logic signals.

The transistor 71 has a gate supplied with the logic signal Vgswb that is the inverted signal of the logic signal Vgsw, a source coupled to the node N21A of the voltage selection circuit 21A, and a drain coupled to the node N32A. The transistor 72 has a gate supplied with the logic signal Vgswb that is the inverted signal of the logic signal Vgsw, a source coupled to the node N21B of the voltage selection circuit 21B, and a drain coupled to the node N32B. The transistor 73 has a gate supplied with the logic signal Vgsw, a source coupled to the node N21A of the voltage selection circuit 21A, and a drain coupled to the node N32B. The transistor 74 has a gate supplied with the logic signal Vgsw, a source coupled to the node N21B of the voltage selection circuit 21B, and a drain coupled to the node N32A. The decoder 32A is included in a driver 70A, and the decoder 32B is included in a driver 70B.

Here, a circuit including the transistors 71 to 74 correspond to a specific example of a "fifth supply section" in the present disclosure. The logic signals Vgsw and Vgswb correspond to a specific example of a "fifth selection signal line" in the present disclosure.

Next, as in the case illustrated in FIG. 8, an operation of the array driver AD2 in a case of performing the set operation OP1 on the two memory cells MC6 and MC25 is described.

FIGS. 26A and 26B schematically illustrate an operation of the array driver AD2 in the set operation OP1. FIG. 26A illustrates an operation of the row selection line driver 60, and FIG. 26B illustrates an operation of the column selection line driver 70.

In this example, as illustrated in FIG. 8, the row selection line driver 60 applies the selection voltage Vnset (in this example, 0 V) to the row selection line RL1, applies the selection voltage Vpset (in this example, 6 V) to the row selection line RL6, and applies the non-selection voltage Vinh (in this example, 3 V) to the remaining row selection lines RL0, RL2 to RL5, and RL7. In addition, the column selection line driver 70 applies the selection voltage Vnset (in this example, 0 V) to the column selection line CL1, applies the selection voltage Vpset (in this example, 6 V) to the column selection line CL2, and applies the non-selection voltage Vinh (in this example, 3 V) to the remaining column selection lines CL0 and CL3.

At this time, as illustrated in FIG. 26A, in the voltage selection circuit 21A in the row selection line driver 60, the transistor 201 is turned on while the transistors 202 and 203 are turned off. This causes the voltage selection circuit 21A to output the selection voltage Vnset (in this example, 0 V). Then, the voltage selection circuit 21A supplies the selection voltage Vnset (in this example, 0 V) to the decoder 23A via the current limiting circuit 22A, and to the column selection line driver 70. Meanwhile, in the voltage selection circuit 21B, the transistor 221 is turned on while the transistors 222 and 223 are turned off. This causes the voltage selection circuit 21B to output the selection voltage Vpset (in this example, 6 V). Then, the voltage selection circuit 21B supplies the selection voltage Vpset (in this example, 6 V) to the decoder 23B via the current limiting circuit 22B, and to the column selection line driver 70.

The decoder 23A applies, to the row selection line RL1, the selection voltage Vnset (in this example, 0 V) supplied from the voltage selection circuit 21A via the current limiting circuit 22A, and applies the non-selection voltage Vinh (in this example, 3 V) to the row selection lines RL0, RL2, and RL3. In addition, the decoder 23B applies, to the row selection line RL6, the selection voltage Vpset (in this example, 6 V) supplied from the voltage selection circuit 21B via the current limiting circuit 22B, and applies the non-selection voltage Vinh (in this example, 3V) to the row selection lines RL4, RL5, and RL7.

In addition, as illustrated in FIG. 26B, in the column selection line driver 70, the transistors 71 and 72 are turned on while the transistors 73 and 74 are turned off. Accordingly, the decoder 32A is supplied with the selection voltage Vnset (for example, 0 V) outputted by the voltage selection circuit 21A, and the decoder 32B is supplied with the selection voltage Vpset (for example, 6 V) outputted by the voltage selection circuit 21B.

Then, the decoder 32A applies, to the column selection line CL1, the selection voltage Vnset (in this example, 0 V) supplied from the voltage selection circuit 21A, and applies the non-selection voltage Vinh (in this example, 3 V) to the column selection line CL0. In addition, the decoder 32B applies, to the column selection line CL2, the selection voltage Vpset (in this example, 6 V) supplied from the voltage selection circuit 21B, and applies the non-selection voltage Vinh (in this example, 3 V) to the column selection line CL3.

As a result, in the memory array unit MAU2, as illustrated in FIG. 8, the two memory cells MC6 and MC25 are selected as targets for the set operation OP1.

It is to be noted that in this example, an example of performing the set operation OP1 on the memory cells MC6 and MC25 has been described. Alternatively, for example, in a case of performing the set operation OP1 on the memory cells MC5 and MC26, in the column selection line driver 70, the transistors 73 and 74 are turned on while the transistors 71 and 72 are turned off. Accordingly, the decoder 32A is supplied with the selection voltage Vpset (for example, 6 V) outputted by the voltage selection circuit 21B in the row selection line driver 60, and the decoder 32B is supplied with the selection voltage Vnset (for example, 0 V) outputted by the voltage selection circuit 21A in the row selection line driver 60. This causes the decoder 32A to apply, to the column selection line CL1, the selection voltage Vpset (in this example, 6 V) supplied from the voltage selection circuit 21B, and applies the non-selection voltage Vinh (in this example, 3 V) to the column selection line CL0. In addition, the decoder 32B applies, to the column selection line CL2, the selection voltage Vnset (in this example, 0 V) supplied from the voltage selection circuit 21A, and applies the non-selection voltage Vinh (in this example, 3V) to the column selection line CL3. Thus, in the array driver AD2, it is possible to perform the set operation OP1 on the memory cells MC5 and MC26.

In the storage device 1B, this configuration makes it possible to reduce the number of transistors.

Modification Example 1-4

In the foregoing embodiment, as illustrated in FIGS. 3 and 6, the decoder 23A in the row selection line driver 20 drives the row selection lines RL0 to RL3 formed in the same layer, and the decoder 23B drives the row selection lines RL4 to RL7 formed in the same layer, but this is not limitative. Alternatively, for example, each decoder may drive, from the row selection lines RL0 to RL7, a row selection line RL that is formed in a different layer. In the following, a storage device 1C according to the present modification example is described in detail.

As with the storage device 1 (FIG. 1) according to the foregoing embodiment, the storage device 1C includes a memory array unit MAU3. As with the memory array unit MAU (FIG. 2) according to the foregoing embodiment, the memory array unit MAU3 includes an array driver AD3 that includes a row selection line driver 80 and the column selection line driver 30.

FIG. 27 illustrates a configuration example of the row selection line driver 80. The row selection line driver 80 includes voltage selection circuits 81A and 81B and decoders 83A and 83B. In addition, although not illustrated, the row selection line driver 80 also includes an inverting circuit that respectively generates, on the basis of the logic signals Vgrset0, Vgrset1, Vgrrst0, Vgrrst1, Vgrsns0, Vgrsns1, and Vgr0 to Vgr7 supplied from the microcontroller MCON, the logic signals Vgrset0b, Vgrset1b, Vgrrst0b, Vgrrst1b, Vgrsns0b, Vgrsns1b, and Vgr0b to Vgr7b each of which is the inverted signal of a corresponding one of these logic signals.

The voltage selection circuit 81A outputs one of the selection voltages Vpset, Vnset, Vprst, Vnrst, Vpsns, and Vnsns on the basis of the logic signals Vgrset0, Vgrset1, Vgrrst0, Vgrrst1, Vgrsns0, and Vgrsns1 supplied from the microcontroller MCON. In other words, in the example (FIG. 6) in the foregoing embodiment, the voltage selection circuit 21A outputs one of the three selection voltages Vnset, Vprst, and Vnsns. In contrast, in the present modification example (FIG. 27), the voltage selection circuit 81A outputs one of the six selection voltages Vpset, Vnset, Vprst, Vnrst, Vpsns, and Vnsns. The voltage selection circuit 81A includes transistors 201P, 201N, 202P, 202N, 203P, and 203N. The transistors 201P, 202P, and 203P are p-type MOS transistors, and the transistors 201N, 202N, and 203N are n-type MOS transistors. The transistor 201P has a gate supplied with the logic signal Vgcset1b that is the inverted signal of the logic signal Vgrset1, a source supplied with the selection voltage Vpset (for example, 6 V), and a drain coupled to the node N21A. The transistor 201N has a gate supplied with the logic signal Vgrset0, a source supplied with the selection voltage Vnset (for example, 0 V), and a drain coupled to the node N21A. The transistor 202P has a gate supplied with the logic signal Vgrrst0b that is the inverted signal of the logic signal Vgrrst0, a source supplied with the selection voltage Vprst (for example, 6 V), and a drain coupled to the node N21A. The transistor 202N has a gate supplied with the logic signal Vgrrst1, a source supplied with the selection voltage Vnrst (for example, 0 V), and a drain coupled to the node N21A. The transistor 203P has a gate supplied with the logic signal Vgrsns1b that is the inverted signal of the logic signal Vgrsns1, a source supplied with the selection voltage Vpsns (for example, 5 V), and a drain coupled to the node N21A. The transistor 203N has a gate supplied with the logic signal Vgrsns0, a source supplied with the selection voltage Vnsns (for example, 1 V), and a drain coupled to the node N21A.

The decoder 83A selectively applies, to the row selection lines RL0, RL1, RL4, and RL5, the selection voltage supplied from the voltage selection circuit 21A via the current limiting circuit 22A, on the basis of the logic signals Vgr0, Vgr1, Vgr4, and Vgr5 supplied from the microcontroller MCON. In other words, in the example (FIG. 6) in the foregoing embodiment, the decoder 23A selectively applies the selection voltage to the row selection lines RL0 to RL3 on the basis of the logic signals Vgr0 to Vgr3. In contrast, in the present modification example (FIG. 27), the decoder 83A selectively applies the selection voltage to the row selection lines RL0, RL1, RL4, and RL5 on the basis of the logic signals Vgr0, Vgr1, Vgr4, and Vgr5. In the decoder 83A, the transistor 210 has the gate supplied with the logic signal Vgr4, the source coupled to the node N23A, and the drain coupled to the drain of the transistor 211 and the row selection line RL4. The transistor 211 has the gate supplied with the logic signal Vgr4b that is the inverted signal of the logic signal Vgr4, the source supplied with the non-selection voltage Vinh (for example, 3 V), and the drain coupled to the drain of the transistor 210 and the row selection line RL4. The transistor 212 has the gate supplied with the logic signal Vgr5b that is the inverted signal of the logic signal Vgr5, the source supplied with the non-selection voltage Vinh (for example, 3 V), and the drain coupled to the drain of the transistor 213 and the row selection line RL5. The transistor 213 has the gate supplied with the logic signal Vgr5, the source coupled to the node N23A, and the drain coupled to the drain of the transistor 212 and the row selection line RL5.

As with the voltage selection circuit 81A, the voltage selection circuit 81B outputs one of the selection voltages Vpset, Vnset, Vprst, Vnrst, Vpsns, and Vnsns on the basis of the logic signals Vgrset0, Vgrset1, Vgrrst0, Vgrrst1, Vgrsns0, and Vgrsns1 supplied from the microcontroller MCON. The voltage selection circuit 81B includes transistors 221P, 221N, 222P, 222N, 223P, and 223N. The transistors 221P, 222P, and 223P are p-type MOS transistors, and the transistors 221N, 222N, and 223N are n-type MOS transistors. The transistor 221P has a gate supplied with the logic signal Vgcset0b that is the inverted signal of the logic signal Vgrset0, a source supplied with the selection voltage Vpset (for example, 6 V), and a drain coupled to the node N21B. The transistor 221N has a gate supplied with the logic signal Vgrset1, a source supplied with the selection voltage Vnset (for example, 0 V), and a drain coupled to the node N21B. The transistor 222P has a gate supplied with the logic signal Vgrrst1b that is the inverted signal of the logic signal Vgrrst1, a source supplied with the selection voltage Vprst (for example, 6 V), and a drain coupled to the node N21B. The transistor 222N has a gate supplied with the logic signal Vgrrst0, a source supplied with the selection voltage Vnrst (for example, 0 V), and a drain coupled to the node N21B. The transistor 223P has a gate supplied with the logic signal Vgrsns0b that is the inverted signal of the logic signal Vgrsns0, a source supplied with the selection voltage Vpsns (for example, 5 V), and a drain coupled to the node N21B. The transistor 223N has a gate supplied with the logic signal Vgrsns1, a source supplied with the selection voltage Vnsns (for example, 1 V), and a drain coupled to the node N21B.

As with the decoder 83A, the decoder 83B selectively applies, to the row selection lines RL2, RL3, RL6, and RL7, the selection voltage supplied from the voltage selection circuit 21B via the current limiting circuit 22B on the basis of the logic signals Vgr2, Vgr3, Vgr6, and Vgr7 supplied from the microcontroller MCON. In the decoder 83B, the transistor 226 has the gate supplied with the logic signal Vgr2, the source coupled to the node N23B, and the drain coupled to the drain of the transistor 227 and the row selection line RL2. The transistor 227 has the gate supplied with the logic signal Vgr2b that is the inverted signal of the logic signal Vgr2, the source supplied with the non-selection voltage Vinh (for example, 3 V), and the drain coupled to the drain of the transistor 226 and the row selection line RL2. The transistor 228 has the gate supplied with the logic signal Vgr3b that is the inverted signal of the logic signal Vgr3, the source supplied with the non-selection voltage Vinh (for example, 3 V), and the drain coupled to the drain of the transistor 229 and the row selection line RL3. The transistor 229 has the gate supplied with the logic signal Vgr3, the source coupled to the node N23B, and the drain coupled to the drain of the transistor 228 and the row selection line RL3.

The voltage selection circuit 81A, the current limiting circuit 22A, the decoder 83A, and the sense amplifier 24A are included in a driver 80A, and the voltage selection circuit 81B, the current limiting circuit 22B, the decoder 83B, and the sense amplifier 24B are included in a driver 80B. For example, as illustrated in FIG. 28, the driver 80A is formed, in the substrate surface S, in a region SA below the row selection lines RL0, RL1, RL4, and RL5 Likewise, the driver 80B is formed, in the substrate surface S, in a region SB below the row selection lines RL2, RL3, RL6, and RL7. Thus, in the storage device 1C, it is possible to simplify wiring between the row selection line driver 80 and the row selection lines RL0 to RL8.

Modification Example 1-5

In the foregoing embodiment, as illustrated in FIGS. 1 and 2, in each of the memory array units MAU, the row selection line driver 20 and the column selection line driver 30 drive the memory array MA in the memory array unit MAU, but this is not limitative. Alternatively, for example, the driver 20A in the row selection line driver 20 may drive two memory arrays MA in memory array units MAU different from each other, or the driver 20B may drive two memory arrays MA in memory array units MAU different from each other. Likewise, the driver 30A in the column selection line driver 30 may drive two memory arrays MA in memory array units MAU different from each other, or the driver 30B may drive two memory arrays MA in memory array units MAU different from each other. In the following, the present modification example is described with reference to an example.

FIG. 29 illustrates a configuration example of a storage device 1D according to the present modification example. In this example, the driver 30A drives the column selection lines CL0 and CL1 in two memory arrays MA (for example, an (n−1)th memory array MA(n−1) and an n-th memory array MA(n)). In addition, the driver 30B drives the column selection lines CL2 and CL3 in two memory arrays MA (for example, the n-th memory array MA(n) and an (n+1)th memory array MA(n+1)). Accordingly, for example, in the (n−1)th memory array MA(n−1) and the n-th memory array MA(n), the same selection voltage is applied to the same column selection line CL out of the column selection lines CL0 and CL1. Likewise, for example, in the n-th memory array MA(n) and the (n+1)th memory array MA(n+1), the same selection voltage is applied to the same column selection line CL out of the column selection lines CL2 and CL3. In the storage device 1D, this configuration makes it possible to reduce the number of the column selection line drivers 30. It is to be noted that in this example, the present technology is applied to the drivers 30A and 30B in the column selection line driver 30, but may be applied to the drivers 20A and 20B in the row selection line driver 20 in a similar manner.

Modification Example 1-6

In the foregoing embodiment, as illustrated in FIG. 6, for example, the decoder 23A in the row selection line driver 20 selectively applies the selection voltage to the row selection lines RL0 to RL3 through selectively turning on the transistors 206, 209, 210, and 213, and for example, the decoder 23B selectively applies the selection voltage to the row selection lines RL4 to RL7 through selectively turning on the transistors 226, 229, 230, and 233, but this is not limitative. In the following, a storage device 1E according to the present modification example is described in detail. As with the storage device 1 (FIG. 1) according to the foregoing embodiment, the storage device 1E includes a memory array unit MAU5.

FIG. 30 illustrates a configuration example of the memory array unit MAU5. The memory array unit MAU5 includes a memory array MA5 and an array driver ADS.

The memory array MA5 includes a plurality of row selection lines RL (in this example, 16 row selection lines RL0 to RL15), a plurality of column selection lines CL (in this example, four column selection lines CL0 to CL3), and a plurality of memory cells MC (in this example, 64 memory cells MC0 to MC63). As with the memory array MA (FIG. 3) according to the foregoing embodiment, the memory cells MC0 to MC31 are formed in the storage layer L0, and the memory cells MC32 to MC63 are formed in the storage layer L1.

The array driver ADS includes a row selection line driver 100 and the column selection line driver 30. The row selection line driver 100 selectively applies a voltage to the row selection lines RL0 to RL15 on the basis of an instruction from the microcontroller MCON. As with the row selection line driver 20 (FIG. 6) according to the foregoing embodiment, the row selection line driver 100 includes the voltage selection circuits 21A and 21B, the current limiting circuits 22A and 22B, decoders 103A and 103B, and the sense amplifiers 24A and 24B. In addition, although not illustrated, the row selection line driver 100 also includes an inverting circuit that respectively generates, on the basis of the logic signals Vgr0 to Vgr7 and Vgr11 to Vgr14 supplied from the microcontroller MCON, the logic signals Vgr0b to Vgr7b and Vgr11b to Vgr14b each of which is the inverted signal of a corresponding one of these logic signals.

FIG. 31A illustrates a configuration example of the decoder 103A. The decoder 103A selectively applies, to the row selection lines RL0 to RL7, the selection voltage supplied from the voltage selection circuit 21A via the current limiting circuit 22A, on the basis of the logic signals Vgr0 to Vgr3, Vgr11, and Vgr12 supplied from the microcontroller MCON. The decoder 103A includes transistors 401 to 420. The transistors 401 to 420 are n-type MOS transistors. The transistor 401 has a gate supplied with the logic signal Vgr11, a source coupled to the node N23A, and a drain coupled to a node N401. The transistor 402 has a gate supplied with the logic signal Vgr11b that is the inverted signal of the logic signal Vgr11, a source supplied with the non-selection voltage Vinh (for example, 3 V), and a drain coupled to the node N401. The transistor 403 has a gate supplied with the logic signal Vgr12b that is the inverted signal of the logic signal Vgr12, a source supplied with the non-selection voltage Vinh (for example, 3 V), and a drain coupled to a node N404. The transistor 404 has a gate supplied with the logic signal Vgr12, a source coupled to the node N23A, and a drain coupled to the node N404.

The transistor 405 has a gate supplied with the logic signal Vgr0, a source coupled to the node N401, and a drain coupled to a drain of the transistor 406 and the row selection line RL0. The transistor 406 has a gate supplied with the logic signal Vgr0b that is the inverted signal of the logic signal Vgr0, a source supplied with the non-selection voltage Vinh (for example, 3 V), and the drain coupled to the drain of the transistor 405 and the row selection line RL0. The transistor 407 has a gate supplied with the logic signal Vgr1b that is the inverted signal of the logic signal Vgr1, a source supplied with the non-selection voltage Vinh (for example, 3 V), and a drain coupled to a drain of the transistor 408 and the row selection line RL1. The transistor 408 has a gate supplied with the logic signal Vgr1, a source coupled to the node N401, and the drain coupled to the drain of the transistor 407 and the row selection line RL1. The transistor 409 has a gate supplied with the logic signal Vgr2, a source coupled to the node N401, and a drain coupled to a drain of the transistor 410 and the row selection line RL2. The transistor 410 has a gate supplied with the logic signal Vgr2b that is the inverted signal of the logic signal Vgr2, a source supplied with the non-selection voltage Vinh (for example, 3 V), and the drain coupled to the drain of the transistor 409 and the row selection line RL2. The transistor 411 has a gate supplied with the logic signal Vgr3*b* that is the inverted signal of the logic signal Vgr3, a source supplied with the non-selection voltage Vinh (for example, 3 V), and a drain coupled to a drain of the transistor 412 and the row selection line RL3. The transistor 412 has a gate supplied with the logic signal Vgr3, a source coupled to the node N401, and the drain coupled to the drain of the transistor 411 and the row selection line RL3.

The transistor 413 has a gate supplied with the logic signal Vgr0, a source coupled to the node N404, and a drain coupled to a drain of the transistor 414 and the row selection line RL4. The transistor 414 has a gate supplied with the logic signal Vgr0*b* that is the inverted signal of the logic signal Vgr0, a source supplied with the non-selection voltage Vinh (for example, 3 V), and the drain coupled to the drain of the transistor 413 and the row selection line RL4. The transistor 415 has a gate supplied with the logic signal Vgr1*b* that is the inverted signal of the logic signal Vgr1, a source supplied with the non-selection voltage Vinh (for example, 3 V), and a drain coupled to a drain of the transistor 416 and the row selection line RL5. The transistor 416 has a gate supplied with the logic signal Vgr1, a source coupled to the node N404, and the drain coupled to the drain of the transistor 415 and the row selection line RL5. The transistor 417 has a gate supplied with the logic signal Vgr2, a source coupled to the node N404, and a drain coupled to a drain of the transistor 418 and the row selection line RL6. The transistor 418 has a gate supplied with the logic signal Vgr2*b* that is the inverted signal of the logic signal Vgr2, a source supplied with the non-selection voltage Vinh (for example, 3 V), and the drain coupled to the drain of the transistor 417 and the row selection line RL6. The transistor 419 has a gate supplied with the logic signal Vgr3*b* that is the inverted signal of the logic signal Vgr3, a source supplied with the non-selection voltage Vinh (for example, 3 V), and a drain coupled to a drain of the transistor 420 and the row selection line RL7. The transistor 420 has a gate supplied with the logic signal Vgr3, a source coupled to the node N404, and the drain coupled to the drain of the transistor 419 and the row selection line RL7.

FIG. 31B illustrates a configuration example of the decoder 103B. The decoder 103B selectively applies, to the row selection lines RL8 to RL15, the selection voltage supplied from the voltage selection circuit 21B via the current limiting circuit 22B, on the basis of the logic signals Vgr4 to Vgr7, Vgr13, and Vgr14 supplied from the microcontroller MCON. The decoder 103B has a configuration similar to that of the decoder 103A. The decoder 103B includes transistors 421 to 440. The transistors 421 to 440 respectively correspond to the transistors 401 to 420 in the decoder 103A.

FIG. 32 illustrates an operation example of the decoder 103A in a case of applying, to the row selection line RL0, the selection voltage supplied to the node N23A (in this example, the selection voltage Vpset). In this case, in the decoder 103A, the transistors 401 and 403 are turned on while the transistors 402 and 404 are turned off. Accordingly, the selection voltage Vpset is applied to the node N401, and the non-selection voltage Vinh is applied to the node N404.

In addition, the transistors 405, 407, 410, and 411 are turned on while the transistors 406, 408, 409, and 412 are turned off. This causes the decoder 103A to apply, to the row selection line RL0, the selection voltage Vpset supplied to the node N401, and applies the non-selection voltage Vinh to the row selection lines RL1 to RL3.

In addition, the transistors 413, 415, 418, and 419 are turned on while the transistors 414, 416, 417, and 420 are turned off. The same applies to the transistors 415 to 420. This causes the decoder 103B to apply the non-selection voltage Vinh to the row selection lines RL4 to RL7.

In other words, for example, the gates of the transistors 405 and 413 are supplied with the same logic signal Vgr0, thus turning on the transistor 413 as with the transistor 405, and for example, the gates of the transistors 406 and 414 are supplied with the same logic signal Vgr0*b*, thus turning off the transistor 414 as with the transistor 406. The node N401 is supplied with the selection voltage Vpset, thus causing the transistor 405, which is on, to supply the selection voltage Vpset to the row selection line RL0. In other words, the selection voltage supplied to the node N23A is supplied to the row selection line RL0 via the two transistors 401 and 405. Meanwhile, the non-selection voltage Vinh is supplied to the node N404, thus causing the transistor 413, which is on, to supply the non-selection voltage Vinh to the row selection line RL4.

In the storage device 1E, this configuration makes it possible to reduce the number of wiring lines between the microcontroller MCON and the array driver ADS. In other words, for example, in a case of a configuration like a decoder 103AR illustrated in FIG. 33, eight logic signals Vgr0 to Vgr7 are supplied to the decoder 103AR from the microcontroller MCON. In contrast, in the decoder 103A (FIG. 31A) according to the present modification example, six logic signals Vgr0 to Vgr3, Vgr11, and Vgr12 are supplied to the decoder 103A from the microcontroller MCON. The same applies to the decoder 103B. As the number of the row selection lines RL is larger, the present modification example is more effective. As a result, in the storage device 1E, it is possible to reduce the number of wiring lines between the microcontroller MCON and the array driver ADS. It is to be noted that in this example, the present technology is applied to the row selection line driver 20, but may also be applied to the column selection line driver 30.

Modification Example 1-7

In the foregoing embodiment, as illustrated in FIG. 6, the row selection line driver 20 selectively applies the selection voltage to the row selection lines RL0 to RL7 on the basis of the logic signals Vgr0 to Vgr7, but this is not limitative. Alternatively, for example, the row selection line driver may selectively apply the selection voltage to the row selection lines RL0 to RL7 on the basis of the logic signals Vgr0 to Vgr3. In the following, a storage device IF according to the present modification example is described in detail.

As with the storage device 1 (FIG. 1) according to the foregoing embodiment, the storage device 1F includes a memory array unit MAU6. As with the memory array unit MAU (FIG. 2) according to the foregoing embodiment, the memory array unit MAU6 includes an array driver AD6 that includes a row selection line driver 120 and the column selection line driver 30.

FIG. 34 illustrates a configuration example of the row selection line driver 120. The row selection line driver 120 includes a decoder 123B. In addition, although not illustrated, the row selection line driver 120 also includes an inverting circuit that respectively generates, on the basis of the logic signals Vgrset, Vgrrst, Vgrsns, and Vgr0 to Vgr3 supplied from the microcontroller MCON, the logic signals Vgrsetb, Vgrrstb, Vgrsnsb, and Vgr0b to Vgr3b each of which is the inverted signal of a corresponding one of these logic signals.

As with the decoder 23A, the decoder 123B selectively applies, to the row selection lines RL4 to RL7, the selection voltage supplied from the voltage selection circuit 21B via the current limiting circuit 22B, on the basis of the logic signals Vgr0 to Vgr3 supplied from the microcontroller MCON. In other words, in the example (FIG. 6) in the foregoing embodiment, the decoder 23B selectively applies the selection voltage to the row selection lines RL4 to RL7 on the basis of the logic signals Vgr4 to Vgr7. In contrast, in the present modification example (FIG. 34), the decoder 123B selectively applies the selection voltage to the row selection lines RL4 to RL7 on the basis of the logic signals Vgr0 to Vgr3. The transistor 226 has the gate supplied with the logic signal Vgr0, the source coupled to the node N23B, and the drain coupled to the drain of the transistor 227 and the row selection line RL4. The transistor 227 has the gate supplied with the logic signal Vgr0b that is the inverted signal of the logic signal Vgr0, the source supplied with the non-selection voltage Vinh (for example, 3 V), and the drain coupled to the drain of the transistor 226 and the row selection line RL4. The transistor 228 has the gate supplied with the logic signal Vgr1b that is the inverted signal of the logic signal Vgr1, the source supplied with the non-selection voltage Vinh (for example, 3 V), and the drain coupled to the drain of the transistor 229 and the row selection line RL5. The transistor 229 has the gate supplied with the logic signal Vgr1, the source coupled to the node N23B, and the drain coupled to the drain of the transistor 228 and the row selection line RL5. The transistor 230 has the gate supplied with the logic signal Vgr2, the source coupled to the node N23B, and the drain coupled to the drain of the transistor 231 and the row selection line RL6. The transistor 231 has the gate supplied with the logic signal Vgr2b that is the inverted signal of the logic signal Vgr2, the source supplied with the non-selection voltage Vinh (for example, 3 V), and the drain coupled to the drain of the transistor 230 and the row selection line RL6. The transistor 232 has the gate supplied with the logic signal Vgr3b that is the inverted signal of the logic signal Vgr3, the source supplied with the non-selection voltage Vinh (for example, 3 V), and the drain coupled to the drain of the transistor 233 and the row selection line RL7. The transistor 233 has the gate supplied with the logic signal Vgr4, the source coupled to the node N23B, and the drain coupled to the drain of the transistor 232 and the row selection line RL7.

The voltage selection circuit 21A, the current limiting circuit 22A, the decoder 23A, and the sense amplifier 24A are included in a driver 120A, and the voltage selection circuit 21B, the current limiting circuit 22B, the decoder 123B, and the sense amplifier 24B are included in a driver 120B.

FIG. 35 schematically illustrates an operation in a case of performing the set operation OP1 on two memory cells MC6 and MC21. FIG. 36 illustrates an operation of the row selection line driver 120 in the set operation OP1. The operation of the column selection line driver 30 is similar to that in FIG. 9B.

In this example, the row selection line driver 120 applies the selection voltage Vnset (in this example, 0 V) to the row selection line RL1, applies the selection voltage Vpset (in this example, 6 V) to the row selection line RL5, and applies the non-selection voltage Vinh (in this example, 3 V) to the remaining row selection lines RL0, RL2 to RL4, RL6, and RL7. In addition, the column selection line driver 30 applies the selection voltage Vnset (in this example, 0 V) to the column selection line CL1, applies the selection voltage Vpset (in this example, 6 V) to the column selection line CL2, and applies the non-selection voltage Vinh (in this example, 3 V) to the remaining column selection lines CL0 and CL3.

At this time, as illustrated in FIG. 36, in the decoder 23A in the row selection line driver 120, the transistors 207, 209, 211, and 212 are turned on while the transistors 206, 208, 210, and 213 are turned off. As a result, the decoder 23A applies, to the row selection line RL1, the selection voltage Vnset (in this example, 0 V) supplied from the voltage selection circuit 21A via the current limiting circuit 22A, and applies the non-selection voltage Vinh (in this example, 3 V) to the row selection lines RL0, RL2, and RL3.

In addition, in the decoder 123B, the transistors 227, 229, 231, and 232 are turned on while the transistors 226, 228, 230, and 233 are turned off. In other words, for example, the gates of the transistors 209 and 229 are supplied with the same logic signal Vgr1, thus turning on the transistor 229 as with the transistor 209, and for example, the gates of the transistors 208 and 228 are supplied with the same logic signal Vgr1b, thus turning off the transistor 228 as with the transistor 208. As a result, the decoder 123B applies, to the row selection line RL5, the selection voltage Vpset (in this example, 6 V) supplied from the voltage selection circuit 21B via the current limiting circuit 22B, and applies the non-selection voltage Vinh (in this example, 3 V) to the row selection lines RL4, RL6, and RL7.

In addition, as illustrated in FIG. 9B, the voltage selection circuit 31A in the column selection line driver 30 outputs the selection voltage Vnset (in this example, 0 V), and the voltage selection circuit 31B outputs the selection voltage Vpset (in this example, 6 V). Then, in the decoder 32A, the transistors 308 and 310 are turned on while the transistors 307 and 309 are turned off. As a result, the decoder 32A applies the selection voltage Vnset (in this example, 0 V) to the column selection line CL1, and applies the non-selection voltage Vinh (in this example, 3 V) to column selection line CL0. In addition, in the decoder 32B, the transistors 327 and 329 are turned on while the transistors 328 and 330 are turned off. As a result, the decoder 32B applies, to the column selection line CL2, the selection voltage Vpset (in this example, 6 V) supplied from the voltage selection circuit 31B, and applies the non-selection voltage Vinh (in this example, 3 V) to the column selection line CL3.

As a result, in the memory array unit MAU6, as illustrated in FIG. 35, the two memory cells MC6 and MC21 are selected as targets for the set operation OP1. In the memory array unit MAU6, this causes the set current Iset (the set current Iset1) to flow through the voltage selection circuit 31B, the decoder 32B, the column selection line CL2, the memory cell MC6, the row selection line RL1, the decoder 23A, the current limiting circuit 22A, and the voltage selection circuit 21A in this order, and causes the set current Iset (the set current Iset2) to flow through the voltage selection circuit 21B, the current limiting circuit 22B, the decoder 123B, the row selection line RL5, the memory cell MC21, the column selection line CL1, the decoder 32A, and the voltage selection circuit 31A in this order.

FIG. 37 schematically illustrates an operation in a case of performing the set operation OP1 on one memory cell MC6. FIG. 38 illustrates an operation of the row selection line driver 120 in the set operation OP1. The operation of the column selection line driver 30 is similar to that in FIG. 18B.

In this example, the row selection line driver 120 applies the selection voltage Vnset (in this example, 0 V) to the row selection line RL1, applies the selection voltage Vpset (in this example, 6 V) to the row selection line RL5, and applies the non-selection voltage Vinh (in this example, 3 V) to the remaining row selection lines RL0, RL2 to RL4, RL6, and RL7. In addition, the column selection line driver 30 applies the selection voltage Vpset (in this example, 6 V) to the column selection line CL2, and applies the non-selection voltage Vinh (in this example, 3 V) to the remaining column selection lines CL0, CL1, and CL3.

At this time, as illustrated in FIG. 38, the decoder 23A in the row selection line driver 120 applies, to the row selection line RL1, the selection voltage Vnset (in this example, 0 V) supplied from the voltage selection circuit 21A via the current limiting circuit 22A, and applies the non-selection voltage Vinh (in this example, 3 V) to the row selection lines RL0, RL2, and RL3. In addition, the decoder 123B applies, to the row selection line RL5, the selection voltage Vpset (in this example, 6 V) supplied from the voltage selection circuit 21B via the current limiting circuit 22B, and applies the non-selection voltage Vinh (in this example, 3 V) to the row selection lines RL4, RL6, and RL7.

In addition, as illustrated in FIG. 18B, the voltage selection circuit 31A in the column selection line driver 30 outputs the selection voltage Vnset (in this example, 0 V), and the voltage selection circuit 31B outputs the selection voltage Vpset (in this example, 6 V). Then, in the decoder 32A, the transistors 308 and 309 are turned on while the transistors 307 and 310 are turned off. As a result, the decoder 32A applies the non-selection voltage Vinh (in this example, 3 V) to the two column selection line CL0 and CL1. In addition, in the decoder 32B, the transistors 327 and 329 are turned on while the transistors 328 and 330 are turned off. As a result, the decoder 32B applies, to the column selection line CL2, the selection voltage Vpset (in this example, 6 V) supplied from the voltage selection circuit 31B, and applies the non-selection voltage Vinh (in this example, 3 V) to the column selection line CL3.

As a result, in the memory array unit MAU6, as illustrated in FIG. 37, one memory cell MC6 is selected as a target for the set operation OP1. In the memory array unit MAU6, this causes the set current Iset (the set current Iset1) to flow through the voltage selection circuit 31B, the decoder 32B, the column selection line CL2, the memory cell MC6, the row selection line RL1, the decoder 23A, the current limiting circuit 22A, and the voltage selection circuit 21A in this order.

In the storage device 1F, this configuration makes it possible to reduce the number of wiring lines between the microcontroller MCON and the array driver AD6. As the number of the row selection lines RL is larger, the present modification example is more effective. It is to be noted that in this example, the present technology is applied to the row selection line driver 20, but may also be applied to the column selection line driver 30.

In addition, the present technology may be applied to both the row selection line driver 20 and the column selection line driver 30. In the following, a storage device 1G according to the present modification example is described in detail.

As with the storage device 1 (FIG. 1) according to the foregoing embodiment, the storage device 1G includes a memory array unit MAU1. As with the memory array unit MAU (FIG. 2) according to the foregoing embodiment, the memory array unit MAU1 includes an array driver AD7 that includes the row selection line driver 120 and a column selection line driver 130.

FIG. 39 illustrates a configuration example of the column selection line driver 130. The column selection line driver 130 includes voltage selection circuits 131A and 131B, and a decoder 132B. In addition, although not illustrated, the column selection line driver 130 also includes an inverting circuit that respectively generates, on the basis of the logic signals Vgc0 and Vgc1 supplied from the microcontroller MCON, the logic signals Vgc0$b$ and Vgc1$b$ each of which is the inverted signal of a corresponding one of these logic signals.

The voltage selection circuit 131A outputs one of the selection voltages Vpset, Vnset, Vprst, Vnrst, Vpsns, and Vnsns and the non-selection voltage Vinh on the basis of the logic signals Vgcset0$b$, Vgcset1, Vgcrst0, Vgcrst1$b$, Vgcsns0$b$, Vgcsns1, and Vgcinh0 supplied from the microcontroller MCON. In other words, in the foregoing embodiment (FIG. 7), the voltage selection circuit 31A outputs one of the six selection voltages Vpset, Vnset, Vprst, Vnrst, Vpsns, and Vnsns on the basis of the six logic signals Vgcset0, Vgcset1, Vgcrst0, Vgcrst1, Vgcsns0, and Vgcsns1. In contrast, in the present modification example (FIG. 39), the voltage selection circuit 131A outputs one of the six selection voltages Vpset, Vnset, Vprst, Vnrst, Vpsns, and Vnsns and the non-selection voltage Vinh on the basis of the seven logic signals Vgcset0$b$, Vgcset1, Vgcrst0, Vgcrst1$b$, Vgcsns0$b$, Vgcsns1, and Vgcinh0. The voltage selection circuit 131A includes a transistor 311. The transistor 311 is an n-type MOS transistor. The transistor 311 has a gate supplied with the logic signal Vgcinh0, a source supplied with the non-selection voltage Vinh, and a drain coupled to the node N32A.

As with the voltage selection circuit 131A, the voltage selection circuit 131B outputs one of the selection voltages Vpset, Vnset, Vprst, Vnrst, Vpsns, and Vnsns and the non-selection voltage Vinh on the basis of the logic signals Vgcset2$b$, Vgcset3, Vgcrst2, Vgcrst3$b$, Vgcsns2$b$, Vgcsns3, and Vgcinh1 supplied from the microcontroller MCON. The voltage selection circuit 131B includes a transistor 331. The transistor 331 is an n-type MOS transistor. The transistor 331 has a gate supplied with the logic signal Vgcinh1, a source supplied with the non-selection voltage Vinh, and a drain coupled to the node N32B. The transistor 321 has the gate supplied with the logic signal Vgcset2$b$ that is the inverted signal of the logic signal Vgcset2, the source supplied with the selection voltage Vpset (for example, 6 V), and the drain coupled to the node N32B. The transistor 322 has the gate supplied with the logic signal Vgcset3, the source supplied with the selection voltage Vnset (for example, 0 V), and the drain coupled to the node N32B. The transistor 323 has the gate supplied with the logic signal Vgcrst3$b$ that is the inverted signal of the logic signal Vgcrst3, the source supplied with the selection voltage Vprst (for example, 6 V), and the drain coupled to the node N32B. The transistor 324 has the gate supplied with the logic signal Vgcrst2, the source supplied with the selection voltage Vnrst (for example, 0 V), and the drain coupled to the node N32B. The transistor 325 has the gate supplied with logic signal Vgcsns2$b$ that is the inverted signal of the logic signal Vgcsns2, the source supplied with the selection voltage Vpsns (for example, 5 V), and the drain coupled to the node N32B. The transistor 326 has the gate supplied with the logic signal Vgcsns3, the source supplied with the selection voltage Vnsns (for example, 1 V), and the drain coupled to the node N32B.

As with the decoder 32A, the decoder 132B applies, to one of the column selection lines CL2 and CL3, the selection voltage supplied from the voltage selection circuit 31B, on the basis of the logic signals Vgc0 and Vgc1 supplied from the microcontroller MCON. In other words, in the example (FIG. 7) in the foregoing embodiment, the decoder 32B selectively applies the selection voltage to the column selection lines CL2 and CL3 on the basis of the logic signals Vgc2 and Vgc3. In contrast, in the present modification example (FIG. 39), the decoder 132B selectively applies the selection voltage to the column selection lines CL2 and CL3 on the basis of the logic signals Vgc0 and Vgc1. The transistor 327 has the gate supplied with the logic signal Vgc0, the source coupled to the node N32B, and the drain coupled to the drain of the transistor 328 and the column selection lines CL2. The transistor 328 has the gate supplied with the logic signal Vgc0$b$ that is the inverted signal of the logic signal Vgc0, the source supplied with the non-selection voltage Vinh (for example, 3 V), and the drain coupled to the drain of the transistor 327 and the column selection line CL2. The transistor 329 has the gate supplied with the logic signal Vgc1$b$ that is the inverted signal of the logic signal Vgc1, the source supplied with the non-selection voltage Vinh (for example, 3 V), and the drain coupled to the drain of the transistor 330 and the column selection line CL3. The transistor 330 has the gate supplied with the logic signal Vgc1, the source coupled to the node N32B, and the drain coupled to the drain of the transistor 329 and the column selection line CL3.

The voltage selection circuit 131A and the decoder 32A are included in a driver 130A, and the voltage selection circuit 131B and the decoder 132B are included in a driver 130B.

FIG. 40 schematically illustrates an operation in a case of performing the set operation OP1 on two memory cells MC6 and MC20. FIG. 41 illustrates an operation of the column selection line driver 130 in the set operation OP1. The operation of the row selection line driver 120 is similar to that in FIG. 36.

In this example, the row selection line driver 120 applies the selection voltage Vnset (in this example, 0 V) to the row selection line RL1, applies the selection voltage Vpset (in this example, 6 V) to the row selection line RL5, and applies the non-selection voltage Vinh (in this example, 3 V) to the remaining row selection lines RL0, RL2 to RL4, RL6, and RL7. In addition, the column selection line driver 130 applies the selection voltage Vnset (in this example, 0 V) to the column selection line CL0, applies the selection voltage Vpset (in this example, 6 V) to the column selection line CL2, and applies non-selection voltage Vinh (in this example, 3 V) to the remaining column selection lines CL1 and CL3.

At this time, as illustrated in FIG. 41, in the voltage selection circuit 131A in the column selection line driver 130, the transistor 302 is turned on while the transistors 301, 303 to 306, and 311 are turned off. This causes the voltage selection circuit 131A to output the selection voltage Vnset (in this example, 0 V). Meanwhile, in the voltage selection circuit 131B, the transistor 321 is turned on while the transistors 322 to 326 and 331 are turned off. This causes the voltage selection circuit 131B to output the selection voltage Vpset (in this example, 6 V).

Then, in the decoder 32A, the transistors 307 and 309 are turned on while the transistors 308 and 310 are turned off. As a result, the decoder 32A applies, to the column selection line CL1, the selection voltage Vnset (in this example, 0 V) supplied from the voltage selection circuit 131A, and applies the non-selection voltage Vinh (in this example, 3 V) to the column selection line CL0.

In addition, in the decoder 132B, the transistors 327 and 329 are turned on while the transistors 328 and 330 are turned off. In other words, for example, the transistors 307 and 327 are supplied with the same logic signal Vgc0, thus turning on the transistor 327 as with the transistor 307, and for example, the transistors 308 and 328 are supplied with the same logic signal Vgc0$b$, thus turning off the transistor 328 as with the transistor 308. As a result, the decoder 132B applies, to the column selection line CL2, the selection voltage Vpset (in this example, 6 V) supplied from the voltage selection circuit 131B, and applies the non-selection voltage Vinh (in this example, 3 V) to the column selection line CL3.

As a result, in the memory array unit MAU7, as illustrated in FIG. 40, the two memory cells MC6 and MC20 are selected as targets for the set operation OP1. In the memory array unit MAU7, this causes the set current Iset (the set current Iset1) to flow through the voltage selection circuit 131B, the decoder 132B, the column selection line CL2, the memory cell MC6, the row selection line RL1, the decoder 23A, the current limiting circuit 22A, and the voltage selection circuit 21A in this order, and causes the set current Iset (the set current Iset2) to flow through the voltage selection circuit 21B, the current limiting circuit 22B, the decoder 123B, the row selection line RL5, the memory cell MC20, the column selection line CL0, the decoder 32A, and the voltage selection circuit 131A in this order.

FIG. 42 schematically illustrates an operation in a case of performing the set operation OP1 on one memory cell MC6. FIG. 43 illustrates an operation of the column selection line driver 130 in the set operation OP1. The operation of the row selection line driver 120 is similar to that in FIG. 38.

In this example, the row selection line driver 120 applies the selection voltage Vnset (in this example, 0 V) to the row selection line RL1, applies the selection voltage Vpset (in this example, 6 V) to the row selection line RL5, and applies the non-selection voltage Vinh (in this example, 3 V) to the remaining row selection lines RL0, RL2 to RL4, RL6, and RL7. In addition, the column selection line driver 130 applies the selection voltage Vpset (in this example, 6 V) to the column selection line CL2, and applies the non-selection voltage Vinh (in this example, 3 V) to the remaining column selection lines CL0, CL1, and CL3.

At this time, as illustrated in FIG. 43, in the voltage selection circuit 131A in the column selection line driver 130, the transistor 311 is turned on while the transistors 301 to 306 are turned off. This causes the voltage selection circuit 131A to output the non-selection voltage Vinh (in this example, 3 V). Meanwhile, in the voltage selection circuit 131B, the transistor 321 is turned on while the transistors 322 to 326 and 331 are turned off. This causes the voltage selection circuit 131B to output the selection voltage Vpset (in this example, 6 V).

Then, in the decoder 32A, the transistors 307 and 309 are turned on while the transistors 308 and 310 are turned off. As a result, the decoder 32A applies the non-selection voltage Vinh (in this example, 3 V) to the column selection lines CL0 and CL1.

In addition, in the decoder 132B, the transistors 327 and 329 are turned on while the transistors 328 and 330 are turned off. As a result, the decoder 132B applies to the column selection line CL2, the selection voltage Vpset (in this example, 6 V) supplied from the voltage selection circuit 131B, and applies the non-selection voltage Vinh (in this example, 3 V) to the column selection line CL3.

As a result, in the memory array unit MAU7, as illustrated in FIG. 42, the one memory cell MC6 is selected as a target for the set operation OP1. In the memory array unit MAU7, this causes the set current Iset (the set current Iset1) to flow through the voltage selection circuit 31B, the decoder 132B, the column selection line CL2, the memory cell MC6, the row selection line RL1, the decoder 23A, the current limiting circuit 22A, and the voltage selection circuit 21A in this order.

In the storage device 1G, this configuration makes it possible to reduce the number of wiring lines between the microcontroller MCON and the array driver AD7. As the numbers of the row selection lines RL and the column selection lines CL are larger, the present modification example is more effective.

Other Modification Example

In addition, two or more of these modification examples may be combined.

2. Second Embodiment

Next, a storage device 2 according to a second embodiment is described. The present embodiment is different from the foregoing first embodiment in the number of storage layers in the memory array. It is to be noted that substantially the same components as those in the storage device 1 according to the foregoing first embodiment are denoted by the same reference numerals, and the descriptions thereof are omitted where appropriate. As illustrated in FIG. 1, the storage device 2 includes a memory array unit MAU10.

FIG. 44 illustrates a configuration example of the memory array unit MAU10. The memory array unit MAU10 includes a memory array MA10 and an array driver AD10.

The memory array MA10 includes eight row selection lines RL0 to RL7, four row selection lines RL10 to RL13, eight column selection lines CL0 to CL7, and 64 memory cells MC0 to MC63. Each of the row selection lines RL0 to RL7 and the column selection lines CL0 to CL4 has one end coupled to the array driver AD10. Each of the row selection lines RL0 to RL3 has another end coupled to one end of each of the row selection lines RL10 to RL13.

FIG. 45 illustrates a configuration example of the memory array MA10. The row selection lines RL0 to RL7 and RL10 to RL13 are formed to extend in the x-direction in the x-y plane. In addition, the column selection lines CL0 to CL7 are formed to extend in the y-direction in the x-y plane. The row selection lines RL0 to RL3 are formed in the same layer, the column selection lines CL0 to CL3 are formed in a layer above the layer in which the row selection lines RL0 to RL3 are formed, the row selection lines RL4 to RL7 are formed in a layer above the layer in which the column selection lines CL0 to CL3 are formed, the column selection lines CL4 to CL7 are formed in a layer above the layer in which the row selection lines RL4 to RL7 are formed, and the row selection lines RL10 to RL13 are formed in a layer above the layer in which the column selection lines CL4 to CL7 are formed. Thus, in the memory array MA10, a layer in which the row selection lines RL are formed and a layer in which the column selection lines CL are formed are alternately disposed.

In the storage layer L0 between the layer in which the four row selection lines RL0 to RL3 are formed and the layer in which the four column selection lines CL0 to CL3 are formed, 16 (=4×4) memory cells MC (MC0 to MC15) are formed. Likewise, 16 (=4×4) memory cells MC (MC16 to MC31) are formed in the storage layer L1 between the layer in which the four column selection lines CL0 to CL3 are formed and the layer in which the four row selection lines RL4 to RL7 are formed, 16 (=4×4) memory cells MC (MC32 to MC47) are formed in the storage layer L2 between the layer in which the four row selection lines RL4 to RL7 are formed and the layer in which the four column selection lines CL4 to CL7 are formed, and 16 (=4×4) memory cells MC (MC48 to MC63) are formed in a storage layer L3 between the layer in which the four column selection lines CL4 to CL7 are formed and the layer in which the four row selection lines RL10 to RL13 are formed.

In the memory cell MC (memory cells MC0 to MC15) formed in the storage layer L0, the terminal TU is coupled to one of the column selection lines CL0 to CL3, and the terminal TL is coupled to one of the row selection lines RL0 to RL3. Likewise, in the memory cell MC (memory cells MC16 to MC31) formed in the storage layer L1, the terminal TU is coupled to one of the row selection lines RL4 to RL7, and the terminal TL is coupled to one of the column selection lines CL0 to CL3. In addition, in the memory cell MC (memory cells MC32 to MC47) formed in the storage layer L2, the terminal TU is coupled to one of the column selection lines CL4 to CL7, and the terminal TL is coupled to one of the row selection lines RL4 to RL7. In addition, in the memory cell MC (memory cells MC48 to MC63) formed in the storage layer L3, the terminal TU is coupled to one of the row selection lines RL10 to RL13, and the terminal TL is coupled to one of the column selection lines CL4 to CL7. In other words, in the memory cell MC, irrespective of which one of the storage layers L0 to L3 the memory cell MC is formed in, the storage element VR is formed above the selection element SE.

The array driver AD10 (FIG. 44) writes data to the memory cell MC or reads data from the memory cell MC through selectively applying a voltage to the row selection lines RL0 to RL7 and the column selection lines CL0 to CL7 on the basis of an instruction from the microcontroller MCON. The array driver AD10 includes a row selection line driver 140 and a column selection line driver 150.

FIG. 46 illustrates a configuration example of the row selection line driver 140. The row selection line driver 140 includes the voltage selection circuits 81A and 81B, the current limiting circuits 22A and 22B, the decoders 23A and 23B, and the sense amplifiers 24A and 24B. In addition, although not illustrated, the row selection line driver 20 also includes an inverting circuit that respectively generates, on the basis of the logic signals Vgrset0, Vgrset1, Vgrrst0, Vgrrst1, Vgrsns0, Vgrsns1, and Vgr0 to Vgr7 supplied from the microcontroller MCON, the logic signals Vgrset0b, Vgrset1b, Vgrrst0b, Vgrrst1b, Vgrsns0b, Vgrsns1b, and Vgr0b to Vgr7b each of which is the inverted signal of a corresponding one of these logic signals. The voltage selection circuit 81A, the current limiting circuit 22A, the decoder 23A, and the sense amplifier 24A are included in a driver 140A, and the voltage selection circuit 81B, the current limiting circuit 22B, the decoder 23B, and the sense amplifier 24B are included in a driver 140B.

FIG. 47 illustrates a configuration example of the column selection line driver 150. The column selection line driver 150 includes the voltage selection circuits 31A and 31B and decoders 152A and 152B. In addition, although not illustrated, the column selection line driver 150 also includes an inverting circuit that respectively generates, on the basis of the logic signals Vgcset0, Vgcset1, Vgcrst0, Vgcrst1, Vgcsns0, Vgcsns1, and Vgc0 to Vgc7 supplied from the microcontroller MCON, the logic signals Vgcset0b, Vgcset1b, Vgcrst0b, Vgcrst1b, Vgcsns0b, Vgcsns1b, and Vgc0b to Vgc7b each of which is the inverted signal of a corresponding one of these logic signals. The voltage selection circuit 31A and the decoder 152A are included in a driver 150A, and the voltage selection circuit 31B and the decoder 152B are included in a driver 150B.

The decoder 152A selectively applies, to the column selection lines CL0 to CL3, the selection voltage supplied from the voltage selection circuit 31A, on the basis of the logic signals Vgc0 to Vgc3 supplied from the microcontroller MCON. The decoder 152A includes transistors 371 to 378. The transistors 371 to 378 are n-type MOS transistors. The transistor 371 has a gate supplied with the logic signal Vgc0, a source coupled to the node N32A, and a drain coupled to a drain of the transistor 372 and the column selection line CL0. The transistor 372 has a gate supplied with the logic signal Vgc0$b$ that is the inverted signal of the logic signal Vgc0, a source supplied with the non-selection voltage Vinh (for example, 3 V), and the drain coupled to the drain of the transistor 371 and the column selection line CL0. The transistor 373 has a gate supplied with the logic signal Vgc1$b$ that is the inverted signal of the logic signal Vgc1, a source supplied with the non-selection voltage Vinh (for example, 3 V), and a drain coupled to a drain of the transistor 374 and the column selection line CL1. The transistor 374 has a gate supplied with the logic signal Vgc1, a source coupled to the node N32A, and the drain coupled to the drain of the transistor 373 and the column selection line CL1. The transistor 375 has a gate supplied with the logic signal Vgc2, a source coupled to the node N32A, and a drain coupled to a drain of the transistor 376 and the column selection line CL2. The transistor 376 has a gate supplied with the logic signal Vgc2$b$ that is the inverted signal of the logic signal Vgc2, a source supplied with the non-selection voltage Vinh (for example, 3 V), and the drain coupled to the drain of the transistor 375 and the column selection line CL2. The transistor 377 has a gate supplied with the logic signal Vgc3$b$ that is the inverted signal of the logic signal Vgc3, a source supplied with the non-selection voltage Vinh (for example, 3 V), and a drain coupled to a drain of the transistor 378 and the column selection line CL3. The transistor 378 has a gate supplied with the logic signal Vgc3, a source coupled to the node N32A, and the drain coupled to the drain of the transistor 377 and the column selection line CL3.

As with the decoder 152A, the decoder 152B selectively applies, to the column selection lines CL4 to CL7, the selection voltage supplied from the voltage selection circuit 31B on the basis of the logic signals Vgc4 to Vgc7 supplied from the microcontroller MCON. The decoder 152B includes transistors 391 to 398. The transistors 391 to 398 are n-type MOS transistors. The transistor 391 has a gate supplied with the logic signal Vgc4, a source coupled to the node N32B, and a drain coupled to a drain of the transistor 392 and the column selection line CL4. The transistor 392 has a gate supplied with the logic signal Vgc4$b$ that is the inverted signal of the logic signal Vgc4, a source supplied with the non-selection voltage Vinh (for example, 3 V), and the drain coupled to the drain of the transistor 391 and the column selection line CL4. The transistor 393 has a gate supplied with the logic signal Vgc5$b$ that is the inverted signal of the logic signal Vgc5, a source supplied with the non-selection voltage Vinh (for example, 3 V), and a drain coupled to a drain of the transistor 394 and the column selection line CL5. The transistor 394 has a gate supplied with the logic signal Vgc5, a source coupled to the node N32B, and the drain coupled to the drain of the transistor 393 and the column selection line CL5. The transistor 395 has a gate supplied with the logic signal Vgc6, a source coupled to the node N32B, and a drain coupled to a drain of the transistor 396 and the column selection line CL6. The transistor 396 has a gate supplied with the logic signal Vgc6$b$ that is the inverted signal of the logic signal Vgc6, a source supplied with the non-selection voltage Vinh (for example, 3 V), and the drain coupled to the drain of the transistor 395 and the column selection line CL6. The transistor 397 has a gate supplied with the logic signal Vgc7$b$ that is the inverted signal of the logic signal Vgc7, a source supplied with the non-selection voltage Vinh (for example, 3 V), and a drain coupled to a drain of the transistor 398 and the column selection line CL7. The transistor 398 has a gate supplied with the logic signal Vgc7, a source coupled to the node N32B, and the drain coupled to the drain of the transistor 397 and the column selection line CL7.

As described above, in the storage device 2, the number of the storage layers L0 to L3 is increased, which makes it possible to increase storage capacity and to reduce in cost per bit.

As described above, in the present embodiment, it is possible to increase storage capacity and to reduce cost per bit. Other effects are similar to those in the foregoing first embodiment.

Modification Example 2-1

In the foregoing embodiment, as illustrated in FIGS. 45 to 47, the decoder 23A in the row selection line driver 140 drives the row selection lines RL0 to RL3 formed in the same layer, and the decoder 23B drives the row selection lines RL4 to RL7 formed in the same layer. In addition, the decoder 152A in the column selection line driver 150 drives the column selection lines CL0 to CL3 formed in the same layer, and the decoder 152B drives the column selection lines CL4 to CL7 formed in the same layer. However, this is not limitative. In the following, a storage device 2A according to the present modification example is described in detail.

As with the storage device 2 according to the foregoing embodiment, the storage device 2A includes a memory array unit MAU11. As with the memory array unit MAU10 (FIG. 44), the memory array unit MAU11 includes an array driver AD11 that includes a row selection line driver 160 and a column selection line driver 170.

FIG. 48 illustrates a configuration example of the row selection line driver 160. The row selection line driver 160 includes the decoders 83A and 83B.

The decoder 83A selectively applies, to the row selection lines RL0, RL1, RL4, and RL5, the selection voltage supplied from the voltage selection circuit 21A via the current limiting circuit 22A, on the basis of the logic signals Vgr0, Vgr1, Vgr4, and Vgr5 supplied from the microcontroller MCON. In other words, in the example (FIG. 46) in the foregoing embodiment, the decoder 23A selectively applies the selection voltage to the row selection lines RL0 to RL3 on the basis of the logic signals Vgr0 to Vgr3. In contrast, in the present modification example (FIG. 48), the decoder 83A selectively applies the selection voltage to the row selection lines RL0, RL1, RL4, and RL5 on the basis of the logic signals Vgr0, Vgr1, Vgr4, and Vgr5.

As with the decoder 83A, the decoder 83B selectively applies, to the row selection lines RL2, RL3, RL6, and RL7, the selection voltage supplied from the voltage selection circuit 21B via the current limiting circuit 22B, on the basis of the logic signals Vgr2, Vgr3, Vgr6, and Vgr7 supplied from the microcontroller MCON.

FIG. 49 illustrates a configuration example of the column selection line driver 170. The column selection line driver 170 includes decoders 172A and 172B.

The decoder 172A selectively applies, to the column selection lines CL0, CL1, CL4, and CL5, the selection voltage supplied from the voltage selection circuit 31A, on the basis of the logic signals Vgc0, Vgc1, Vgc4, and Vgc5 supplied from the microcontroller MCON. In other words, in the example (FIG. 47) in the foregoing embodiment, the decoder 152A selectively applies the selection voltage to the column selection lines CL0 to CL3 on the basis of the logic signals Vgc0 to Vgc3. In contrast, in the present modification example (FIG. 49), the decoder 172A selectively applies the selection voltage to the column selection lines CL0, CL1, CL4, and CL5 on the basis of the logic signals Vgc0, Vgc1, Vgc4, and Vgc5. In the decoder 172A, the transistor 375 has the gate supplied with the logic signal Vgc4, the source coupled to the node N32A, and the drain coupled to the drain of the transistor 376 and the column selection line CL4. The transistor 376 has the gate supplied with the logic signal Vgc4b that is the inverted signal of the logic signal Vgc4, the source supplied with the non-selection voltage Vinh (for example, 3 V), and the drain coupled to the drain of the transistor 375 and the column selection line CL4. The transistor 377 has the gate supplied with the logic signal Vgc5b that is the inverted signal of the logic signal Vgc5, the source supplied with the non-selection voltage Vinh (for example, 3 V), and the drain coupled to the drain of the transistor 378 and the column selection line CL5. The transistor 378 has the gate supplied with the logic signal Vgc5, the source coupled to the node N32A, and the drain coupled to the drain of the transistor 377 and the column selection line CL5.

As with the decoder 172A, the decoder 172B selectively applies, to the column selection lines CL2, CL3, CL6, and CL7, the selection voltage supplied from the voltage selection circuit 31B, on the basis of the logic signals Vgc2, Vgc3, Vgc6, and Vgc7 supplied from the microcontroller MCON. The transistor 391 has the gate supplied with the logic signal Vgc2, the source coupled to the node N32B, and the drain coupled to the drain of the transistor 392 and the column selection line CL2. The transistor 392 has the gate supplied with the logic signal Vgc2b that is the inverted signal of the logic signal Vgc2, the source supplied with the non-selection voltage Vinh (for example, 3 V), and the drain coupled to the drain of the transistor 391 and the column selection line CL2. The transistor 393 has the gate supplied with the logic signal Vgc3b that is the inverted signal of the logic signal Vgc3, the source supplied with the non-selection voltage Vinh (for example, 3 V), and the drain coupled to the drain of the transistor 394 and the column selection line CL3. The transistor 394 has the gate supplied with the logic signal Vgc3, the source coupled to the node N32B, and the drain coupled to the drain of the transistor 393 and the column selection line CL3.

In the row selection line driver 160 (FIG. 48), the voltage selection circuit 81A, the current limiting circuit 22A, the decoder 83A, and the sense amplifier 24A are included in a driver 160A, and the voltage selection circuit 81B, the current limiting circuit 22B, the decoder 83B, and the sense amplifier 24B are included in a driver 160B. In addition, in the column selection line driver 170 (FIG. 49), the voltage selection circuit 31A and the decoder 172A are included in a driver 170A, and the voltage selection circuit 31B and the decoder 172B are included in a driver 170B. As with the storage device 1C (FIG. 28), each of the drivers 160A and 160B and the drivers 170A and 170B is disposed in an appropriate region in the substrate surface. In the storage device 2A, this makes it possible to simplify wiring between the array driver AD11 and each of the row selection lines RL0 to RL8 and the column selection lines CL0 to CL7.

Modification Example 2-2

In the foregoing embodiment, the four storage layers L0 to L4 are formed, but this is not limitative. Five or more storage layers may be formed.

Modification Example 2-3

Each of the modification examples of the foregoing first embodiment may be applied to the storage device 2 according to the foregoing embodiment.

Although the present technology has been described above referring to some embodiments and modification examples, the technology is not limited to these embodiments, etc., and may be modified in a variety of ways.

For example, in the foregoing embodiments, the selection voltage Vpset is set to the same voltage as the selection voltage Vprst, and the selection voltage Vnset is set to the same voltage as the selection voltage Vnrst, but this is not limitative. Alternatively, the selection voltage Vpset may be set to a voltage different from the selection voltage Vprst, and the selection voltage Vnset may be set to a voltage different from the selection voltage Vnrst.

In addition, for example, in the foregoing embodiments, the storage element VR possibly takes two identifiable resistance states RS (the high resistance state HRS and the low resistance state LRS), but this is not limitative. Alternatively, for example, the storage element VR may possibly take three or more identifiable resistance states RS.

In addition, for example, in the foregoing embodiments, the storage element VR is configured using a stack of the ion source layer and the resistance change layer, but this is not limitative. Alternatively, for example, a phase-change storage element may be used, or a resistive random access element such as a transition metal oxide may be used. In addition, for example, a spin-transfer torque (STT; Spin Transfer Torque) magnetic tunnel junction (MTJ; Magnetic Tunnel Junction) element may be used.

It is to be noted that effects described herein are merely illustrative and are not limitative, and may have other effects.

It is to be noted that the present technology may have the following configurations.

(1)

A storage device, including:

a first storage section that includes a plurality of first wiring lines, a plurality of second wiring lines, and a plurality of first memory cells, the plurality of first wiring lines extending in a first direction and including a plurality of first selection lines and a plurality of second selection lines, the plurality of second wiring lines extending in a second direction that intersects with the first direction and including a plurality of third selection lines and a plurality of fourth selection lines, and the plurality of first memory cells each being inserted between a corresponding one of the plurality of first wiring lines and a corresponding one of the plurality of second wiring lines;

a first selection line driver that applies a first voltage to one or more selection lines of the plurality of first selection lines and applies a second voltage to one or more selection lines of the plurality of second selection lines, the first voltage being one of a first selection voltage and a second selection voltage, and the second voltage being one of the first selection voltage and the second selection voltage and being different from the first voltage; and a second selection line driver that applies a third voltage to one or more selection lines of the plurality of third selection lines and applies a fourth voltage to one or more selection lines of the plurality of fourth selection lines, the third voltage being one of the first selection voltage and the second selection voltage, and the fourth voltage being one of the first selection voltage and the second selection voltage and being different from the third voltage.

(2)

The storage device according to (1), in which the first selection line driver includes a first driver that applies the first voltage to the one or more selection lines of the plurality of first selection lines, and a second driver that applies the second voltage to the one or more selection lines of the plurality of second selection lines, and the second selection line driver includes a third driver that applies the third voltage to the one or more selection lines of the plurality of third selection lines, and a fourth driver that applies the fourth voltage to the one or more selection lines of the plurality of fourth selection lines.

(3)

The storage device according to (2), in which the first driver includes a first voltage application section that includes a plurality of first switches provided corresponding to the plurality of first selection lines, and applies the first voltage to the one or more selection lines of the plurality of first selection lines through selectively turning on the plurality of first switches on the basis of a first selection signal, and the second driver includes a second voltage application section that includes a plurality of second switches provided corresponding to the plurality of second selection lines, and applies the second voltage to the one or more selection lines of the plurality of second selection lines through selectively turning on the plurality of second switches on the basis of a second selection signal.

(4)

The storage device according to (3), in which the second selection signal is a signal other than the first selection signal.

(5)

The storage device according to (3), in which the first selection signal includes a plurality of signals including a first signal, and the second selection signal includes a plurality of signals including the first signal.

(6)

The storage device according to any one of (3) to (5), in which the first driver further includes a first supply section that supplies the first voltage to the first voltage application section, and the second driver further includes a second supply section that supplies the second voltage to the second voltage application section.

(7)

The storage device according to (6), in which the first supply section selects and outputs, as the first voltage, one of the first selection voltage and the second selection voltage on the basis of a voltage selection signal.

(8)

The storage device according to (6), in which the first supply section outputs, as the first voltage, a fixed one of the first selection voltage and the second selection voltage.

(9)

The storage device according to any one of (3) to (8), in which the third driver includes a third voltage application section that includes a plurality of third switches provided corresponding to the plurality of third selection lines, and applies the third voltage to the one or more selection lines of the plurality of third selection lines through selectively turning on the plurality of third switches on the basis of a third selection signal, and the fourth driver includes a fourth voltage application section that includes a plurality of fourth switches provided corresponding to the plurality of fourth selection lines, and applies the fourth voltage to the one or more selection lines of the plurality of fourth selection lines through selectively turning on the plurality of fourth switches on the basis of a fourth selection signal.

(10)

The storage device according to (9), in which the fourth selection signal is a signal other than the third selection signal.

(11)

The storage device according to (9), in which the third selection signal includes a plurality of signals including a second signal, and the fourth selection signal includes a plurality of signals including the second signal.

(12)

The storage device according to any one of (9) to (11), in which the third driver further includes a third supply section that supplies the third voltage to the third voltage application section, and the fourth driver further includes a fourth supply section that supplies the fourth voltage to the fourth voltage application section.

(13)

The storage device according to any one of (9) to (11), in which the first driver further includes a first voltage supply section that supplies the first voltage to the first voltage application section and the second selection line driver, the second driver further includes a second voltage supply section that supplies the second voltage to the second voltage application section and the second selection line driver, and the second selection line driver further includes a fifth supply section that selectively supplies the first voltage supplied from the first voltage supply section and the second voltage supplied from the second voltage supply section as the third voltage and the fourth voltage to the third voltage application section and the fourth voltage application section on the basis of a fifth selection signal.

(14)

The storage device according to any one of (2) to (13), further including a second storage section including a plurality of third wiring lines, a plurality of fourth wiring lines, and a plurality of second memory cells, the plurality of third wiring lines extending in the first direction and including a plurality of fifth selection lines and a plurality of sixth selection lines, the plurality of fourth wiring lines extending in the second direction and including a plurality of seventh selection lines and a plurality of eighth selection lines, and the plurality of second memory cells each being inserted between a corresponding one of the plurality of third wiring lines and a corresponding one of the plurality of fourth wiring lines, in which each of the plurality of eighth selection lines is coupled to a corresponding one of the plurality of fourth selection lines.

(15)

The storage device according to any one of (2) to (14), in which the first driver applies a non-selection voltage to a selection line other than the one or more selection lines of the plurality of first selection lines, the second driver applies the non-selection voltage to a selection line other than the one or more selection lines of the plurality of second selection lines, the third driver applies the non-selection voltage to a selection line other than the one or more selection lines of the plurality of third selection lines and, the fourth driver applies the non-selection voltage to a selection line other than the one or more selection lines of the plurality of fourth selection lines.

(16)

The storage device according to (15), in which the non-selection voltage is a voltage between the first selection voltage and the second selection voltage.

(17)

The storage device according to any one of (2) to (14), in which the first driver sets a selection line other than the one or more selection lines of the plurality of first selection lines to a floating state, the second driver sets a selection line other than the one or more selection lines of the plurality of second selection lines to the floating state, the third driver sets a selection line other than the one or more selection lines of the plurality of third selection lines to the floating state, and the fourth driver sets a selection line other than the one or more selection lines of the plurality of fourth selection lines to the floating state.

(18)

The storage device according to any one of (1) to (6), in which the plurality of first wiring lines is formed in a plurality of first wiring layers, the plurality of second wiring lines is formed in one or a plurality of second wiring layers, the plurality of first wiring layers and the one or the plurality of second wiring layers are alternately stacked, in the plurality of first wiring layers, the plurality of first selection lines and the plurality of second selection lines are formed in wiring layers different from each other, and the plurality of first memory cells is formed to have same orientation in a stacking direction.

(19)

The storage device according to any one of (1) to (6), in which the plurality of first wiring lines is formed in a plurality of first layer wiring lines, the plurality of second wiring lines is formed in one or a plurality of second layer wiring lines, the plurality of first wiring layers and the one or the plurality of second wiring layers are alternately formed, in the plurality of first wiring layers, the plurality of first selection lines and the plurality of second selection lines are formed in the same wiring layer, and the plurality of first memory cells is provided to have same orientation in a stacking direction.

(20)

The storage device according to any one of (1) to (19), in which each of the plurality of first memory cells includes a storage element that possibly takes a plurality of identifiable resistance states including a first resistance state and a second resistance state.

(21)

The storage device according to (20), in which each of the plurality of first memory cells has a first terminal and a second terminal, in a case where the first selection voltage is applied to the first terminal and the second selection voltage is applied to the second terminal, a resistance state of the storage element is set to the first resistance state, and in a case where the second selection voltage is applied to the first terminal and the first selection voltage is applied to the second terminal, the resistance state of the storage element is set to the second resistance state.

(22)

A control method, including:

with respect to a first storage section that includes a plurality of first wiring lines, a plurality of second wiring lines, and a plurality of first memory cells, the plurality of first wiring lines extending in a first direction and including a plurality of first selection lines and a plurality of second selection lines, the plurality of second wiring lines extending in a second direction that intersects with the first direction and including a plurality of third selection lines and a plurality of fourth selection lines, and the plurality of first memory cells each being inserted between a corresponding one of the plurality of first wiring lines and a corresponding one of the plurality of second wiring lines, applying a first voltage to one or more selection lines of the plurality of first selection lines while applying a second voltage to one or more selection lines of the plurality of second selection lines, the first voltage being one of a first selection voltage and a second selection voltage, and the second voltage being one of the first selection voltage and the selection voltage and being different from the first voltage; and applying a third voltage to one or more selection lines of the plurality of third selection lines while applying a fourth voltage to one or more selection lines of the plurality of fourth selection lines, the third voltage being one of the first selection voltage and the second selection voltage, and the fourth voltage being one of the first selection voltage and the second selection voltage and being different from the third voltage.

This application claims the benefit of Japanese Priority Patent Application JP2016-251416 filed with the Japan Patent Office on Dec. 26, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A storage device, comprising:

a first storage section that includes a plurality of first wiring lines, a plurality of second wiring lines, and a plurality of first memory cells, wherein the plurality of first wiring lines extends in a first direction and includes a plurality of first selection lines and a plurality of second selection lines, the plurality of second wiring lines extends in a second direction that intersects with the first direction and includes a plurality of third selection lines and a plurality of fourth selection lines, and each memory cell of the plurality of first memory cells is inserted between a corresponding one of the plurality of first wiring lines and a corresponding one of the plurality of second wiring lines;

a first selection line driver that includes:
  a first driver configured to:
    apply a first voltage to at least one first selection line of the plurality of first selection lines; and
    apply a non-selection voltage to a selection line of the plurality of first selection lines other than the at least one first selection line; and
  a second driver configured to:
    apply a second voltage to at least one second selection line of the plurality of second selection lines; and
    apply the non-selection voltage to a selection line of the plurality of second selection lines other than the at least one second selection line, wherein
      the first voltage is one of a first selection voltage or a second selection voltage,
      the second voltage is one of the first selection voltage or the second selection voltage, and
      the second voltage is different from the first voltage; and a second selection line driver that includes:
  a third driver configured to:
    apply a third voltage to at least one third selection line of the plurality of third selection lines; and
    apply the non-selection voltage to a selection line of the plurality of third selection lines other than the at least one third selection line; and
  a fourth driver configured to:
    apply a fourth voltage to at least one fourth selection line of the plurality of fourth selection lines; and
    apply the non-selection voltage to a selection line of the plurality of fourth selection lines other than the at least one fourth selection line, wherein
      the third voltage is one of the first selection voltage or the second selection voltage,
      the fourth voltage is one of the first selection voltage or the second selection voltage, and
      the fourth voltage is different from the third voltage.

2. The storage device according to claim 1, wherein
the first driver includes a first voltage application section that includes a plurality of first switches corresponding to the plurality of first selection lines,
the first driver is further configured to apply the first voltage to the at least one first selection line through selectively turning on a corresponding switch of the plurality of first switches based on a first selection signal,
the second driver includes a second voltage application section that includes a plurality of second switches corresponding to the plurality of second selection lines, and
the second driver is further configured to apply the second voltage to the at least one second selection line through selectively turning on a corresponding switch of the plurality of second switches based on a second selection signal.

3. The storage device according to claim 2, wherein the second selection signal is a signal other than the first selection signal.

4. The storage device according to claim 2, wherein
the first selection signal includes a plurality of signals including a first signal, and
the second selection signal includes a plurality of signals including the first signal.

5. The storage device according to claim 2, wherein
the first driver further includes a first supply section configured to supply the first voltage to the first voltage application section, and
the second driver further includes a second supply section configured to supply the second voltage to the second voltage application section.

6. The storage device according to claim 5, wherein the first supply section is further configured to select and output, as the first voltage, one of the first selection voltage or the second selection voltage based on a voltage selection signal.

7. The storage device according to claim 5, wherein the first supply section is further configured to output, as the first voltage, a fixed one of the first selection voltage or the second selection voltage.

8. The storage device according to claim 2, wherein
the third driver includes a third voltage application section that includes a plurality of third switches corresponding to the plurality of third selection lines,
the third driver is further configured to apply the third voltage to the at least one third selection line through selectively turning on a corresponding switch of the plurality of third switches based on a third selection signal,
the fourth driver includes a fourth voltage application section that includes a plurality of fourth switches corresponding to the plurality of fourth selection lines, and
the fourth driver is further configured to apply the fourth voltage to the at least one fourth selection line through selectively turning on a corresponding switch of the plurality of fourth switches based on a fourth selection signal.

9. The storage device according to claim 8, wherein the fourth selection signal is a signal other than the third selection signal.

10. The storage device according to claim 8, wherein
the third selection signal includes a plurality of signals including a second signal, and
the fourth selection signal includes a plurality of signals including the second signal.

11. The storage device according to claim 8, wherein
the third driver further includes a third supply section configured to supply the third voltage to the third voltage application section, and
the fourth driver further includes a fourth supply section configured to supply the fourth voltage to the fourth voltage application section.

12. The storage device according to claim 8, wherein
the first driver further includes a first voltage supply section configured to supply the first voltage to each of the first voltage application section and the second selection line driver,
the second driver further includes a second voltage supply section configured to supply the second voltage to each of the second voltage application section and the second selection line driver, and
the second selection line driver further includes a fifth supply section configured to selectively supply the first voltage supplied from the first voltage supply section and the second voltage supplied from the second voltage supply section as the third voltage and the fourth voltage to the third voltage application section and the fourth voltage application section based on a fifth selection signal.

13. The storage device according to claim 1, further comprising:
a second storage section including a plurality of third wiring lines, a plurality of fourth wiring lines, and a plurality of second memory cells, wherein
the plurality of third wiring lines extends in the first direction and includes a plurality of fifth selection lines and a plurality of sixth selection lines,
the plurality of fourth wiring lines extends in the second direction and includes a plurality of seventh selection lines and a plurality of eighth selection lines,
each memory cell of the plurality of second memory cells is inserted between a corresponding one of the plurality of third wiring lines and a corresponding one of the plurality of fourth wiring lines, and
each of the plurality of eighth selection lines is coupled to a corresponding one of the plurality of fourth selection lines.

14. The storage device according to claim 1, wherein the non-selection voltage is a voltage between the first selection voltage and the second selection voltage.

15. The storage device according to claim 1, wherein
the first driver is further configured to set the selection line of the plurality of first selection lines other than the at least one first selection line to a floating state,
the second driver is further configured to set the selection line of the plurality of second selection lines other than the at least one second selection line to the floating state,
the third driver is further configured to set the selection line of the plurality of third selection lines other than the at least one third selection line to the floating state, and
the fourth driver is further configured to set the selection line of the plurality of fourth selection lines other than the at least one fourth selection line to the floating state.

16. The storage device according to claim 1, wherein
the plurality of first wiring lines is in a plurality of first wiring layers,
the plurality of second wiring lines is in one or a plurality of second wiring layers,
the plurality of first wiring layers and the one or the plurality of second wiring layers are alternately stacked,
the plurality of first selection lines and the plurality of second selection lines are in different wiring layers of the plurality of first wiring layers, and
the plurality of first memory cells have same orientation in a stacking direction.

17. The storage device according to claim 1, wherein
the plurality of first wiring lines is in a plurality of first wiring layers,
the plurality of second wiring lines is in one or a plurality of second wiring layers,
the plurality of first wiring layers and the one or the plurality of second wiring layers are alternately formed,
the plurality of first selection lines and the plurality of second selection lines are in a same wiring layer of the plurality of first wiring layers, and
the plurality of first memory cells have same orientation in a stacking direction.

18. The storage device according to claim 1, wherein
each memory cell of the plurality of first memory cells includes a storage element configured to change a plurality of identifiable resistance states, and
the plurality of identifiable resistance states includes a first resistance state and a second resistance state.

19. The storage device according to claim 18, wherein
each memory cell of the plurality of first memory cells has a first terminal and a second terminal,
a resistance state of the storage element is set to the first resistance state based on the first selection voltage that is applied to the first terminal and the second selection voltage that is applied to the second terminal, and
the resistance state of the storage element is set to the second resistance state based on the second selection voltage that is applied to the first terminal and the first selection voltage that is applied to the second terminal.

20. A control method, comprising:
applying a first voltage to at least one first selection line of a plurality of first selection lines of a plurality of first wiring lines of a storage section, wherein the plurality of first wiring lines extends in a first direction;
applying a non-selection voltage to a selection line of the plurality of first selection lines other than the at least one first selection line;
applying a second voltage to at least one second selection line of a plurality of second selection lines of the plurality of first wiring lines;
applying the non-selection voltage to a selection line of the plurality of second selection lines other than the at least one second selection line, wherein
the first voltage is one of a first selection voltage or a second selection voltage,
the second voltage is one of the first selection voltage or the second selection voltage, and
the second voltage is different from the first voltage;
applying a third voltage to at least one third selection line of a plurality of third selection lines of a plurality of second wiring lines of the storage section, wherein the plurality of second wiring lines extends in a second direction that intersects with the first direction;
applying the non-selection voltage to a selection line of the plurality of third selection lines other than the at least one third selection line;
applying a fourth voltage to at least one fourth selection line of a plurality of fourth selection lines of the plurality of second wiring lines; and
applying the non-selection voltage to a selection line of the plurality of fourth selection lines other than the at least one fourth selection line, wherein
the storage section includes a plurality of first memory cells,
each memory cell of the plurality of first memory cells is inserted between a corresponding one of the plurality of first wiring lines and a corresponding one of the plurality of second wiring lines,
the third voltage is one of the first selection voltage or the second selection voltage,
the fourth voltage is one of the first selection voltage or the second selection voltage; and
the fourth voltage is different from the third voltage.

* * * * *